(12) United States Patent
Kurosawa et al.

(10) Patent No.: US 9,494,860 B2
(45) Date of Patent: Nov. 15, 2016

(54) RESIST COMPOSITION, METHOD OF FORMING RESIST PATTERN

(75) Inventors: Tsuyoshi Kurosawa, Kawasaki (JP); Kotaro Endo, Kawasaki (JP); Yuichi Suzuki, Kawasaki (JP); Yuta Iwasawa, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 13/329,001

(22) Filed: Dec. 16, 2011

(65) Prior Publication Data

US 2012/0164578 A1 Jun. 28, 2012

(30) Foreign Application Priority Data

Dec. 28, 2010 (JP) ............................... P2010-292648

(51) Int. Cl.
*G03F 7/004* (2006.01)
*G03F 7/039* (2006.01)
*G03F 7/20* (2006.01)

(52) U.S. Cl.
CPC ........... *G03F 7/0045* (2013.01); *G03F 7/0046* (2013.01); *G03F 7/0397* (2013.01); *G03F 7/2041* (2013.01)

(58) Field of Classification Search
None
See application file for complete search history.

(56) References Cited

U.S. PATENT DOCUMENTS

| | | | |
|---|---|---|---|
| 5,945,517 | A | 8/1999 | Nitta et al. |
| 6,153,733 | A | 11/2000 | Yukawa et al. |
| 6,444,397 | B2 | 9/2002 | Hada et al. |
| 6,949,325 | B2 | 9/2005 | Li et al. |
| 7,074,543 | B2 | 7/2006 | Iwai et al. |
| 2001/0049073 | A1 | 12/2001 | Hada et al. |
| 2007/0078269 | A1 | 4/2007 | Harada et al. |
| 2007/0122750 | A1 | 5/2007 | Yamaguchi et al. |
| 2009/0068590 | A1* | 3/2009 | Dazai et al. ............... 430/285.1 |
| 2009/0197204 | A1 | 8/2009 | Shiono et al. |
| 2010/0136480 | A1* | 6/2010 | Motoike ............... G03F 7/0048 430/270.1 |
| 2011/0223537 | A1 | 9/2011 | Ebata et al. |
| 2011/0269070 | A1 | 11/2011 | Aqad et al. |
| 2012/0009520 | A1 | 1/2012 | Takeshita et al. |
| 2012/0082936 | A1* | 4/2012 | Serizawa et al. .......... 430/285.1 |
| 2012/0129104 | A1 | 5/2012 | Aqad et al. |
| 2012/0164578 | A1 | 6/2012 | Kurosawa et al. |
| 2013/0295506 | A1 | 11/2013 | Sakakibara et al. |

FOREIGN PATENT DOCUMENTS

| | | |
|---|---|---|
| JP | A-09-208554 | 8/1997 |
| JP | A-11-035551 | 2/1999 |
| JP | A-11-035552 | 2/1999 |
| JP | A-11-035573 | 2/1999 |
| JP | A-11-322707 | 11/1999 |
| JP | A-2000-206694 | 7/2000 |
| JP | A-2003-241385 | 8/2003 |
| JP | A-2005-336452 | 12/2005 |
| JP | A-2006-259582 | 9/2006 |
| JP | A-2006-306856 | 11/2006 |
| JP | A-2006-317803 | 11/2006 |
| JP | A-2007-161707 | 6/2007 |
| JP | A-2008-268744 | 11/2008 |
| JP | 2009191055 A * | 8/2009 |
| JP | A-2010-039146 | 2/2010 |
| JP | A-2012-018304 | 1/2012 |
| WO | WO 2004/074242 A2 | 9/2004 |

(Continued)

OTHER PUBLICATIONS

Machine translation JP 2010-039146. Feb. 18, 2010.*
Machine translation JP 2009-191055. Aug. 27, 2009.*
Office Action issued in U.S. Appl. No. 13/179,864 on Feb. 10, 2014.
Notice of Allowance in Japanese Patent Application No. 2011-061514, mailed Sep. 9, 2014.

(Continued)

*Primary Examiner* — Cynthia H Kelly
*Assistant Examiner* — Alyssa L Cepluch
(74) *Attorney, Agent, or Firm* — Knobbe Martens Olson & Bear LLP

(57) ABSTRACT

A resist composition including a base component (A) which exhibits changed solubility in a developing solution under the action of acid, an acid generator component (B) which generates acid upon exposure, and a nitrogen-containing organic compound component (D), wherein the acid generator component (B) includes an acid generator (B1) containing a compound represented by general formula (b1-1) shown below, and the nitrogen-containing organic compound component (D) includes a compound (D1) represented by general formula (d1) shown below. In the formula, $Y^0$ represents an alkylene group of 1 to 4 carbon atoms which may have a substituent, $R^0$ represents an alkyl group, alkoxy group, halogen atom, halogenated alkyl group, hydroxyl group or oxygen atom (=O), p represents 0 or 1, and $Z^+$ represents an organic cation.

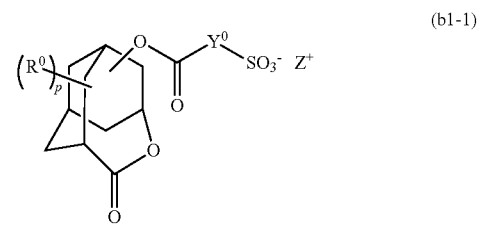

(b1-1)

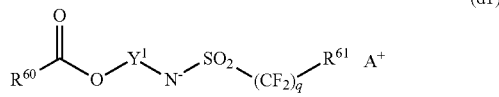

(d1)

5 Claims, No Drawings

(56) References Cited

FOREIGN PATENT DOCUMENTS

WO    WO 2010/029965 A1    3/2010
WO    WO 2010147079 A1 * 12/2010

OTHER PUBLICATIONS

Office Action issued in U.S. Appl. No. 13/179,864 on Jun. 2, 2014.
Office Action issued in Japanese Patent Application No. 2010-292648 on Jul. 29, 2014.

* cited by examiner

RESIST COMPOSITION, METHOD OF FORMING RESIST PATTERN

TECHNICAL FIELD

The present invention relates to a resist composition, and a method of forming a resist pattern using the resist composition.

Priority is claimed on Japanese Patent Application No. 2010-292648, filed Dec. 28, 2010, the content of which is incorporated herein by reference.

BACKGROUND ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions change and become soluble in a developing solution is called a positive-type resist, and a resist material in which the exposed portions change and become insoluble in a developing solution is called a negative-type resist.

In recent years, in the production of semiconductor elements and liquid crystal display elements, advances in lithography techniques have lead to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter than these excimer lasers, such as an $F_2$ excimer laser, electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources.

As a resist material that satisfies these conditions, a chemically amplified composition is used, which includes a base material component that exhibits changed solubility in an alkali developing solution under the action of acid and an acid generator component that generates acid upon exposure.

For example, as a positive-type chemically amplified resist composition, a composition containing a resin component (base resin) which exhibits increased solubility in an alkali developing solution under the action of acid, and an acid generator is typically used. If the resist film formed using the resist composition is selectively exposed during formation of a resist pattern, then within the exposed portions, acid is generated from the acid generator component, and the action of this acid causes an increase in the solubility of the resin component in an alkali developing solution, making the exposed portions soluble in the alkali developing solution.

Currently, resins that contain structural units derived from (meth)acrylate esters within the main chain (acrylic resins) are widely used as the base resins for resists that use ArF excimer laser lithography, as they exhibit excellent transparency in the vicinity of 193 nm (for example, see Patent Document 1).

On the other hand, as the acid generator used in a chemically amplified resist composition, numerous compounds have been proposed, including, for example, onium salt acid generators such as iodonium salts and sulfonium salts, oxime sulfonate acid generators, diazomethane acid generators, nitrobenzylsulfonate acid generators, iminosulfonate acid generators, and disulfone acid generators.

Further, besides the base resin and the acid generator, a chemically amplified resist composition also frequently includes an added nitrogen-containing organic compound such as an alkylamine or an alkyl alcohol amine. These nitrogen-containing organic compounds function as quenchers that trap the acid generated from the acid generator, thereby contributing to an improvement in the lithography properties and the like.

In recent years, the development of photodegradable bases that decompose upon exposure to light or other radiation as quenchers has progressed significantly. A photodegradable base included in a resist composition functions as a normal quencher in unexposed portions that are not exposed to light or radiation. On the other hand, in those portions that are exposed to light or radiation, the photodegradable base itself decomposes, resulting in a loss of the quenching function which means the concentration of acid within the exposed portions is maintained at an appropriate level, and is prevented from becoming too low. Patent Document 2 discloses a resist composition that includes, as structural components, a base component composed of a polymer having a repeating unit containing a cyclic carbonate ester structure, an acid generator, and an acid diffusion inhibitor having a carbamate ester structure.

DOCUMENTS OF RELATED ART

Patent Documents

[Patent Document 1] Japanese Unexamined Patent Application, First Publication No. 2003-241385
[Patent Document 2] International Patent Publication No. WO 2010/029965

SUMMARY OF THE INVENTION

Problems to be Solved by the Invention

As the miniaturization of resist patterns progresses ever further, the formation of very fine patterns of several tens of nm is being targeted, for example by lithography using an electron beam or EUV. As the resist pattern dimensions become smaller in this manner, the demands continue to grow for resist materials that maintain favorable lithography properties while enabling the formation of favorably shaped resist patterns at ever higher resolutions.

In response to these demands, use of the photodegradable bases described above tends to improve the resist pattern shape, but tends to cause a deterioration in the mask error factor (MEF). Further, if the amount added of the photodegradable base is reduced to a level that does not adversely effect the MEF, then the improvement in the resist pattern shape tends to be insufficient. It is thought that this is because the quenching function of the photodegradable base, as described above, increases the contrast between the exposed portions and the unexposed portions (more than a non-photodegradable base), meaning a shape improvement effect can be expected, whereas in terms of improving the MEF, the relative increase in the efficiency of the deprotection reaction caused by the acid generated from the acid generator (due to the loss of the quenching function in the exposed portions) compared with a case that does not include a photodegradable base makes the composition too sensitive to changes in the exposure dose.

The present invention takes the above circumstances into consideration, with an object of providing a resist composition and a method of forming a resist pattern which improve the resist pattern shape and enable formation of a resist pattern with a good mask error factor (MEF).

Means to Solve the Problems

In order to achieve the above object, the present invention employs the aspects described below.

Specifically, a first aspect of the present invention is a resist composition including a base component (A) which exhibits changed solubility in a developing solution under the action of acid, an acid generator component (B) which generates acid upon exposure, and a nitrogen-containing organic compound component (D), wherein the acid generator component (B) includes an acid generator (B1) containing a compound represented by general formula (b1-1) shown below, and the nitrogen-containing organic compound component (D) includes a compound (D1) represented by general formula (d1) shown below.

[Chemical Formula 1]

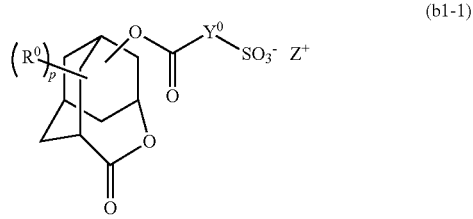
(b1-1)

In the formula, $Y^0$ represents an alkylene group of 1 to 4 carbon atoms which may have a substituent, $R^0$ represents an alkyl group, alkoxy group, halogen atom, halogenated alkyl group, hydroxyl group or oxygen atom (=O), p represents 0 or 1, and $Z^+$ represents an organic cation.

[Chemical Formula 2]

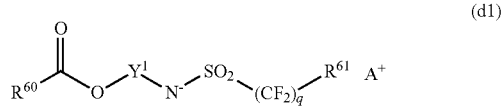
(d1)

In the formula, $R^{60}$ represents a linear, branched or cyclic aliphatic hydrocarbon group which may have a substituent, $Y^1$ represents a divalent linear, branched or cyclic aliphatic hydrocarbon group, $R^{61}$ represents a hydrogen atom, fluorine atom, alkyl group or fluorinated alkyl group, q represents an integer of 1 to 10, and $A^+$ represents an organic cation.

A second aspect of the present invention is a method of forming a resist pattern, the method including forming a resist film on a substrate using a resist composition according to the first aspect, conducting exposure of the resist film, and developing the resist film to form a resist pattern.

In the present description and claims, unless specified otherwise, an "alkyl group" includes linear, branched and cyclic, monovalent saturated hydrocarbon groups.

The term "alkylene group" includes linear, branched and cyclic divalent saturated hydrocarbon groups, unless specified otherwise.

A "lower alkyl group" is an alkyl group of 1 to 5 carbon atoms.

A "halogenated alkyl group" is a group in which part or all of the hydrogen atoms of an alkyl group have each been substituted with a halogen atom. Examples of the halogen atom include a fluorine atom, chlorine atom, bromine atom and iodine atom.

The term "aliphatic" is a relative concept used in relation to the term "aromatic", and defines a group or compound that has no aromaticity.

The term "structural unit" refers to a monomer unit that contributes to the formation of a polymeric compound (polymer, copolymer).

The term "exposure" is used as a general concept that includes irradiation with any form of radiation.

The term "(meth)acrylic acid" is a generic term that includes either or both of acrylic acid having a hydrogen atom bonded to the α-position and methacrylic acid having a methyl group bonded to the α-position.

The term "(meth)acrylate ester" is a generic term that includes either or both of the acrylate ester having a hydrogen atom bonded to the α-position and the methacrylate ester having a methyl group bonded to the α-position.

The term "(meth)acrylate" is a generic term that includes either or both of the acrylate having a hydrogen atom bonded to the α-position and the methacrylate having a methyl group bonded to the α-position.

Effects of the Invention

The present invention is able to provide a resist composition and a method of forming a resist pattern which improve the resist pattern shape and enable formation of a resist pattern with a good mask error factor (MEF).

DETAILED DESCRIPTION OF THE INVENTION

<<Resist Composition>>

The resist composition according to the first aspect of the present invention includes a base component (A) which exhibits changed solubility in a developing solution under the action of acid (hereinafter referred to as "component (A)"), an acid generator component (B) which generates acid upon exposure (hereinafter referred to as "component (B)"), and a nitrogen-containing organic compound component (D) (hereinafter referred to as "component (D)").

When a resist film that is formed using the resist composition is subjected to selective exposure, acid is generated from the component (B) in the exposed portions, and the solubility of the component (A) in a developing solution changes under the action of the generated acid, whereas in the unexposed portions, the solubility of the component (A) in the developing solution does not change, meaning a difference in solubility in the developing solution develops between the exposed portions and the unexposed portions. As a result, subsequent developing of the resist film using an alkali developing solution can be used to form a resist pattern, by dissolving and removing either the exposed portions in the case of a positive-type resist pattern, or the unexposed portions in the case of a negative-type resist pattern.

In this description, a resist composition used in forming a positive-type resist pattern is referred to as a "positive-type resist composition", whereas a resist composition used in forming a negative-type resist pattern is referred to as a "negative-type resist composition".

The resist composition of the present invention may be used for either an alkali developing process in which an alkali developing solution is used for the developing treatment during formation of the resist pattern, or a solvent developing process (hereinafter also referred to as a "negative-type developing process") in which a developing solution containing an organic solvent (an organic developing solution) is used for the developing treatment.

<Component (A)>

The component (A) is a base component which exhibits changed solubility in a developing solution under the action of acid.

In the present description and claims, the term "base component" refers to an organic compound capable of forming a film, and is preferably an organic compound having a molecular weight of 500 or more. Ensuring that the organic compound has a molecular weight of 500 or more ensures a satisfactory film-forming ability, and facilitates the formation of nano level resist patterns.

The "organic compounds having a molecular weight of 500 or more" may be broadly classified into non-polymers and polymers.

In general, compounds which have a molecular weight of at least 500 but less than 4,000 may be used as non-polymers. Hereinafter, the term "low molecular weight compound" is used to describe a non-polymer having a molecular weight of at least 500 but less than 4,000.

In terms of the polymers, compounds which have a molecular weight of 1,000 or more may be used. In the present description and claims, the terms "polymeric compound" and "resin" are used to describe a polymer having a molecular weight of 1,000 or more.

In the case of a polymeric compound, the "molecular weight" refers to the weight-average molecular weight in terms of the polystyrene-equivalent value determined by gel permeation chromatography (GPC).

As the component (A), a resin component which exhibits changed solubility in a developing solution under the action of acid may be used, or alternatively, a low molecular weight material which exhibits changed solubility in a developing solution under the action of acid may be used.

In those cases where the resist composition of the present invention is a "negative-type resist composition for an alkali developing process" which forms a negative-type pattern in an alkali developing process, a base component that is soluble in the alkali developing solution is used as the component (A), and a cross-linking agent is also added to the negative-type resist composition.

In this negative-type resist composition for an alkali developing process, when acid is generated from the component (B) upon exposure, the action of the acid causes cross-linking between the base component and the cross-linking agent, and the cross-linked portions become insoluble in an alkali developing solution. Accordingly, during resist pattern formation, by conducting selective exposure of a resist film formed by applying the negative-type resist composition to a substrate, the exposed portions become insoluble in an alkali developing solution, while the unexposed portions remain soluble in an alkali developing solution, meaning alkali developing can be used to form a resist pattern.

Generally, a resin that is soluble in an alkali developing solution (hereinafter referred to as an "alkali-soluble resin") is used as the component (A) of a negative-type resist composition for an alkali developing process.

Examples of the alkali-soluble resin include a resin having a structural unit derived from at least one of α-(hydroxyalkyl)acrylic acid and an alkyl ester of α-(hydroxyalkyl)acrylic acid (preferably an alkyl ester having 1 to 5 carbon atoms), as disclosed in Japanese Unexamined Patent Application, First Publication No. 2000-206694; a (meth)acrylic resin or polycycloolefin resin having a sulfonamide group, as disclosed in U.S. Pat. No. 6,949,325; a (meth)acrylic resin containing a fluorinated alcohol, as disclosed in U.S. Pat. No. 6,949,325, Japanese Unexamined Patent Application, First Publication No. 2005-336452 or Japanese Unexamined Patent Application, First Publication No. 2006-317803; and a polycycloolefin resin having a fluorinated alcohol, as disclosed in Japanese Unexamined Patent Application, First Publication No. 2006-259582. These resins are preferable in that a resist pattern can be formed with minimal swelling.

Here, the term "α-(hydroxyalkyl)acrylic acid" refers to one or both of acrylic acid in which a hydrogen atom is bonded to the carbon atom on the α-position having the carboxyl group bonded thereto, and α-hydroxyalkylacrylic acid in which a hydroxyalkyl group (preferably a hydroxyalkyl group of 1 to 5 carbon atoms) is bonded to the carbon atom on the α-position.

As the cross-linking agent, at least one compound selected from the group consisting of melamine-based cross-linking agents, urea-based cross-linking agents, alkylene urea-based cross-linking agents, glycoluril-based cross-linking agents and epoxy-based cross-linking agents is preferred. For example, usually, a glycoluril-based cross-linking agent having a methylol group or alkoxymethyl group, or a melamine-based cross-linking agent is preferable, as it enables formation of a resist pattern with minimal swelling. The amount added of the cross-linking agent is preferably within a range from 1 to 50 parts by weight, relative to 100 parts by weight of the alkali-soluble resin.

In those cases where the resist composition of the present invention is a resist composition which forms a positive-type pattern in an alkali developing process, and forms a negative-type pattern in a solvent developing process, a base component (hereinafter referred to as "component (A0)") which exhibits increased polarity under the action of acid is preferably used as the component (A). By using the base component (A0), the polarity of the base component changes upon exposure, and therefore favorable developing contrast can be achieved, not only in an alkali developing process, but also in a solvent developing process.

In those cases where an alkali developing process is used, the component (A0) is substantially insoluble in an alkali developing solution prior to exposure, but when acid is generated from the component (B) upon exposure, the action of this acid causes an increase in the polarity of the component (A0) that increases the solubility in the alkali developing solution. Accordingly, during resist pattern formation, by conducting selective exposure of a resist film formed by applying the resist composition to a substrate, the exposed portions change from a substantially insoluble state to a soluble state in the alkali developing solution, whereas the unexposed portions remain substantially insoluble in the alkali developing solution, meaning alkali developing can be used to form a positive-type resist pattern.

Further, in those cases where a solvent developing process is used, the component (A0) exhibits good solubility in an organic developing solution prior to exposure, but when acid is generated from the component (B) upon exposure, the action of this acid causes an increase in the polarity of the component (A0) that reduces the solubility in the organic developing solution. Accordingly, during resist pattern formation, by conducting selective exposure of a resist film formed by applying the resist composition to a substrate, the exposed portions change from a soluble state to a substantially insoluble state in the organic developing solution, whereas the unexposed portions remain soluble in the organic developing solution, meaning developing with the organic developing solution can be used to achieve contrast between the exposed portions and the unexposed portions, enabling formation of a negative-type pattern.

In the resist composition of the present invention, the component (A) is preferably a base component (A0) which exhibits increased polarity under the action of acid. That is, the resist composition of the present invention preferably functions as a positive-type chemically amplified resist composition in an alkali developing process, and as a negative-type chemically amplified resist composition in a solvent developing process.

The component (A0) may be a resin component (A1) that exhibits increased polarity under the action of acid (hereinafter frequently referred to as "component (A1)"), a low molecular weight material (A2) that exhibits increased polarity under the action of acid (hereinafter frequently referred to as "component (A2)"), or a mixture thereof.

[Component (A1)]

As the component (A1), a resin component (base resin) typically used as a base component for a chemically amplified resist can be used alone, or two or more of such resin components can be mixed together.

In the present invention, the component (A1) preferably has a structural unit derived from an acrylate ester or a structural unit derived from an acrylate ester in which the hydrogen atom bonded to the carbon atom on the α-position is substituted with a substituent, namely, a structural unit derived from an acrylate ester in which the hydrogen atom bonded to the carbon atom on the α-position may be substituted with a substituent.

In the present description and claims, a "structural unit derived from an acrylate ester" refers to a structural unit that is formed by the cleavage of the ethylenic double bond of an acrylate ester.

The term "acrylate ester" describes a compound in which the hydrogen atom at the carboxyl group terminal of acrylic acid ($CH_2$=CH—COOH) has been substituted with an organic group.

In the "acrylate ester in which the hydrogen atom bonded to the carbon atom on the α-position is substituted with a substituent", examples of the substituent include a halogen atom, an alkyl group of 1 to 5 carbon atoms, a halogenated alkyl group of 1 to 5 carbon atoms, and a hydroxyalkyl group.

Unless specified otherwise, "the carbon atom on the α-position of an acrylate ester" refers to the carbon atom having the carbonyl group bonded thereto.

In the following description, an acrylate ester in which the hydrogen atom bonded to the carbon atom on the α-position is substituted with a substituent may also be termed an "α-substituted acrylate ester". Further, the generic term "(α-substituted) acrylate ester" may be used to describe either or both of the acrylate ester and the α-substituted acrylate ester.

In an α-substituted acrylate ester, examples of the halogen atom that may substitute the hydrogen atom bonded to the carbon atom on the α-position include a fluorine atom, chlorine atom, bromine atom and iodine atom, and a fluorine atom is particularly desirable.

The alkyl group that may substitute the hydrogen atom bonded to the carbon atom on the α-position is preferably a linear or branched alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group.

Further, specific examples of the halogenated alkyl group that may substitute the hydrogen atom bonded to the carbon atom on the α-position include groups in which part or all of the hydrogen atoms of an aforementioned "alkyl group that may substitute the hydrogen atom bonded to the carbon atom on the α-position" have each been substituted with a halogen atom. Examples of the halogen atom include a fluorine atom, chlorine atom, bromine atom or iodine atom, and a fluorine atom is particularly desirable.

Furthermore, specific examples of the hydroxyalkyl group that may substitute the hydrogen atom bonded to the carbon atom on the α-position include groups in which part or all of the hydrogen atoms of an aforementioned "alkyl group that may substitute the hydrogen atom bonded to the carbon atom on the α-position" have each been substituted with a hydroxyl group.

A hydrogen atom, an alkyl group of 1 to 5 carbon atoms or a halogenated alkyl group of 1 to 5 carbon atoms is preferably bonded to the carbon atom on the α-position of the (α-substituted) acrylate ester, a hydrogen atom, an alkyl group of 1 to 5 carbon atoms or a fluorinated alkyl group of 1 to 5 carbon atoms is more preferred, and from the viewpoint of industrial availability, a hydrogen atom or a methyl group is the most desirable.

In the resist composition of the present invention, the component (A1) preferably includes a structural unit (a1), which is derived from an acrylate ester in which the hydrogen atom bonded to the carbon atom on the α-position may be substituted with a substituent, and contains an acid-degradable group that exhibits increased polarity under the action of acid.

Further, in addition to the structural unit (a1), the component (A1) preferably also includes at least one structural unit (a2) selected from the group consisting of a structural unit (a2$^L$), which is derived from an acrylate ester in which the hydrogen atom bonded to the carbon atom on the α-position may be substituted with a substituent and contains a lactone-containing cyclic group, and a structural unit (a2$^S$), which is derived from an acrylate ester in which the hydrogen atom bonded to the carbon atom on the α-position may be substituted with a substituent and contains an —$SO_2$-containing cyclic group.

Furthermore, in addition to either the structural unit (a1) or a combination of the structural units (a1) and (a2), the component (A1) preferably also includes a structural unit (a3), which is derived from an acrylate ester in which the hydrogen atom bonded to the carbon atom on the α-position may be substituted with a substituent, and contains a polar group-containing aliphatic hydrocarbon group.

Moreover, in the present invention, the component (A1) may also include a structural unit other than the aforementioned structural units (a1) to (a3).

Structural Unit (a1)

The structural unit (a1) is a structural unit which is derived from an acrylate ester in which the hydrogen atom bonded to the carbon atom on the α-position may be substituted with a substituent, and contains an acid-degradable group that exhibits increased polarity under the action of acid.

The acid-degradable group in the structural unit (a1) is a group that degrades under the action of acid, thereby changing the solubility of the entire component (A) in a developing solution.

The term "acid-degradable group" describes a group having acid degradability which, under the action of the acid, undergoes cleavage of at least some of the bonds within the structure of the acid-degradable group. Examples of acid-degradable groups that exhibit increased polarity under the action of acid include groups which degrade under the action of acid to form a polar group.

Examples of this polar group include a carboxyl group, hydroxyl group, amino group and sulfo group (—SO$_3$H). Among these groups, polar groups that contain an —OH within the structure (hereinafter also referred to as "OH-containing polar groups") are preferred, and a carboxyl group or a hydroxyl group is particularly preferred.

More specific examples of the acid-degradable group include groups in which an aforementioned polar group is protected with an acid-dissociable group (such as a group in which the hydrogen atom of an OH-containing polar group is substituted with an acid-dissociable group).

An "acid-dissociable group" describes a group having acid dissociability which, under the action of the acid generated from the component (B) upon exposure, undergoes cleavage of at least the bond between the acid-dissociable group and the atom adjacent to the acid-dissociable group. An acid-dissociable group that constitutes an acid-degradable group must be a group of lower polarity than the polar group generated by dissociation of the acid-dissociable group, so that when the acid-dissociable group dissociates under the action of acid, a polar group having a higher polarity than the acid-dissociable group is generated, resulting in an increase in the polarity of the component (A1).

As a result, the polarity of the entire component (A) increases. Increasing the polarity causes a relative increase in the solubility within the alkali developing solution in the case of an alkali developing process. On the other hand, in the case of a solvent developing process, increasing the polarity causes a relative decrease in the solubility in the organic developing solution containing an organic solvent.

Generally, groups that form either a cyclic or chain-like tertiary alkyl ester with the carboxyl group of the (meth) acrylic acid, and acetal-type acid-dissociable groups such as alkoxyalkyl groups are the most widely known acid-dissociable groups.

Here, a "tertiary alkyl ester" describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(=O)—O—). In this tertiary alkyl ester, the action of acid causes cleavage of the bond between the oxygen atom and the tertiary carbon atom.

The chain-like or cyclic alkyl group may have a substituent.

Hereinafter, for the sake of simplicity, groups that exhibit acid dissociability as a result of the formation of a tertiary alkyl ester with a carboxyl group are referred to as "tertiary alkyl ester-type acid-dissociable groups".

Examples of tertiary alkyl ester-type acid-dissociable groups include aliphatic branched acid-dissociable groups and aliphatic cyclic group-containing acid-dissociable groups.

In the present description and claims, the term "aliphatic" is a relative concept used in relation to the term "aromatic", and defines a group or compound or the like that has no aromaticity.

The term "aliphatic branched" refers to a branched structure having no aromaticity.

The structure of the "aliphatic branched acid-dissociable group" is not limited to groups constituted of only carbon atoms and hydrogen atoms (not limited to hydrocarbon groups), but is preferably a hydrocarbon group.

Further, the "hydrocarbon group" may be either saturated or unsaturated, but in most cases, is preferably saturated The aliphatic branched acid-dissociable group is preferably a tertiary alkyl group of 4 to 8 carbon atoms, and specific examples include a tert-butyl group, tert-pentyl group and tert-heptyl group.

The term "aliphatic cyclic group" refers to a monocyclic group or polycyclic group that has no aromaticity.

The aliphatic cyclic group within the structural unit (a1) may or may not have a substituent. Examples of the substituent include alkyl groups of 1 to 5 carbon atoms, a fluorine atom, fluorinated alkyl groups of 1 to 5 carbon atoms, and an oxygen atom (=O).

The basic ring structure of the "aliphatic cyclic group" excluding substituents is not limited to structures constituted of only carbon and hydrogen (not limited to hydrocarbon groups), but is preferably a hydrocarbon group.

Further, the hydrocarbon group may be either saturated or unsaturated, but in most cases, is preferably saturated. The "aliphatic cyclic group" is preferably a polycyclic group.

Examples of the aliphatic cyclic group include groups in which one or more hydrogen atoms have been removed from a monocycloalkane or a polycycloalkane such as a bicycloalkane, tricycloalkane or tetracycloalkane, which may or may not be substituted with an alkyl group of 1 to 5 carbon atoms, a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

Examples of the aliphatic cyclic group-containing acid-dissociable group include groups having a tertiary carbon atom on the ring structure of a cycloalkyl group. Specific examples include 2-methyl-2-adamantyl group and a 2-ethyl-2-adamantyl group. Additional examples include groups having an aliphatic cyclic group such as an adamantyl group, cyclohexyl group, cyclopentyl group, norbornyl group, tricyclodecyl group or tetracyclododecyl group, and a branched alkylene group having a tertiary carbon atom bonded thereto, such as the groups bonded to the oxygen atom of the carbonyl group (—C(O)—O—) within the structural units represented by general formulas (a1"-1) to (a1"-6) shown below.

[Chemical Formula 3]

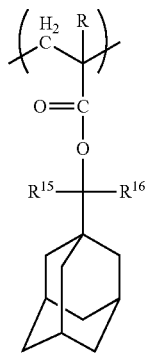 (a1″-1)

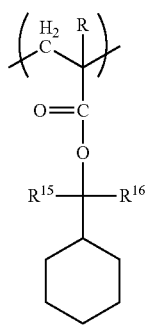 (a1″-2)

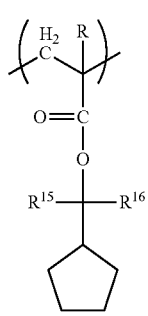 (a1″-3)

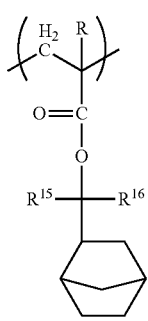 (a1″-4)

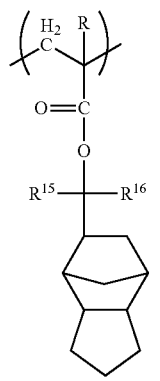 (a1″-5)

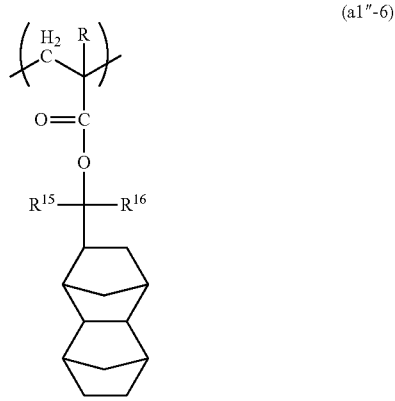 (a1″-6)

In the formulas, R represents a hydrogen atom, an alkyl group of 1 to 5 carbon atoms or a halogenated alkyl group of 1 to 5 carbon atoms, and each of $R^{15}$ and $R^{16}$ independently represents an alkyl group (which may be linear or branched, and preferably has 1 to 5 carbon atoms).

In general formulas (a1'-1) to (a1-6) above, the alkyl group of 1 to 5 carbon atoms or halogenated alkyl group of 1 to 5 carbon atoms for R are the same as defined above for the alkyl group of 1 to 5 carbon atoms or halogenated alkyl group of 1 to 5 carbon atoms with which the hydrogen atom boned to the carbon atom on the α-position may be substituted.

An "acetal-type acid-dissociable group" generally substitutes a hydrogen atom at the terminal of an alkali-soluble group such as a carboxyl group or hydroxyl group, so as to be bonded with an oxygen atom. When acid is generated upon exposure, the generated acid acts to break the bond between the acetal-type acid-dissociable group and the oxygen atom to which the acetal-type acid-dissociable group is bonded.

Examples of acetal-type acid-dissociable groups include groups represented by general formula (p1) shown below.

[Chemical Formula 4]

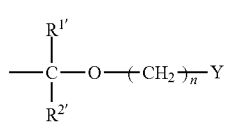 (p1)

In the formula, each of $R^{1'}$ and $R^{2'}$ independently represents a hydrogen atom or an alkyl group of 1 to 5 carbon atoms, n represents an integer of 0 to 3, and Y represents an alkyl group of 1 to 5 carbon atoms or an aliphatic cyclic group.

In general formula (p1) above, n is preferably an integer of 0 to 2, more preferably 0 or 1, and most preferably 0.

Examples of the alkyl group of 1 to 5 carbon atoms a for $R^{1'}$ and $R^{2'}$ include the same alkyl groups of 1 to 5 carbon atoms as those described above for R, although a methyl group or ethyl group is preferable, and a methyl group is particularly desirable.

In the present invention, it is preferable that at least one of $R^{1'}$ and $R^{2'}$ is a hydrogen atom. That is, it is preferable that the acid-dissociable group (p1) is a group represented by general formula (p1-1) shown below.

[Chemical Formula 5]

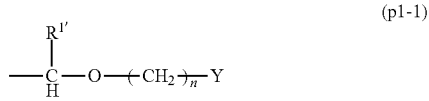

(p1-1)

In the formula, $R^{1'}$, n and Y are the same as defined above.

Examples of the alkyl group of 1 to 5 carbon atoms for Y include the same alkyl groups of 1 to 5 carbon atoms as those described above for R.

As the aliphatic cyclic group for Y, any of the numerous monocyclic and polycyclic aliphatic cyclic groups which have been proposed for conventional ArF resists and the like can be appropriately selected for use. For example, the same groups described above in connection with the "aliphatic cyclic group" can be used.

Further, as the acetal-type acid-dissociable group, groups represented by general formula (p2) shown below can also be used.

[Chemical Formula 6]

(p2)

In the formula, each of $R^{17}$ and $R^{18}$ independently represents a linear or branched alkyl group or a hydrogen atom, and $R^{19}$ represents a linear, branched or cyclic alkyl group, or alternatively, each of $R^{17}$ and $R^{19}$ may independently represent a linear or branched alkylene group, wherein $R^{17}$ and $R^{19}$ are bonded to each other to form a ring.

The alkyl group for $R^{17}$ and $R^{18}$ preferably has 1 to 15 carbon atoms, and may be either linear or branched. As the alkyl group, an ethyl group or methyl group is preferable, and a methyl group is most preferable.

It is particularly desirable that either one of $R^{17}$ and $R^{18}$ is a hydrogen atom, and the other is a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or methyl group, and most preferably an ethyl group.

When $R^{19}$ represents a cycloalkyl group, it preferably has 4 to 15 carbon atoms, more preferably 4 to 12 carbon atoms, and most preferably 5 to 10 carbon atoms. Examples of the cycloalkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, each of $R^{17}$ and $R^{19}$ may independently represent a linear or branched alkylene group (preferably an alkylene group of 1 to 5 carbon atoms), wherein $R^{19}$ and $R^{17}$ are bonded to each other.

In such a case, a cyclic group is formed by $R^{17}$, $R^{19}$, the oxygen atom having $R^{19}$ bonded thereto, and the carbon atom having the oxygen atom and $R^{17}$ bonded thereto. Such a cyclic group is preferably a 4- to 7-membered ring, and more preferably a 4- to 6-membered ring. Specific examples of the cyclic group include a tetrahydropyranyl group and a tetrahydrofuranyl group.

As the structural unit (a1), it is preferable to use at least one structural unit selected from the group consisting of structural units represented by general formula (a1-0-1) shown below and structural units represented by general formula (a1-0-2) shown below.

[Chemical Formula 7]

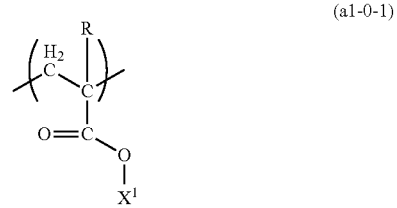

(a1-0-1)

In the formula, R represents a hydrogen atom, an alkyl group of 1 to 5 carbon atoms or a halogenated alkyl group of 1 to 5 carbon atoms, and $X^1$ represents an acid-dissociable group.

[Chemical Formula 8]

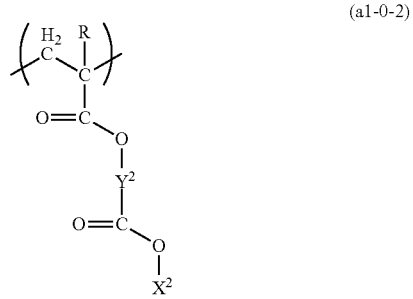

(a1-0-2)

In the formula, R represents a hydrogen atom, an alkyl group of 1 to 5 carbon atoms or a halogenated alkyl group of 1 to 5 carbon atoms, $X^2$ represents an acid-dissociable group, and $Y^2$ represents a divalent linking group.

In general formula (a1-0-1) above, the alkyl group of 1 to 5 carbon atoms and the halogenated alkyl group of 1 to 5 carbon atoms for R are the same as defined above for the alkyl group of 1 to 5 carbon atoms and halogenated alkyl group of 1 to 5 carbon atoms which may be bonded to the α-position of the aforementioned acrylate ester.

There are no particular limitations on $X^1$ as long as it is an acid-dissociable group. Examples include the aforementioned tertiary alkyl ester-type acid-dissociable groups and acetal-type acid-dissociable groups, and of these, tertiary alkyl ester-type acid-dissociable groups are preferable.

In general formula (a1-0-2) above, R is the same as defined above.

$X^2$ is the same as defined for $X^1$ in formula (a1-0-1).

Examples of the divalent linking group for $Y^2$ include alkylene groups, divalent aliphatic cyclic groups, and divalent linking groups containing a hetero atom.

Examples of the aliphatic cyclic group include the same groups as those mentioned above in connection with the description of the "aliphatic cyclic group", with the exception that two or more hydrogen atoms have been removed therefrom.

When $Y^2$ represents an alkylene group, the group preferably contains 1 to 10 carbon atoms, more preferably 1 to 6 carbon atoms, still more preferably 1 to 4 carbon atoms, and most preferably 1 to 3 carbon atoms.

When $Y^2$ represents a divalent aliphatic cyclic group, the group preferably contains 3 to 20 carbon atoms, and more preferably 3 to 12 carbon atoms. Specifically, it is particularly desirable that the divalent aliphatic cyclic group is a group in which two or more hydrogen atoms have been removed from cyclopentane, cyclohexane, norbornane, isobornane, adamantane, tricyclodecane or tetracyclododecane.

When $Y^2$ represents a divalent linking group containing a hetero atom, examples thereof include —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$—, —S(=O)$_2$—O—, and -A-O—B— (wherein O is an oxygen atom, and each of A and B independently represents a divalent hydrocarbon group which may have a substituent).

When $Y^2$ represents a divalent linking group —NH— and the H in the formula is replaced with a substituent such as an alkyl group or an acyl group, the substituent preferably has 1 to 10 carbon atoms, more preferably 1 to 8 carbon atoms, and most preferably 1 to 5 carbon atoms.

When $Y^2$ is -A-O—B—, each of A and B independently represents a divalent hydrocarbon group which may have a substituent.

The description that the hydrocarbon group "may have a substituent" means that part or all of the hydrogen atoms within the hydrocarbon group may each be substituted with an atom other than a hydrogen atom or with a group.

The linear or branched aliphatic hydrocarbon group (which hereinafter may be referred to jointly as a "chain-like aliphatic hydrocarbon group") may or may not have a substituent. Examples of the substituent include a fluorine atom, a fluorinated alkyl group of 1 to 5 carbon atoms and an oxygen atom (=O). The hydrocarbon group for A may be either an aliphatic hydrocarbon group, or an aromatic hydrocarbon group. An "aliphatic hydrocarbon group" refers to a hydrocarbon group that has no aromaticity.

The aliphatic hydrocarbon group for A may be either saturated or unsaturated. In general, the aliphatic hydrocarbon group is preferably saturated.

More specific examples of the aliphatic hydrocarbon group for A include linear or branched aliphatic hydrocarbon groups, and aliphatic hydrocarbon groups that include a ring within the structure.

The linear or branched aliphatic hydrocarbon group preferably has 1 to 10 carbon atoms, more preferably 1 to 8 carbon atoms, still more preferably 2 to 5 carbon atoms, and most preferably 2 carbon atoms.

As the linear aliphatic hydrocarbon group, a linear alkylene group is preferable, and specific examples include a methylene group, an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, a branched alkylene group is preferable, and specific examples include alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—, alkylethylene groups such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—, alkyltrimethylene groups such as —CH(CH$_3$)CH$_2$CH$_2$— and —CH$_2$CH(CH$_3$)CH$_2$—, and alkyltetramethylene groups such as —CH(CH$_3$)CH$_2$CH$_2$CH$_2$— and —CH$_2$CH(CH$_3$)CH$_2$CH$_2$—. As the alkyl group within the alkylalkylene group, a linear alkyl group of 1 to 5 carbon atoms is preferable.

Examples of the aliphatic hydrocarbon group that includes a ring within the structure include cyclic aliphatic hydrocarbon groups (groups in which two hydrogen atoms have been removed from an aliphatic hydrocarbon ring), and groups in which a cyclic aliphatic hydrocarbon group is bonded to the terminal of an aforementioned chain-like aliphatic hydrocarbon group or interposed within the chain of an aforementioned chain-like aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

As the group A, a linear aliphatic hydrocarbon group is preferred, a linear alkylene group is more preferred, a linear alkylene group of 2 to 5 carbon atoms is still more preferred, and an ethylene group is the most desirable.

The aromatic hydrocarbon group for A preferably has 3 to 30 carbon atoms, more preferably 5 to 30 carbon atoms, still more preferably 5 to 20 carbon atoms, still more preferably 6 to 15 carbon atoms, and most preferably 6 to 10 carbon atoms. This number of carbon atoms does not include any carbon atoms within substituents. Examples of the aromatic hydrocarbon group for A include divalent aromatic hydrocarbon groups in which an additional hydrogen atom has been removed from the aromatic hydrocarbon nucleus of a monovalent aromatic hydrocarbon group such as a phenyl group, biphenylyl group, fluorenyl group, naphthyl group, anthryl group or phenanthryl group; aromatic hydrocarbon groups in which some of the carbon atoms that constitute the ring of an aforementioned divalent aromatic hydrocarbon group have been substituted with a hetero atom such as an oxygen atom, sulfur atom or nitrogen atom; and aromatic hydrocarbon groups in which an additional hydrogen atom has been removed from the aromatic hydrocarbon nucleus of an arylalkyl group such as a benzyl group, phenethyl group, 1-naphthylmethyl group, 2-naphthylmethyl group, 1-naphthylethyl group or 2-naphthylethyl group.

The aromatic hydrocarbon group may or may not have a substituent. Examples of the substituent include an alkyl group of 1 to 5 carbon atoms, a fluorine atom, a fluorinated alkyl group of 1 to 5 carbon atoms, and an oxygen atom (=O).

Examples of the hydrocarbon group for B include the same divalent hydrocarbon groups as those listed above for A.

As the group B, a linear or branched aliphatic hydrocarbon group is preferable, and a methylene group or an alkylmethylene group is particularly desirable.

The alkyl group within the alkyl methylene group is preferably a linear alkyl group of 1 to 5 carbon atoms, more preferably a linear alkyl group of 1 to 3 carbon atoms, and most preferably a methyl group.

Specific examples of the structural unit (a1) include structural units represented by general formulas (a1-1) to (a1-4) shown below.

[Chemical Formula 9]

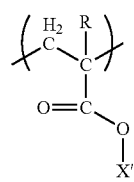

(a1-1)

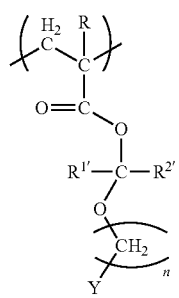

(a1-2)

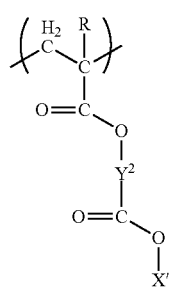

(a1-3)

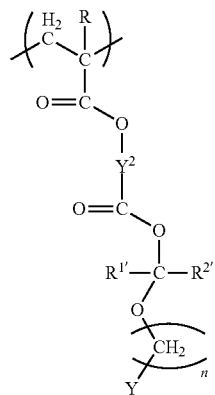

(a1-4)

In the formulas, $X'$ represents a tertiary alkyl ester-type acid-dissociable group, Y represents an alkyl group of 1 to 5 carbon atoms or an aliphatic cyclic group, n represents an integer of 0 to 3, $Y^2$ represents a divalent linking group, R is the same as defined above, and each of $R^{1'}$ and $R^{2'}$ independently represents a hydrogen atom or an alkyl group of 1 to 5 carbon atoms.

In the formulas, examples of the tertiary alkyl ester-type acid-dissociable group for $X'$ include the same tertiary alkyl ester-type acid-dissociable groups as those described above for $X^1$.

$R^{1'}$, $R^{2'}$, n and Y are the same as defined above for $R^{1'}$, $R^{2'}$, n and Y respectively in general formula (p1) described above in connection with the "acetal-type acid-dissociable group".

Examples of $Y^2$ include the same groups as those listed above for $Y^2$ in general formula (a1-0-2).

Specific examples of structural units represented by general formula (a1-1) to (a1-4) are shown below.

In the formulas shown below, $R^\alpha$ represents a hydrogen atom, a methyl group or a trifluoromethyl group.

[Chemical Formula 10]

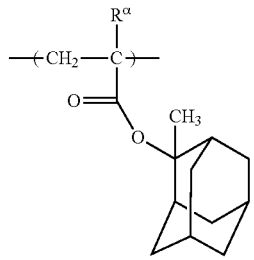

(a1-1-1)

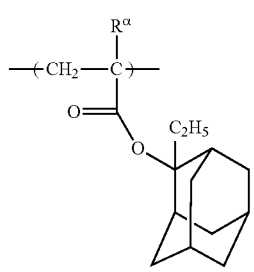

(a1-1-2)

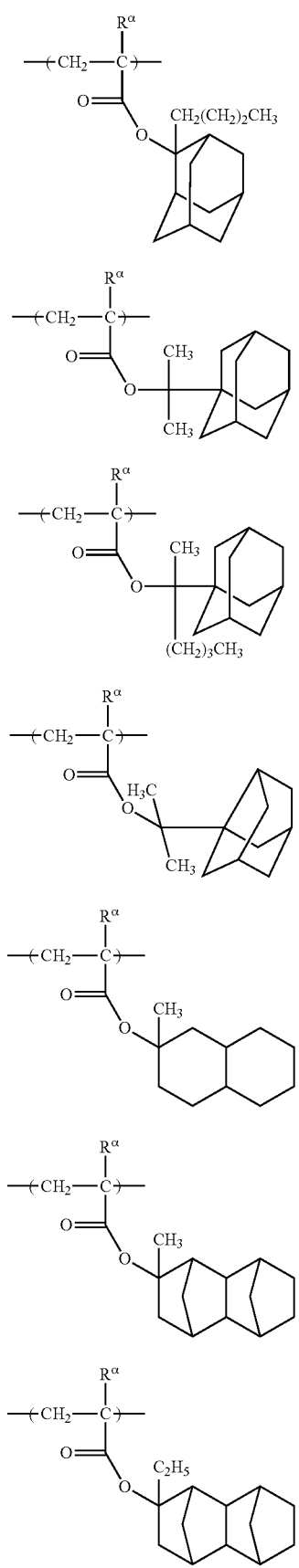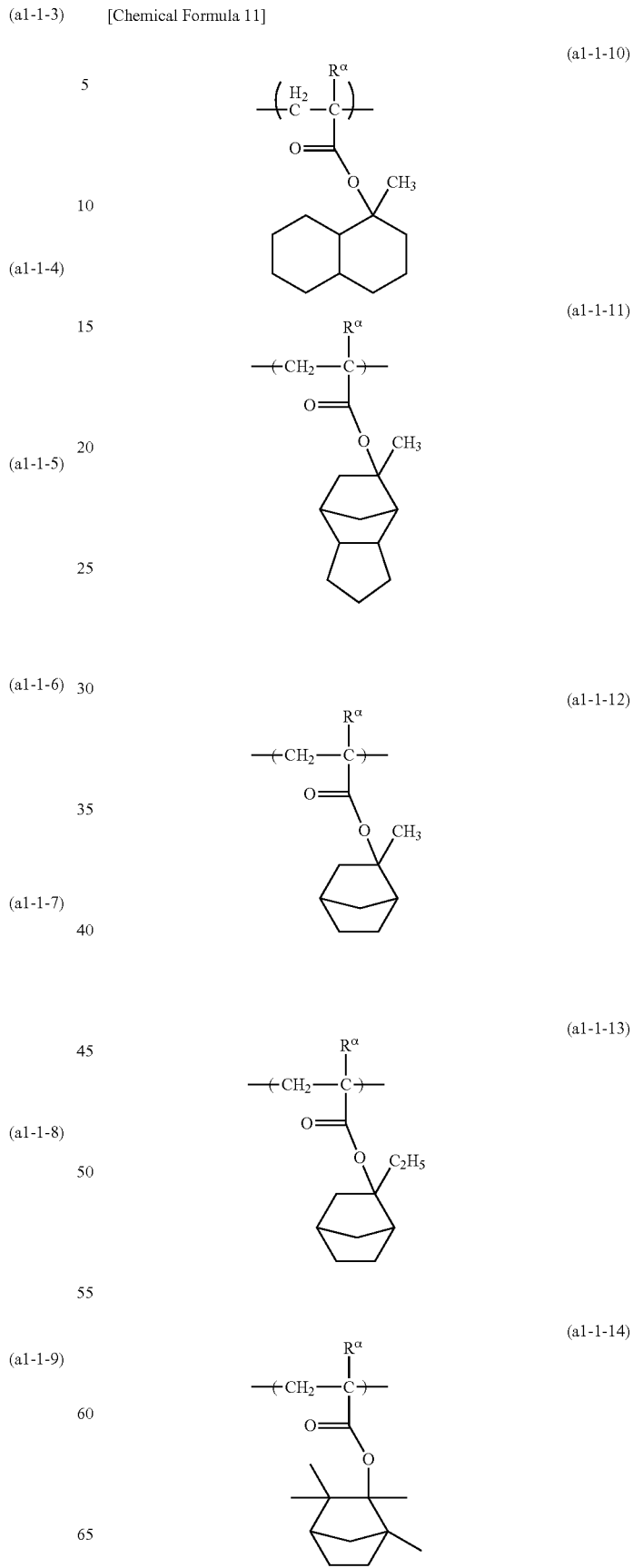

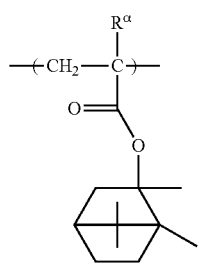 (a1-1-15)
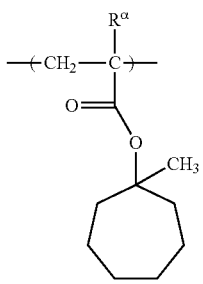 (a1-1-16)
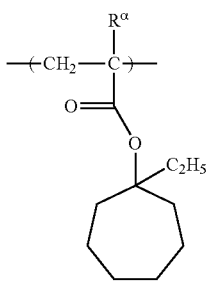 (a1-1-17)
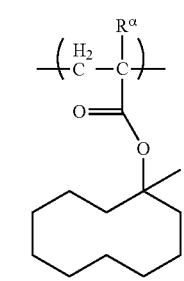 (a1-1-18)
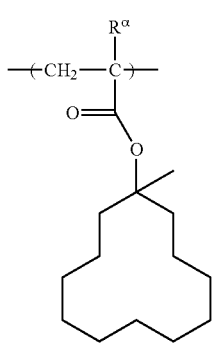 (a1-1-19)
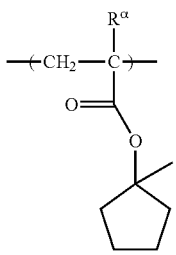 (a1-1-20)
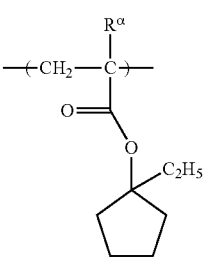 (a1-1-21)
[Chemical Formula 12]
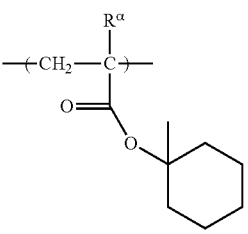 (a1-1-22)
(a1-1-23)
(a1-1-24)
(a1-1-25)

(a1-1-26)
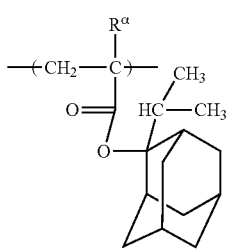
(a1-1-27)
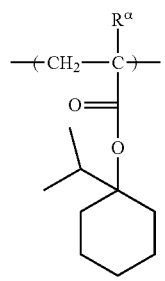
(a1-1-28)
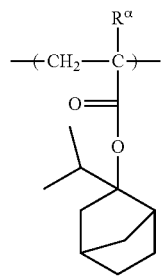
(a1-1-29)
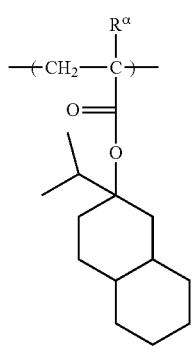
(a1-1-30)
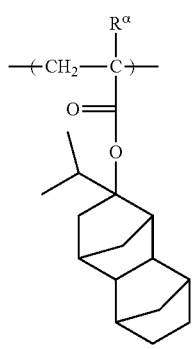
(a1-1-31)
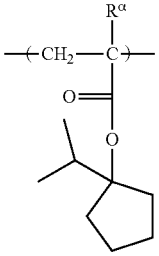
(a1-1-32)
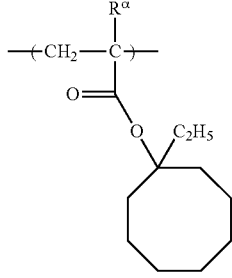
(a1-1-33)
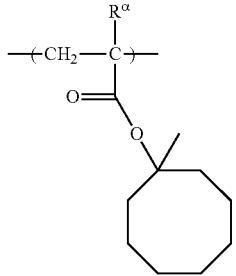
(a1-1-34)
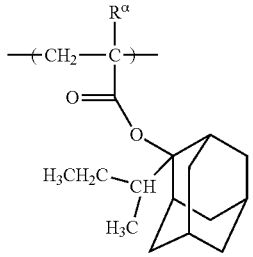
[Chemical Formula 13]
(a1-2-1)
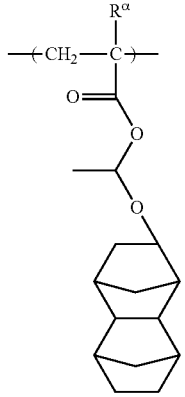

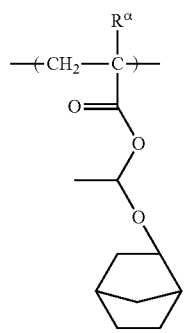 (a1-2-2)
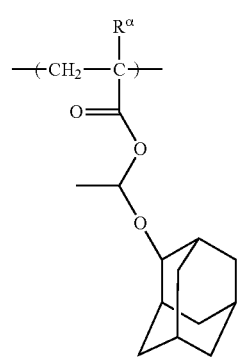 (a1-2-3)
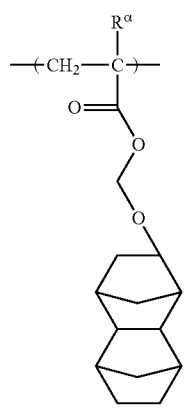 (a1-2-4)
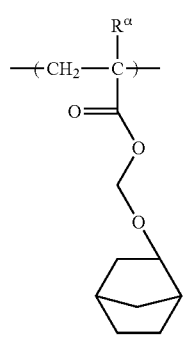 (a1-2-5)
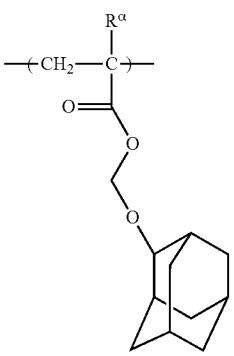 (a1-2-6)
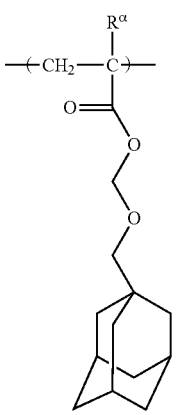 (a1-2-7)
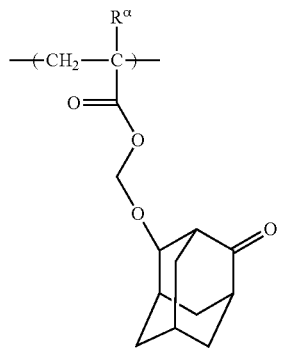 (a1-2-8)
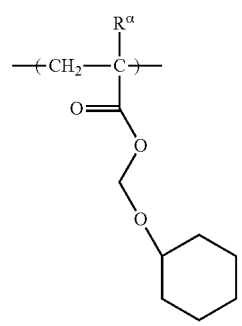 (a1-2-9)

(a1-2-10) 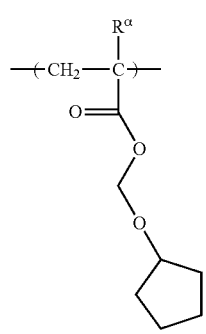
(a1-2-11) 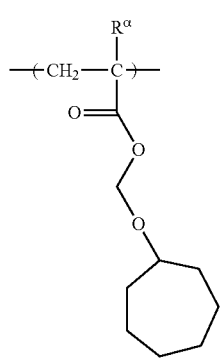
(a1-2-12) 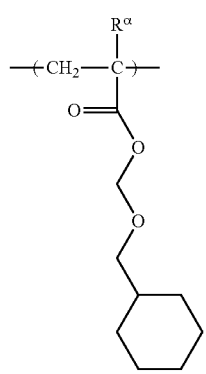
(a1-2-13) 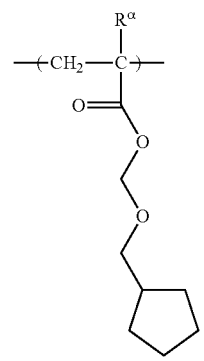
(a1-2-14) 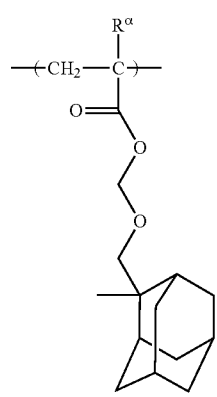
(a1-2-15) 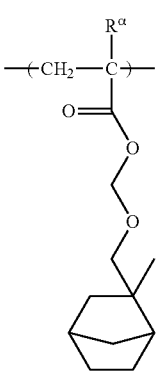
(a1-2-16) 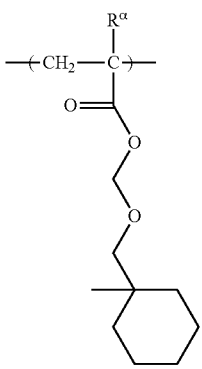
(a1-2-17) 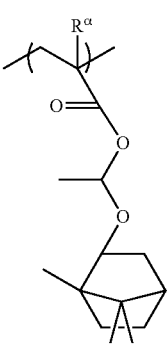

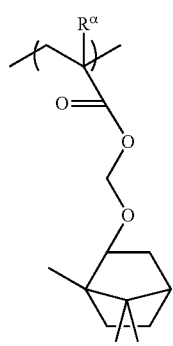 (a1-2-18)
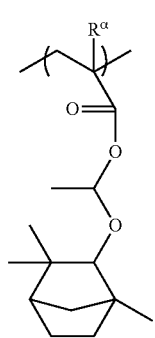 (a1-2-19)
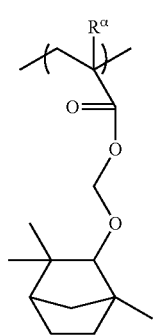 (a1-2-20)
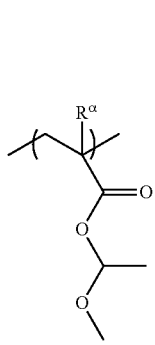 (a1-2-21)
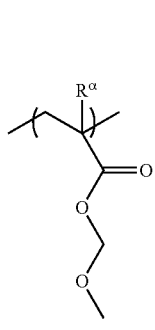 (a1-2-22)
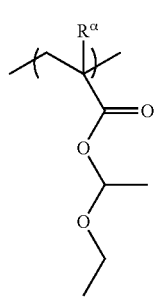 (a1-2-23)
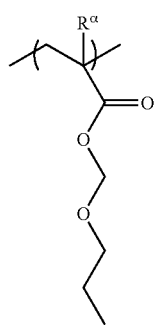 (a1-2-24)
[Chemical Formula 14]
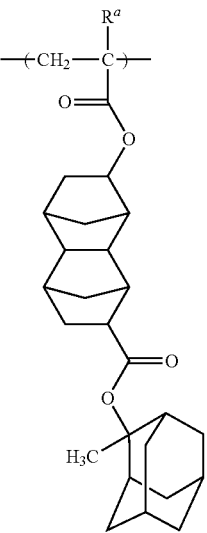 (a1-3-1)

31
-continued
(a1-3-2)
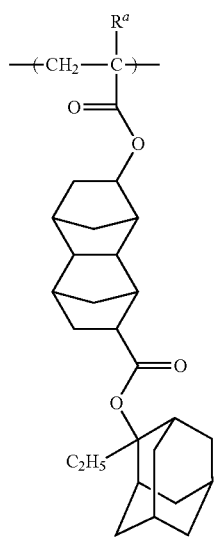
(a1-3-3)
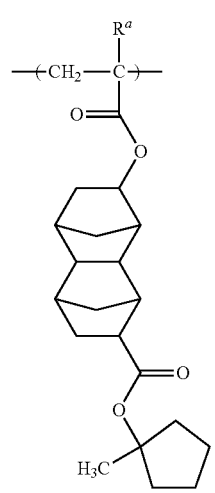
(a1-3-4)
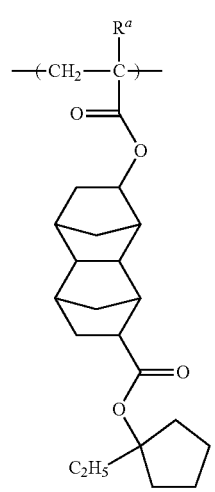
32
-continued
(a1-3-5)
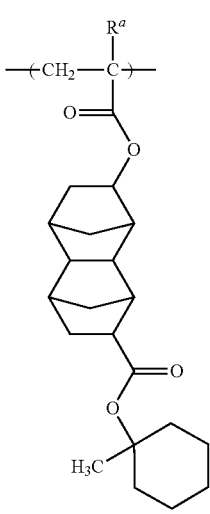
(a1-3-6)
(a1-3-7)

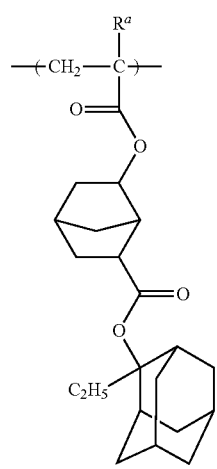
(a1-3-8)
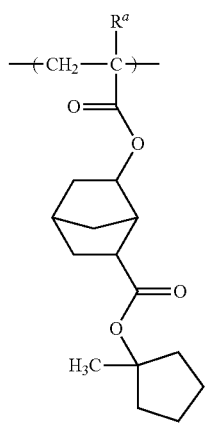
(a1-3-11)
(a1-3-9)
(a1-3-12)
(a1-3-10)
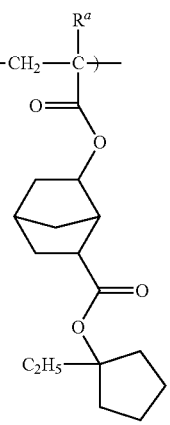
(a1-3-13)
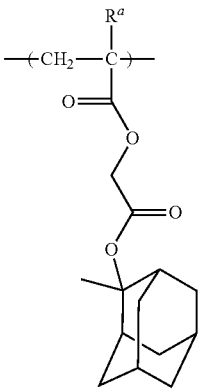
(a1-3-14)
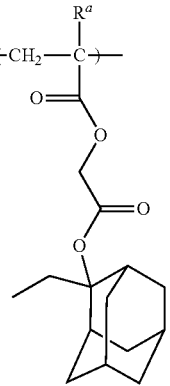

[Chemical Formula 15]
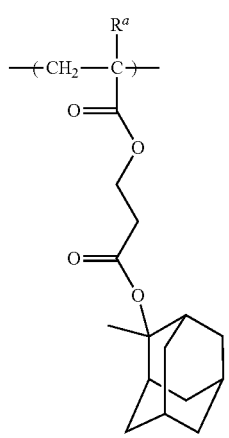
(a1-3-15)
(a1-3-16)
(a1-3-17)
(a1-3-18)
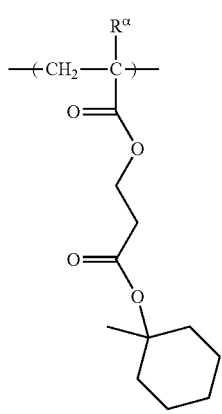
(a1-3-19)
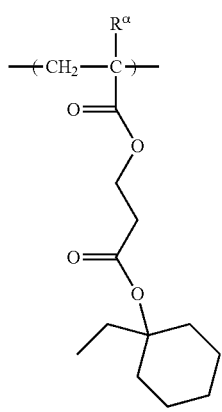
(a1-3-20)
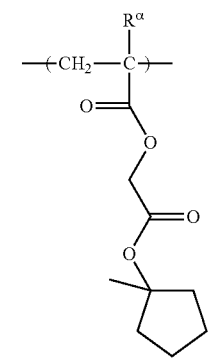
(a1-3-21)
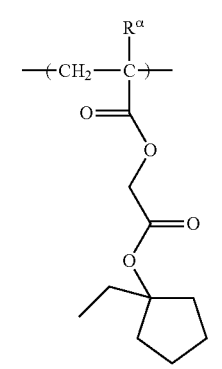
(a1-3-22)

(a1-3-23)
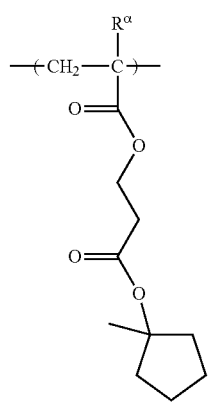
(a1-3-24)
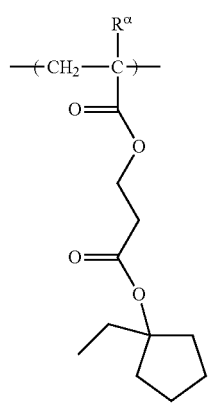
[Chemical Formula 16]
(a1-3-25)
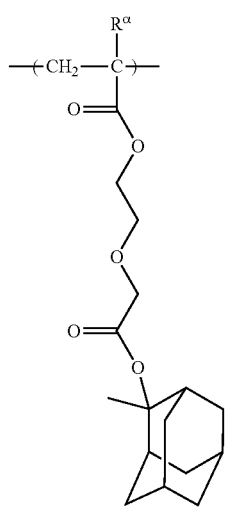
(a1-3-26)
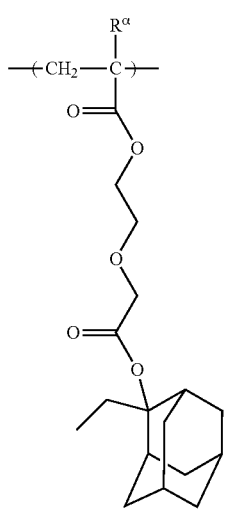
(a1-3-27)
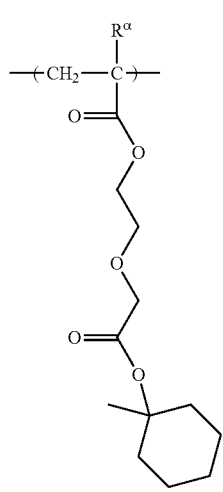
(a1-3-28)
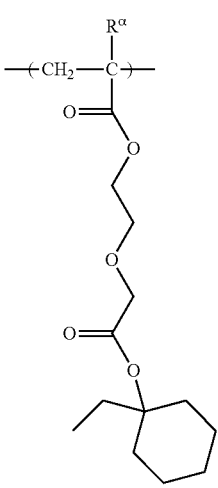

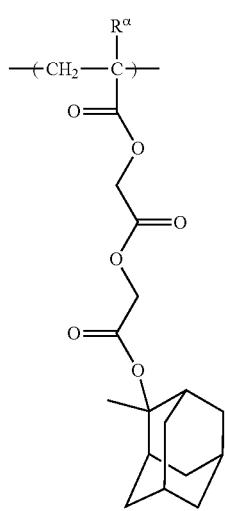
(a1-3-29)
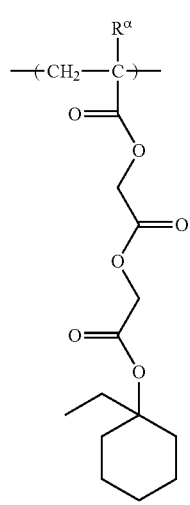
(a1-3-30)
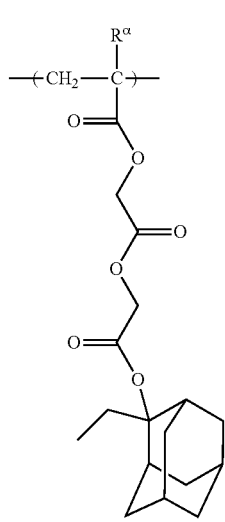
(a1-3-31)
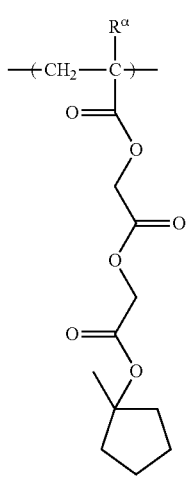
(a1-3-32)
[Chemical Formula 17]
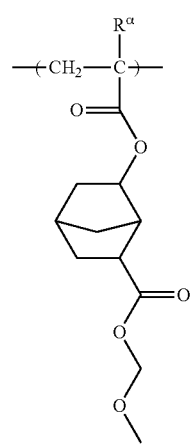
(a1-4-1)
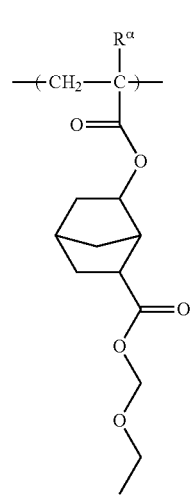
(a1-4-2)

(a1-4-3)
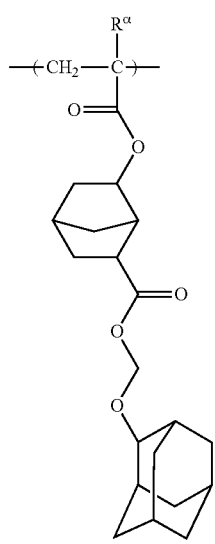
(a1-4-4)
(a1-4-5)
(a1-4-6)
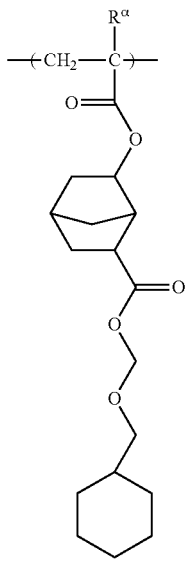
(a1-4-7)
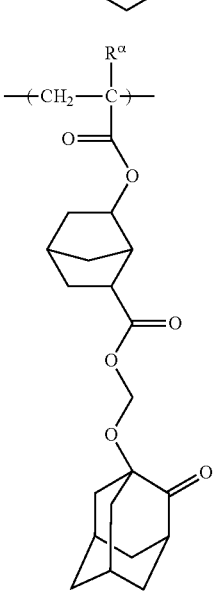
(a1-4-8)
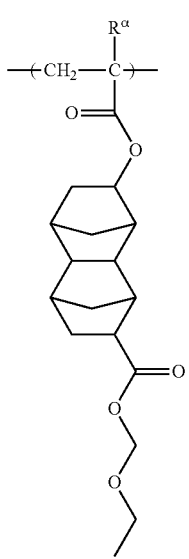

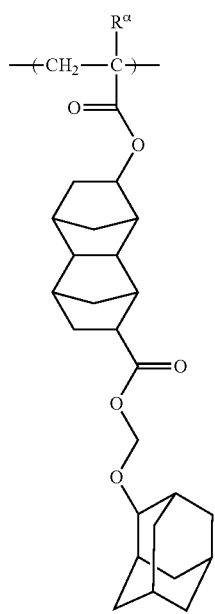
(a1-4-9)
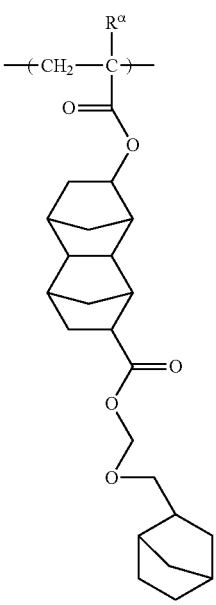
(a1-4-11)
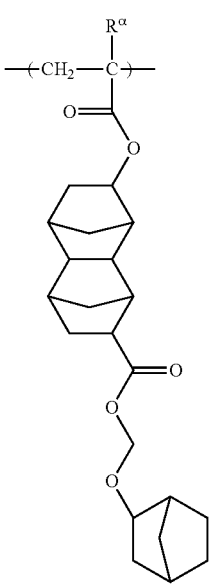
(a1-4-10)
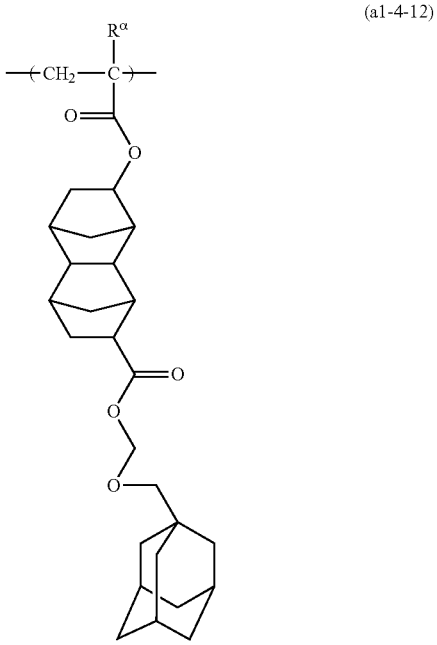
(a1-4-12)

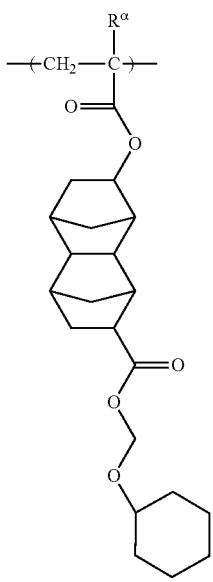
(a1-4-13)

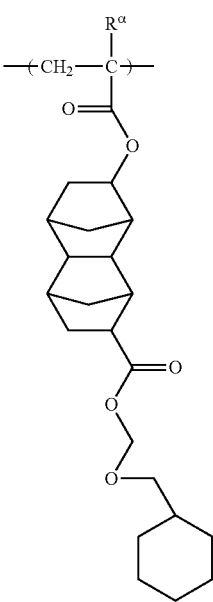
(a1-4-14)

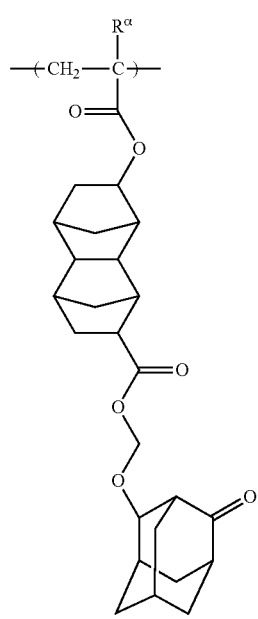
(a1-4-15)

As the structural unit (a1), one type of structural unit may be used alone, or two or more types of structural units may be used in combination.

Among these, structural units represented by general formula (a1-1) or (a1-3) are preferable. More specifically, at least one structural unit selected from the group consisting of structural units represented by formulas (a1-1-1) to (a-1-1-4), (a1-1-16), (a1-1-17), (a1-1-20) to (a1-1-23), (a1-1-26), (a1-1-32), (a1-1-33), (a1-1-34) and (a1-3-25) to (a1-3-28) is more preferable.

Further, as the structural unit (a1), structural units represented by general formula (a1-1-01) shown below which includes the structural units represented by formulas (a1-1-1) to (a1-1-3), (a1-1-26) and (a1-1-34), structural units represented by general formula (a1-1-02) shown below which includes the structural units represented by formulas (a1-1-16), (a1-1-17), (a1-1-20) to (a1-1-23), (a1-1-32) and (a1-1-33), structural units represented by general formula (a1-3-01) shown below which includes the structural units represented by formulas (a1-3-25) and (a1-3-26), structural units represented by general formula (a1-3-02) shown below which includes the structural units represented by formulas (a1-3-27) and (a1-3-28), structural units represented by general formula (a1-3-03-1) shown below which includes the structural units represented by formulas (a1-3-29) and (a1-3-31), and structural units represented by general formula (a1-3-03-2) shown below which includes the structural units represented by formulas (a1-3-30) and (a1-3-32) are also preferable.

[Chemical Formula 18]

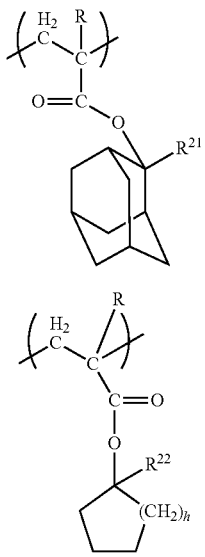

(a1-1-01)

(a1-1-02)

In formula (a1-1-01), R represents a hydrogen atom, an alkyl group of 1 to 5 carbon atoms or a halogenated alkyl group of 1 to 5 carbon atoms, and $R^{21}$ represents an alkyl group of 1 to 5 carbon atoms. In formula (a1-1-02), R is the same as defined above, $R^{22}$ represents an alkyl group of 1 to 5 carbon atoms, and h represents an integer of 1 to 6.

In general formula (a1-1-01), R is the same as defined above.

The alkyl group of 1 to 5 carbon atoms for $R^{21}$ is the same as defined above for the alkyl group of 1 to 5 carbon atoms for R, and is preferably a methyl group, ethyl group or isopropyl group.

In general formula (a1-1-02), R is the same as defined above.

The alkyl group of 1 to 5 carbon atoms for $R^{22}$ is the same as defined above for the alkyl group of 1 to 5 carbon atoms for R, and is preferably a methyl group, ethyl group or isopropyl group. h is preferably 1 or 2, and is most preferably 2.

[Chemical Formula 19]

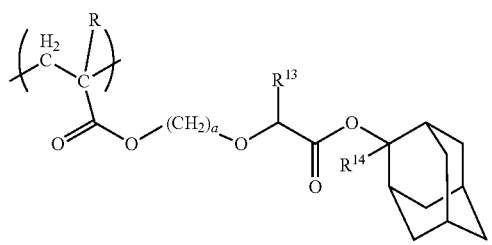

(a1-3-01)

In the formula, R represents a hydrogen atom, an alkyl group of 1 to 5 carbon atoms or a halogenated alkyl group of 1 to 5 carbon atoms, $R^{14}$ represents an alkyl group of 1 to 5 carbon atoms, $R^{13}$ represents a hydrogen atom or a methyl group, and a represents an integer of 1 to 10.

[Chemical Formula 20]

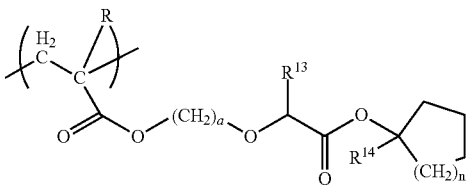

(a1-3-02)

In the formula, R represents a hydrogen atom, an alkyl group of 1 to 5 carbon atoms or a halogenated alkyl group of 1 to 5 carbon atoms, $R^{14}$ represents an alkyl group of 1 to 5 carbon atoms, $R^{13}$ represents a hydrogen atom or a methyl group, a represents an integer of 1 to 10, and n' represents an integer of 1 to 6.

In general formulas (a1-3-01) and (a1-3-02), R is the same as defined above.

$R^{13}$ is preferably a hydrogen atom.

The alkyl group of 1 to 5 carbon atoms for $R^{14}$ is the same as the alkyl group of 1 to 5 carbon atoms defined above for R, and is preferably a methyl group or ethyl group.

a is preferably an integer of 1 to 8, more preferably an integer of 2 to 5, and most preferably 2.

[Chemical Formula 21]

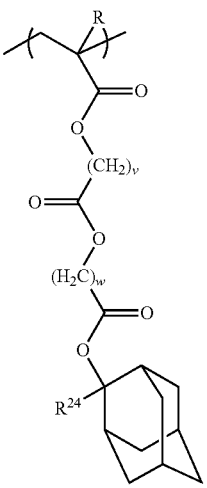

(a1-3-03-1)

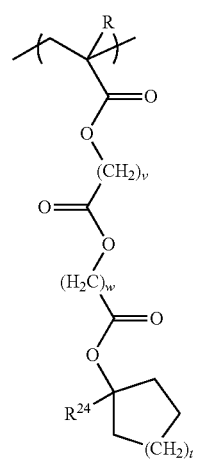

(a1-3-03-2)

In the formulas, R and $R^{24}$ are the same as defined above, v represents an integer of 1 to 10, w represents an integer of 1 to 10, and t represents an integer of 0 to 3.

v is preferably an integer of 1 to 5, and most preferably 1 or 2.

w is preferably an integer of 1 to 5, and most preferably 1 or 2.

t is preferably an integer of 1 to 3, and most preferably 1 or 2.

In the component (A1), the amount of the structural unit (a1), based on the combined total of all the structural units that constitute the component (A1), is preferably within a range from 10 to 80 mol %, more preferably from 20 to 70 mol %, and still more preferably from 25 to 50 mol %. When the amount of the structural unit (a1) is at least as large as the lower limit of the aforementioned range, a pattern can be easily formed using a resist composition prepared from the component (A1). On the other hand, when the amount of the structural unit (a1) is not more than the upper limit of the above range, a good balance can be achieved with the other structural units.

Structural Unit (a2)

The structural unit (a2) is a structural unit which is derived from an acrylate ester in which the hydrogen atom bonded to the carbon atom on the α-position may be substituted with a substituent, and is at least one structural unit selected from the group consisting of a structural unit derived from an acrylate ester that contains an —$SO_2$-containing cyclic group (hereinafter referred to as "structural unit (a2$^S$)") and a structural unit derived from an acrylate ester that contains a lactone-containing cyclic group (hereinafter referred to as "structural unit (a2$^L$)").

By including an —$SO_2$-containing cyclic group or a lactone-containing cyclic group, the structural unit (a2) contributes to improvements in the lithography properties, for example by enhancing the adhesion between the substrate and a resist film formed using a resist composition containing the component (A1), and by increasing the compatibility with developing solutions that contain water.

Structural Unit (a2$^S$):

The structural unit (a2$^S$) is a structural unit which is derived from an acrylate ester in which the hydrogen atom bonded to the carbon atom on the α-position may be substituted with a substituent, and contains an —$SO_2$-containing cyclic group.

Here, an "—$SO_2$-containing cyclic group" refers to a cyclic group having a ring containing an —$SO_2$— group within the ring structure, and specifically refers to a cyclic group in which the sulfur atom (S) within the —$SO_2$— group forms part of the ring skeleton of the cyclic group. In the —$SO_2$-containing cyclic group, the ring containing the —$SO_2$— group within the ring structure is counted as the first ring, so that groups containing only that ring are referred to as monocyclic groups, and groups containing other ring structures are described as polycyclic groups regardless of the structure of the other rings. The —$SO_2$-containing cyclic group may be either a monocyclic group or a polycyclic group.

The —$SO_2$-containing cyclic group is preferably a cyclic group containing an —O—$SO_2$— group within the ring skeleton, namely a cyclic group containing a sultone ring in which the —O—S— within the —O—$SO_2$— forms a part of the ring skeleton.

The —$SO_2$-containing cyclic group preferably contains 3 to 30 carbon atoms, more preferably 4 to 20 carbon atoms, still more preferably 4 to 15 carbon atoms, and most preferably 4 to 12 carbon atoms. Here, the number of carbon atoms refers to the number of carbon atoms that constitute the ring skeleton, and does not include carbon atoms contained within substituents.

The —$SO_2$-containing cyclic group may be either an —$SO_2$-containing aliphatic cyclic group or an —$SO_2$-containing aromatic cyclic group. An —$SO_2$-containing aliphatic cyclic group is preferable.

Examples of the —$SO_2$-containing aliphatic cyclic group include groups in which at least one hydrogen atom has been removed from an aliphatic hydrocarbon ring in which a portion of the carbon atoms that constitute the ring structure have been substituted with a —$SO_2$— group or —O—$SO_2$— group. More specific examples include groups in which at least one hydrogen atom has been removed from an aliphatic hydrocarbon ring in which a —$CH_2$— group that constitutes part of the ring structure has been substituted with an —$SO_2$— group, and groups in which at least one hydrogen atom has been removed from an aliphatic hydrocarbon ring in which a —$CH_2$—$CH_2$— group that constitutes part of the ring structure has been substituted with an —O—$SO_2$— group.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic group, a group in which two hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Examples of the polycycloalkane include adamantane, norbornane, isobornane, tricyclodecane and tetracyclododecane.

The —$SO_2$-containing cyclic group may have a substituent. Examples of the substituent include an alkyl group, alkoxy group, halogen atom, halogenated alkyl group, hydroxyl group, oxygen atom (=O), —COOR", —OC(=O)R", hydroxyalkyl group and cyano group.

The alkyl group for the substituent is preferably an alkyl group of 1 to 6 carbon atoms. Further, the alkyl group is preferably a linear or branched group. Specific examples include a methyl group, ethyl group, propyl group, isopropyl group, n-butyl group, isobutyl group, tert-butyl group, pentyl group, isopentyl group, neopentyl group and hexyl group. Among these, a methyl group or ethyl group is preferred, and a methyl group is particularly desirable.

The alkoxy group for the substituent is preferably an alkoxy group of 1 to 6 carbon atoms. Further, the alkoxy group is preferably a linear or branched group. Specific examples include groups in which an oxygen atom (—O—) is bonded to any of the substituent alkyl groups described above.

Examples of the halogen atom for the substituent include a fluorine atom, chlorine atom, bromine atom and iodine atom, and a fluorine atom is preferable.

Examples of the halogenated alkyl group for the substituent include groups in which part or all of the hydrogen atoms of an aforementioned alkyl group for the substituent have each been substituted with an aforementioned halogen atom. A fluorinated alkyl group is preferred as the halogenated alkyl group, and a perfluoroalkyl group is particularly desirable.

In the aforementioned —COOR" group and —O(C=O)R" group, R" represents a hydrogen atom, or a linear, branched or cyclic alkyl group of 1 to 15 carbon atoms.

When R" represents a linear or branched alkyl group, the alkyl group preferably contains 1 to 10 carbon atoms, and more preferably 1 to 5 carbon atoms, and is most preferably a methyl group or ethyl group.

When R" is a cyclic alkyl group (cycloalkyl group), the group preferably has 3 to 15 carbon atoms, more preferably 4 to 12 carbon atoms, and most preferably 5 to 10 carbon atoms. Examples of the cycloalkyl group include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

The hydroxyalkyl group for the substituent preferably has 1 to 6 carbon atoms, and specific examples thereof include groups in which at least one hydrogen atom within an aforementioned alkyl group for the substituent has been substituted with a hydroxyl group.

More specific examples of the —$SO_2$— containing cyclic group include groups represented by general formulas (3-1) to (3-4) shown below.

[Chemical Formula 22]

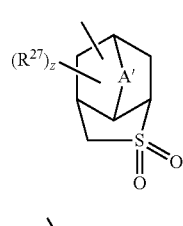
(3-1)

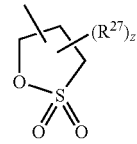
(3-2)

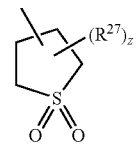
(3-3)

(3-4)

In the formulas, A' represents an oxygen atom, a sulfur atom, or an alkylene group of 1 to 5 carbon atoms which may contain an oxygen atom or a sulfur atom, z represents an integer of 0 to 2, and $R^{27}$ represents an alkyl group, alkoxy group, halogenated alkyl group, hydroxyl group, —COOR", —OC(=O)R", hydroxyalkyl group or cyano group, wherein R" represents a hydrogen atom or an alkyl group.

In general formulas (3-1) to (3-4) above, A' represents an oxygen atom (—O—), a sulfur atom (—S—), or an alkylene group of 1 to 5 carbon atoms which may contain an oxygen atom or a sulfur atom.

As the alkylene group of 1 to 5 carbon atoms represented by A', a linear or branched alkylene group is preferable, and examples thereof include a methylene group, ethylene group, n-propylene group and isopropylene group.

Examples of alkylene groups that contain an oxygen atom or a sulfur atom include the aforementioned alkylene groups in which —O— or —S— is either bonded to the terminal of the alkylene group or interposed between carbon atoms of the alkylene group.

Specific examples of such alkylene groups include —O—$CH_2$—, —$CH_2$—O—$CH_2$—, —S—$CH_2$— and —$CH_2$—S—$CH_2$—.

As the group A', an alkylene group of 1 to 5 carbon atoms or —O— is preferable, an alkylene group of 1 to 5 carbon atoms is more preferred, and a methylene group is the most desirable.

z represents an integer of 0 to 2, and is most preferably 0.

When z is 2, the plurality of $R^{27}$ groups may be the same or different from each other.

Examples of the alkyl group, alkoxy group, halogenated alkyl group, —COOR" group, —OC(=O)R" group and hydroxyalkyl group for $R^{27}$ include the same alkyl groups, alkoxy groups, halogenated alkyl groups, —COOR" groups, —OC(=O)R" groups and hydroxyalkyl groups as those described above for the substituent for the —$SO_2$-containing cyclic group.

Specific examples of the cyclic groups represented by general formulas (3-1) to (3-4) are shown below. In the formulas shown below, "Ac" represents an acetyl group.

[Chemical Formula 23]

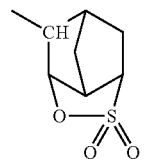
(3-1-1)

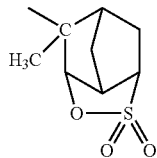
(3-1-2)

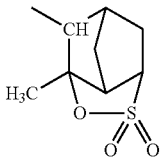
(3-1-3)

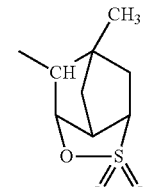
(3-1-4)

-continued
(3-1-5) 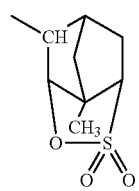
(3-1-6) 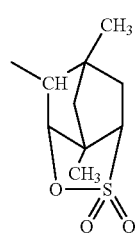
(3-1-7) 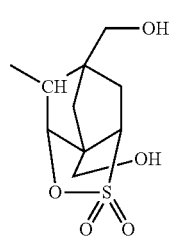
(3-1-8) 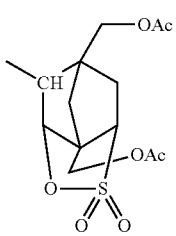
(3-1-9) 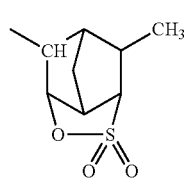
(3-1-10) 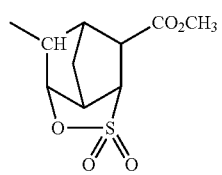
(3-1-11) 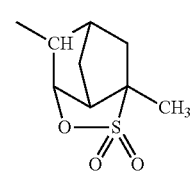
(3-1-12) 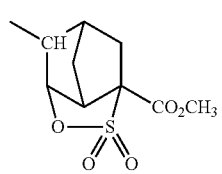
-continued
[Chemical Formula 24]
(3-1-13) 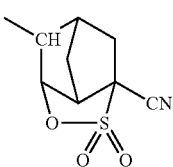
(3-1-14) 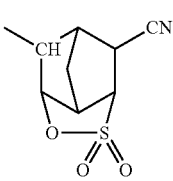
(3-1-15) 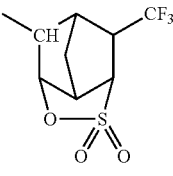
(3-1-16) 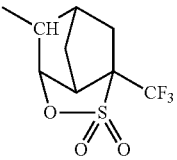
(3-1-17) 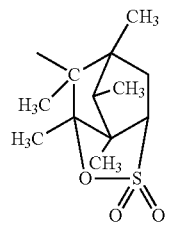
[Chemical Formula 25]
(3-1-18) 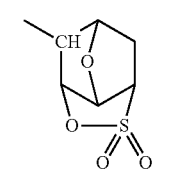
(3-1-19) 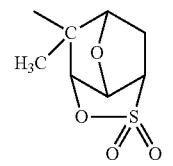
(3-1-20) 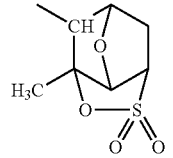

-continued
(3-1-21)
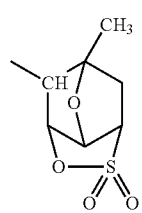
(3-1-22)
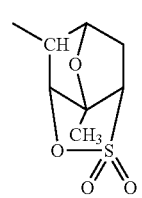
(3-1-23)
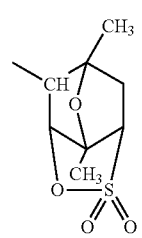
(3-1-24)
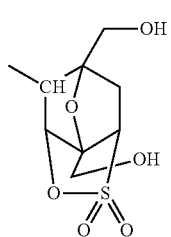
(3-1-25)
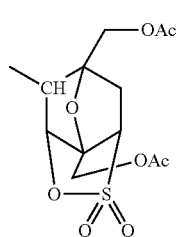
[Chemical Formula 26]
(3-1-26)
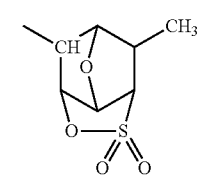
(3-1-27)
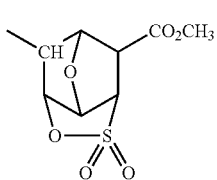
(3-1-28)
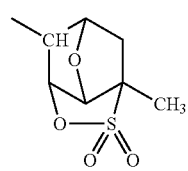
(3-1-29)
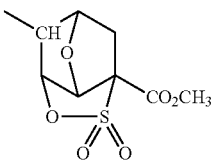
(3-1-30)
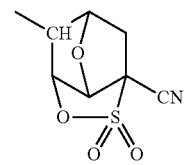
(3-1-31)
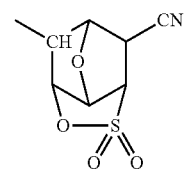
(3-1-32)
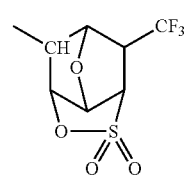
(3-1-33)
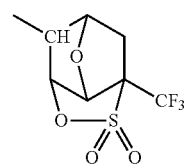
[Chemical Formula 26]
(3-2-1)
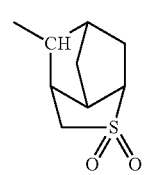
(3-2-2)
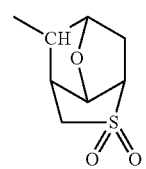
(3-3-1)
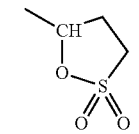

(3-4-1)

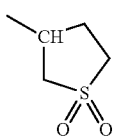

Of the groups shown above, the —SO$_2$-containing cyclic group is preferably a group represented by one of the general formulas (3-1), (3-2) and (3-4), more preferably at least one group selected from the group consisting of groups represented by the above chemical formulas (3-1-1), (3-1-18), (3-3-1) and (3-4-1), and most preferably a group represented by chemical formula (3-1-1).

More specific examples of the structural unit (a2$^S$) include structural units represented by general formula (a2-0) shown below.

[Chemical Formula 28]

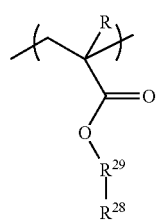

(a2-0)

In the formula, R represents a hydrogen atom, an alkyl group of 1 to 5 carbon atoms or a halogenated alkyl group of 1 to 5 carbon atoms, $R^{28}$ represents an —SO$_2$-containing cyclic group, and $R^{29}$ represents a single bond or a divalent linking group.

In the formula (a2-0), R is the same as defined above.

$R^{28}$ is the same as the —SO$_2$-containing cyclic group described above.

$R^{29}$ may be either a single bond or a divalent linking group. A divalent linking group is preferable in terms of achieving superior effects for the present invention.

There are no particular limitations on the divalent linking group for $R^{29}$, and examples include the same groups as those mentioned above for $Y^2$ in general formula (a1-0-2) within the description relating to the structural unit (a1). Among these groups, an alkylene group or a group containing an ester linkage (—C(=O)—O—) is preferred.

The alkylene group is preferably a linear or branched alkylene group. Specific examples include the same groups as the linear alkylene groups and branched alkylene groups described above for the aliphatic hydrocarbon group for $Y^2$.

As the divalent linking group containing an ester linkage, groups represented by general formula: —R$^{30}$—C(=O)—O— (wherein R$^{30}$ represents a divalent linking group) are preferred. In other words, the structural unit (a2$^S$) is preferably a structural unit represented by general formula (a2-0-1) shown below.

[Chemical Formula 29]

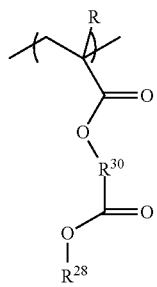

(a2-0-1)

In the formula, R and $R^{28}$ are each the same as defined above, and $R^{30}$ is a divalent linking group.

There are no particular limitations on $R^{30}$, and the same groups as the divalent linking groups mentioned above for $Y^2$ in general formula (a1-0-2) within the description relating to the structural unit (a1) may be used.

As the divalent linking group for $R^{30}$, a linear or branched alkylene group, a divalent alicyclic hydrocarbon group, or a divalent linking group containing a hetero atom is preferred.

Examples of the linear or branched alkylene group, divalent alicyclic hydrocarbon group, and divalent linking group containing a hetero atom include the same linear or branched alkylene groups, divalent alicyclic hydrocarbon groups, and divalent linking groups containing a hetero atom as those described above as preferred groups for $Y^2$.

Of the above groups, a linear or branched alkylene group, or a divalent linking group containing an oxygen atom as a hetero atom is preferred.

As the linear alkylene group, a methylene group or ethylene group is preferred, and a methylene group is particularly desirable.

As the branched alkylene group, an alkylmethylene group or alkylethylene group is preferred, and —CH(CH$_3$)—, —C(CH$_3$)$_2$— or —C(CH$_3$)$_2$CH$_2$— is particularly desirable.

The divalent linking group containing an oxygen atom is preferably a divalent linking group containing an ether linkage or an ester linkage, and is more preferably a group represented by a formula -A-O—B—, -[A-C(=O)—O]$_m$—B— or -A-O—C(=O)—B—. m represents an integer of 1 to 3.

Among these, groups represented by the formula -A-O—C(=O)—B— are preferred, and groups represented by —(CH$_2$)$_c$—O—C(=O)—(CH$_2$)$_d$— are particularly desirable. c represents an integer of 1 to 5, and is preferably 1 or 2. d represents an integer of 1 to 5, and is preferably 1 or 2.

As the structural unit (a2$^S$), a structural unit represented by general formula (a0-1-11) or (a0-1-12) shown below is preferred, and a structural unit represented by formula (a0-1-12) is particularly desirable.

[Chemical Formula 30]

(a0-1-11)

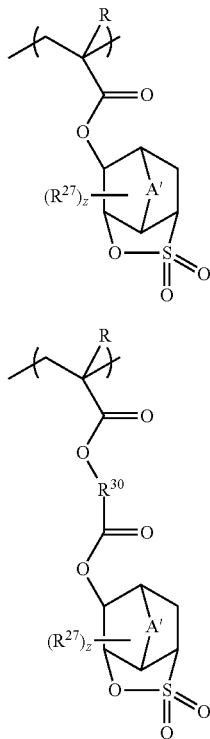

(a0-1-12)

In the formulas, R, A', $R^{27}$, z and $R^{30}$ are each the same as defined above.

In formula (a0-1-11), A' is preferably a methylene group, an oxygen atom (—O—) or a sulfur atom (—S—).

$R^{30}$ is preferably a linear or branched alkylene group, or a divalent linking group containing an oxygen atom. Examples of the linear or branched alkylene group and the divalent linking group containing an oxygen atom for $R^{30}$ include the same linear or branched alkylene groups and divalent linking groups containing an oxygen described above.

As the structural unit represented by formula (a0-1-12), a structural unit represented by general formula (a0-1-12a) or (a0-1-12b) shown below is particularly desirable.

[Chemical Formula 31]

(a0-1-12a)

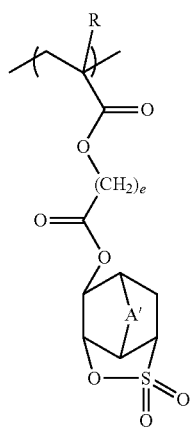

(a0-1-12b)

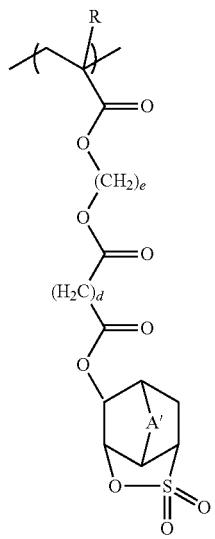

In the formulas, R and A' are each the same as defined above, and each of c to e independently represents an integer of 1 to 3.

Structural Unit ($a2^L$):

The structural unit ($a2^L$) is a structural unit which is derived from an acrylate ester in which the hydrogen atom bonded to the carbon atom on the α-position may be substituted with a substituent, and contains a lactone-containing cyclic group.

In this description, the term "lactone-containing cyclic group" refers to a cyclic group including a ring (lactone ring) containing an —O—C(O)— moiety within the ring skeleton. The lactone ring is counted as the first ring, and a lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

There are no particular limitations on the lactone-containing cyclic group within the structural unit ($a2^L$), and an arbitrary lactone-containing cyclic group may be used. Specific examples of lactone-containing monocyclic groups include groups in which one hydrogen atom has been removed from a 4- to 6-membered lactone ring, including a group in which one hydrogen atom has been removed from β-propiolactone, a group in which one hydrogen atom has been removed from γ-butyrolactone, and a group in which one hydrogen atom has been removed from δ-valerolactone. Further, specific examples of lactone-containing polycyclic groups include groups in which one hydrogen atom has been removed from a lactone ring-containing bicycloalkane, tricycloalkane or tetracycloalkane.

Examples of the structural unit ($a2^L$) include structural units of the above general formula (a2-0) in which $R^{28}$ has been substituted with a lactone-containing cyclic group, and more specific examples include structural units represented by general formulas (a2-1) to (a2-5) shown below.

[Chemical Formula 32]

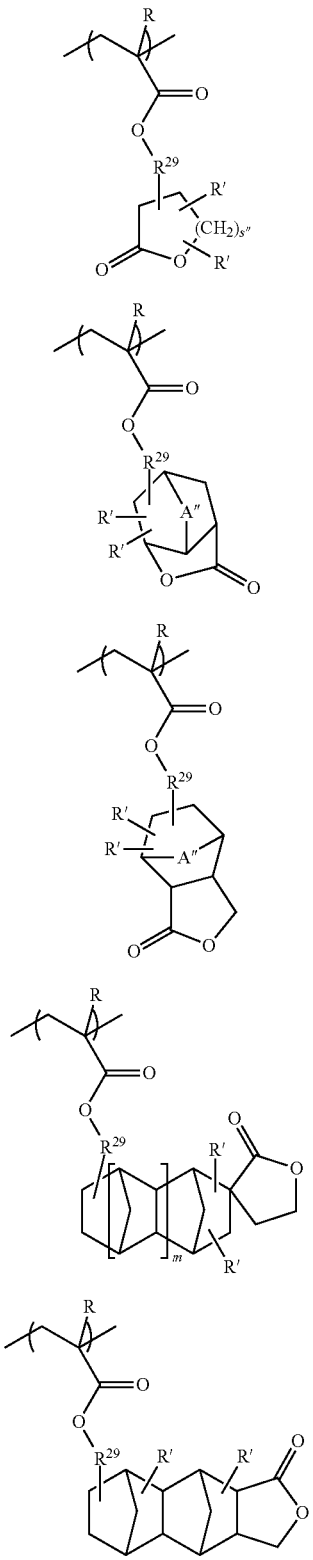

In the formulas, R represents a hydrogen atom, an alkyl group of 1 to 5 carbon atoms or a halogenated alkyl group of 1 to 5 carbon atoms, each R' independently represents a hydrogen atom, an alkyl group of 1 to 5 carbon atoms, an alkoxy group of 1 to 5 carbon atoms or —COOR″, wherein R″ represents a hydrogen atom or an alkyl group, $R^{29}$ represents a single bond or a divalent linking group, s″ represents an integer of 0 to 2, A″ represents an oxygen atom, a sulfur atom or an alkylene group of 1 to 5 carbon atoms which may contain an oxygen atom or a sulfur atom, and m represents 0 or 1.

In general formulas (a2-1) to (a2-5), R is the same as defined above for R in the structural unit (a1).

Examples of the alkyl group of 1 to 5 carbon atoms for R' include a methyl group, ethyl group, propyl group, n-butyl group and tert-butyl group.

Examples of the alkoxy group of 1 to 5 carbon atoms for R' include a methoxy group, ethoxy group, n-propoxy group, iso-propoxy group, n-butoxy group and tert-butoxy group.

The alkyl group for R″ may be a linear, branched or cyclic alkyl group.

When R″ is a linear or branched alkyl group, the alkyl group preferably contains 1 to 10 carbon atoms, and more preferably 1 to 5 carbon atoms.

When R″ is a cyclic alkyl group, the cycloalkyl group preferably contains 3 to 15 carbon atoms, more preferably 4 to 12 carbon atoms, and most preferably 5 to 10 carbon atoms. Examples include groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

In terms of factors such as industrial availability, R' is preferably a hydrogen atom.

Examples of A″ include the same groups as those described above for A' in general formula (3-1). A″ is preferably an alkylene group of 1 to 5 carbon atoms, an oxygen atom (—O—) or a sulfur atom (—S—), and is more preferably an alkylene group of 1 to 5 carbon atoms or —O—. As the alkylene group of 1 to 5 carbon atoms, a methylene group or dimethylmethylene group is preferable, and a methylene group is the most desirable.

$R^{29}$ is the same as defined above for $R^{29}$ in general formula (a2-0).

In formula (a2-1), s″ is preferably 1 or 2.

Specific examples of the structural units represented by general formulas (a2-1) to (a2-5) are shown below. In each of the following formulas, $R^α$ represents a hydrogen atom, a methyl group or a trifluoromethyl group.

[Chemical Formula 33]

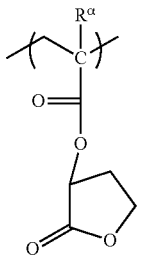

(a2-1-1)

(a2-1-2) 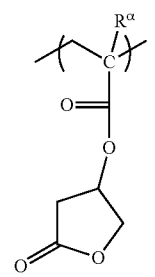
(a2-1-3) 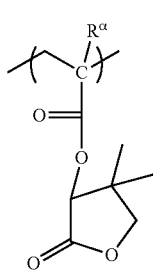
(a2-1-4) 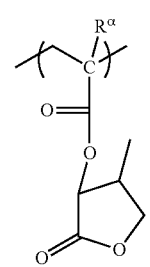
(a2-1-5) 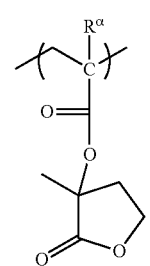
(a2-1-6) 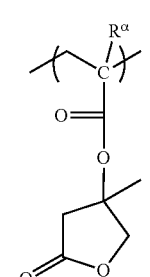
(a2-1-7) 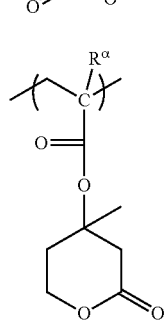
(a2-1-8) 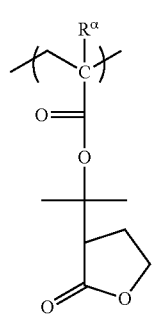
(a2-1-9) 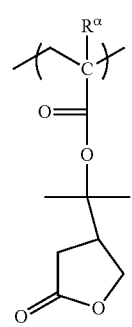
(a2-1-10) 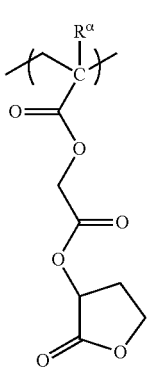
(a2-1-11) 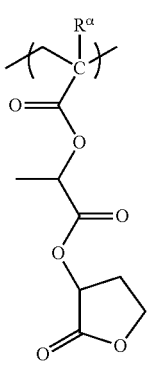

(a2-1-12)
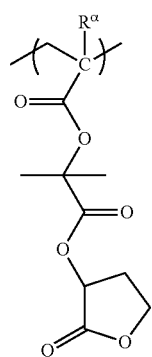
(a2-1-13)
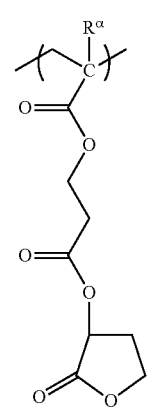
[Chemical Formula 34]
(a2-2-1)
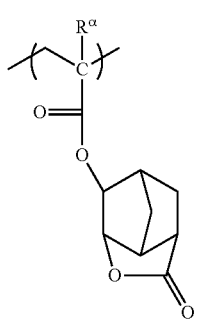
(a2-2-2)
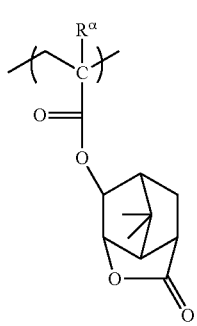
(a2-2-3)
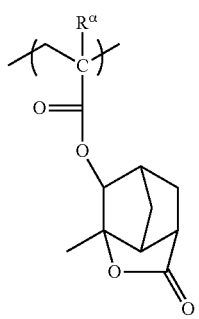
(a2-2-4)
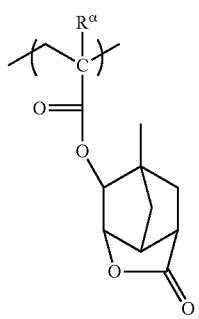
(a2-2-5)
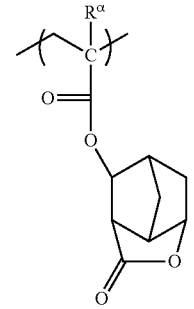
(a2-2-6)
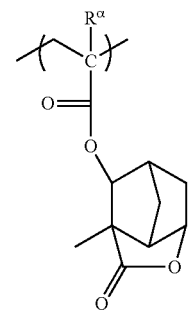
(a2-2-7)
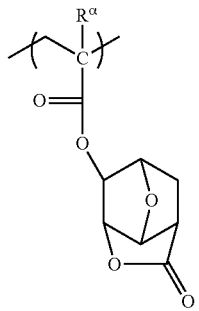

(a2-2-8)
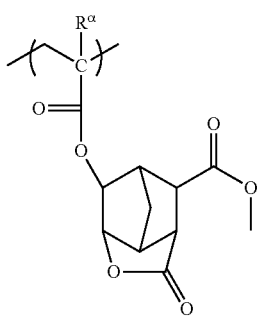
(a2-2-9)
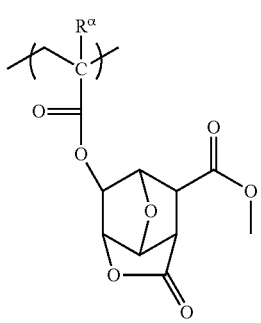
(a2-2-10)
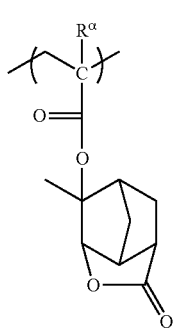
(a2-2-11)
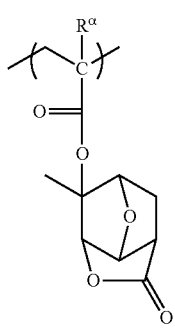
(a2-2-12)
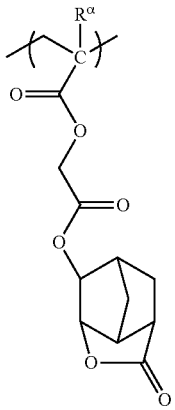
(a2-2-13)
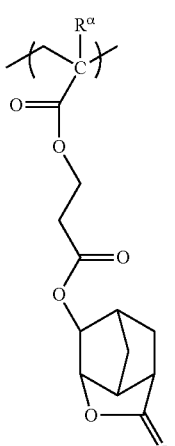
(a2-2-14)
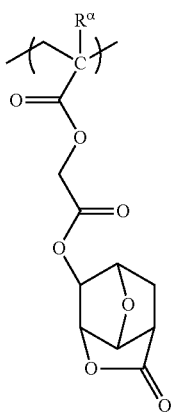

(a2-2-15)
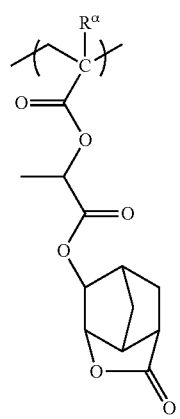
(a2-2-16)
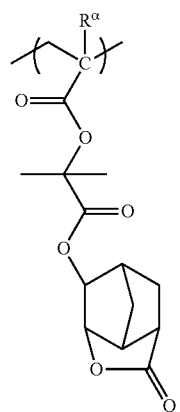
(a2-2-17)
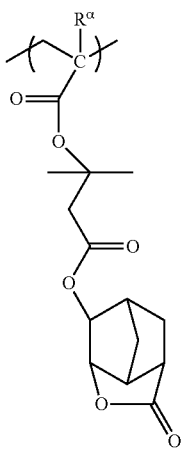
[Chemical Formula 35]
(a2-3-1)
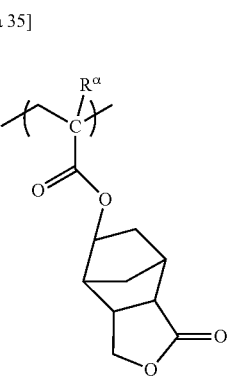
(a2-3-2)
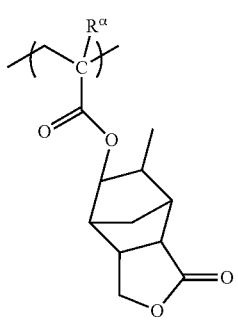
(a2-3-3)
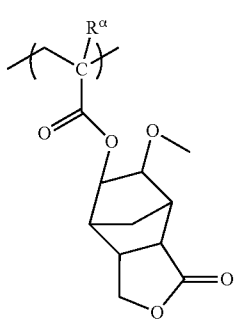
(a2-3-4)
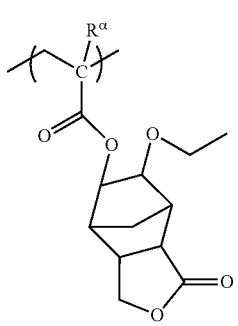
(a2-3-5)
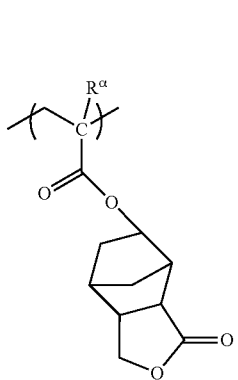
[Chemical Formula 36]
(a2-4-1)
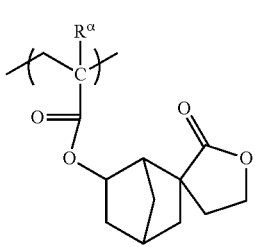

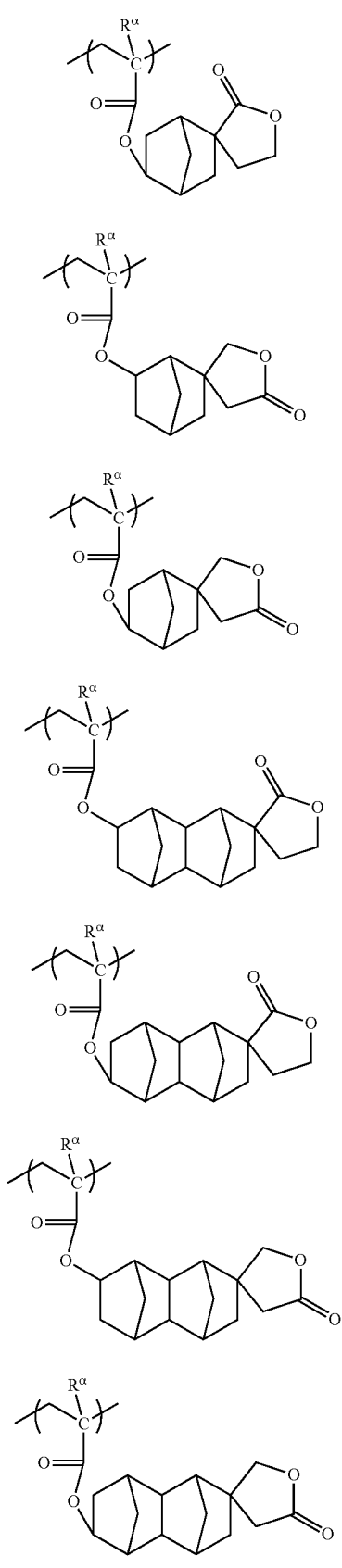
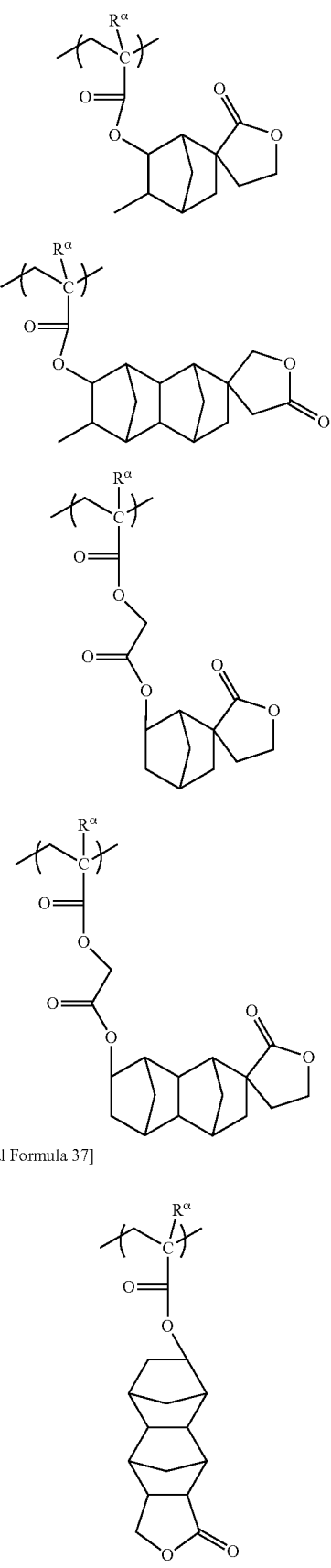
[Chemical Formula 37]

(a2-5-2)
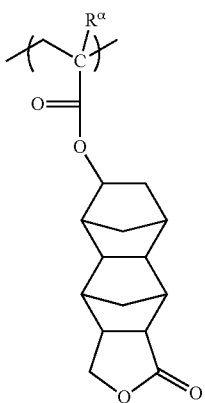

(a2-5-3)
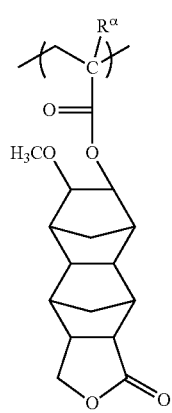

(a2-5-4)
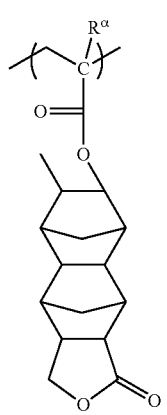

(a2-5-5)
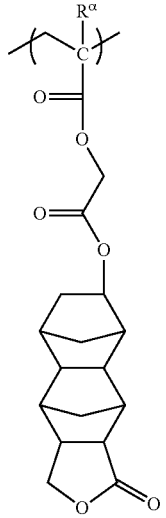

(a2-5-6)

The structural unit (a2$^L$) is preferably at least one structural unit selected from the group consisting of structural units represented by general formulas (a2-1) to (a2-5), is more preferably at least one structural unit selected from the group consisting of structural units represented by general formulas (a2-1) to (a2-3), and is still more preferably at least one structural unit selected from the group consisting of structural units represented by general formulas (a2-1) and (a2-2).

Among these structural units, the structural unit (a2$^L$) is most preferably at least one structural unit selected from the group consisting of structural units represented by the above formulas (a2-1-1), (a2-1-2), (a2-2-1), (a2-2-7), (a2-2-12), (a2-2-14), (a2-3-1) and (a2-3-5).

In the component (A1), as the structural unit (a2), one type of structural unit may be used alone, or two or more types of structural units may be used in combination. For example, as the structural unit (a2), the structural unit (a2$^S$) may be used alone, the structural unit (a2$^L$) may be used alone, or the structural units (a2$^S$) and (a2$^L$) may be used in combination. Further, as the structural unit (a2$^S$) or the structural unit (a2$^L$), one type of structural unit may be used alone, or two or more types of structural units may be used in combination.

In the present invention, in terms of achieving superior effects for the present invention, the structural unit (a2) preferably includes at least the structural unit (a2$^S$).

The amount of the structural unit (a2) within the component (A1), based on the combined total of all the structural units that constitute the component (A1), is preferably within a range from 1 to 80 mol %, more preferably from 10 to 70 mol %, still more preferably from 10 to 65 mol %, and most preferably from 10 to 60 mol %. When the amount of the structural unit (a2) is at least as large as the lower limit of the aforementioned range, the effects achieved be including the structural unit (a2) can be satisfactorily realized. On the other hand, when the amount of the structural unit (a2) is not more than the upper limit of the above range, a good balance can be achieved with the other structural units, and lithography properties such as DOF and CDU and the pattern shape can all be improved.

Structural Unit (a3)

The structural unit (a3) is a structural unit which is derived from an acrylate ester in which the hydrogen atom bonded to the carbon atom on the α-position may be substituted with a substituent, and contains a polar group-containing aliphatic hydrocarbon group.

When the component (A1) includes the structural unit (a3), the hydrophilicity of the component (A) is improved, and hence, the compatibility of the component (A) with the developing solution is improved. As a result, the alkali solubility of the exposed portions improves, which contributes to favorable improvements in the resolution.

Examples of the polar group include a hydroxyl group, cyano group, carboxyl group, or hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (and preferably alkylene groups) of 1 to 10 carbon atoms, and polycyclic aliphatic hydrocarbon groups (polycyclic groups). These polycyclic groups can be selected appropriately from the multitude of groups that have been proposed for the resins of resist compositions designed for use with ArF excimer lasers. The polycyclic group preferably contains 7 to 30 carbon atoms.

Of the various possibilities, structural units derived from an acrylate ester that includes an aliphatic polycyclic group containing a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, or tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 38]

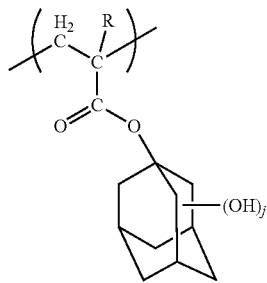
(a3-1)

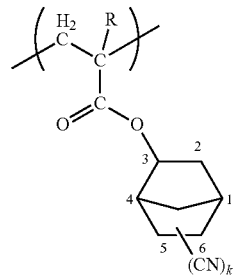
(a3-2)

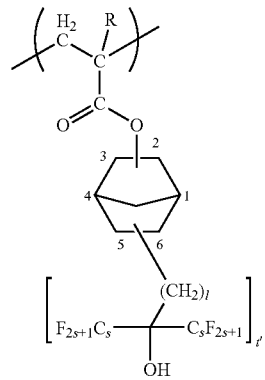
(a3-3)

In the formulas, R is the same as defined above, j is an integer of 1 to 3, k is an integer of 1 to 3, t' is an integer of 1 to 3, l is an integer of 1 to 5, and s is an integer of 1 to 3.

In formula (a3-1), j is preferably 1 or 2, and more preferably 1. When j is 2, it is preferable that the hydroxyl groups are bonded to the 3rd and 5th positions of the adamantyl group. When j is 1, it is preferable that the hydroxyl group is bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, in formula (a3-3), it is preferable that a 2-norbornyl group or 3-norbornyl group is bonded to the terminal of the carboxyl group of the acrylic acid. The fluorinated alkyl alcohol is preferably bonded to the 5th or 6th position of the norbornyl group.

In the component (A1), as the structural unit (a3), one type of structural unit may be used, or two or more types may be used in combination.

The amount of the structural unit (a3) within the component (A1), based on the combined total of all the structural units that constitute the component (A1), is preferably within a range from 5 to 50 mol %, more preferably from 5 to 40 mol %, and still more preferably from 5 to 25 mol %. When the amount of the structural unit (a3) is at least as large as the lower limit of the aforementioned range, the effect of using the structural unit (a3) can be satisfactorily achieved. On the other hand, when the amount of the structural unit (a3) is not more than the upper limit of the above range, a good balance can be achieved with the other structural units.

Structural Unit (a4)

The component (A1) may also include a structural unit (a4) which is other than the aforementioned structural units (a1) to (a3), as long as the effects of the present invention are not impaired.

As the structural unit (a4), any other structural unit which cannot be classified as one of the above structural units (a1) to (a3) can be used without any particular limitations, and any of the multitude of conventional structural units used within resist resins for ArF excimer lasers or KrF excimer lasers (and particularly for ArF excimer lasers) can be used.

Preferred examples of the structural unit (a4) include structural units derived from an acrylate ester in which the hydrogen atom bonded to the carbon atom on the α-position may be substituted with a substituent and contains a non-acid-dissociable aliphatic polycyclic group. Examples of the polycyclic group include the same groups as those described above in connection with the structural unit (a1), and any of the multitude of conventional polycyclic groups used within the resin component of resist compositions for ArF excimer lasers or KrF excimer lasers (and particularly for ArF excimer lasers) can be used.

In consideration of industrial availability and the like, at least one polycyclic group selected from among a tricyclodecyl group, adamantyl group, tetracyclododecyl group, isobornyl group and norbornyl group is particularly desirable. These polycyclic groups may also include a linear or branched alkyl group of 1 to 5 carbon atoms as a substituent.

Specific examples of the structural unit (a4) include units with structures represented by general formulas (a-4-1) to (a-4-5) shown below.

[Chemical Formula 39]

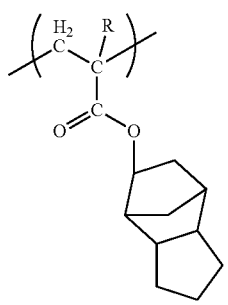

(a4-1)

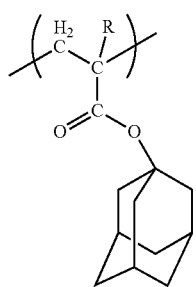

(a4-2)

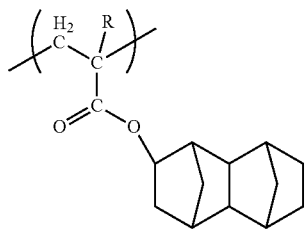

(a4-3)

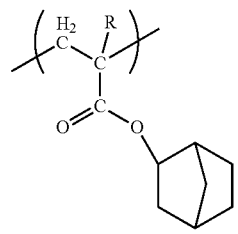

(a4-4)

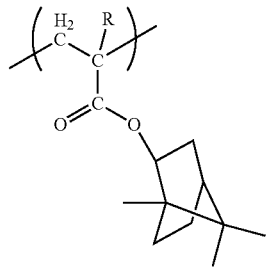

(a4-5)

In the formulas, R is the same as defined above.

When the structural unit (a4) is included in the component (A1), the amount of the structural unit (a4), based on the combined total of all the structural units that constitute the component (A1), is preferably within the range from 1 to 30 mol %, and more preferably from 10 to 20 mol %.

In the resist composition of the present invention, the component (A1) is preferably a polymeric compound containing the structural unit (a1).

Examples of the component (A1) include:

a copolymer consisting of the structural units (a1), (a2) and (a3), a copolymer consisting of the structural units (a1), (a2), (a3) and (a4), a copolymer consisting of the structural units (a1) and (a2), and a copolymer consisting of the structural units (a1) and (a3).

In the component (A), as the component (A1), one type of component may be used alone, or two or more types may be used in combination.

In the present invention, as the component (A1), a polymeric compound that includes a combination of structural units such as the combinations shown below is particularly desirable.

[Chemical Formula 40]

(A1-10)

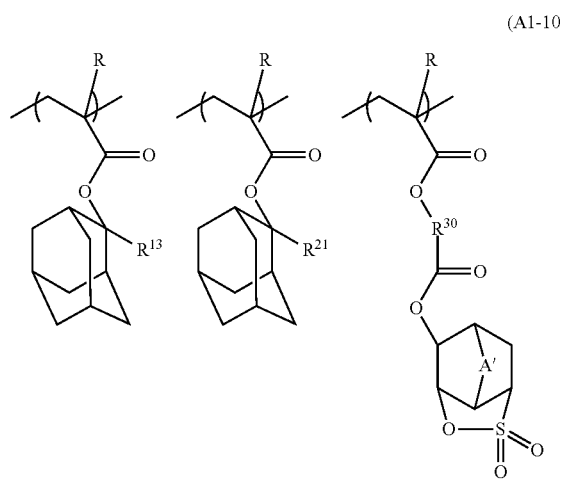

In the formula, $R^{13}$ represents a branched alkyl group of 3 or more carbon atoms, R, $R^{30}$, A' and $R^{21}$ are each the same as defined above, and the plurality of R groups may be the same or different from each other.

[Chemical Formula 41]

(A1-11)

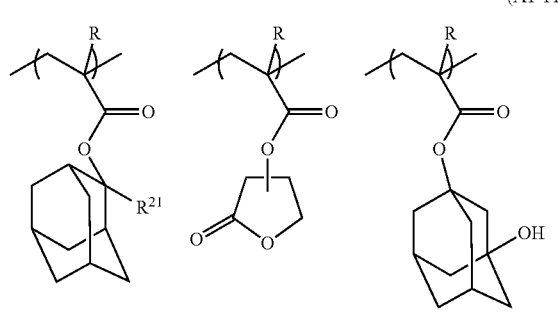

In the formula, R and $R^{21}$ are each the same as defined above, and the plurality of R groups may be the same or different from each other.

In the formula (A1-11), The lower alkyl group for $R^{21}$ is the same as the lower alkyl group defined for R, and is preferably a methyl group or an ethyl group.

[Chemical Formula 42]

(A1-12)

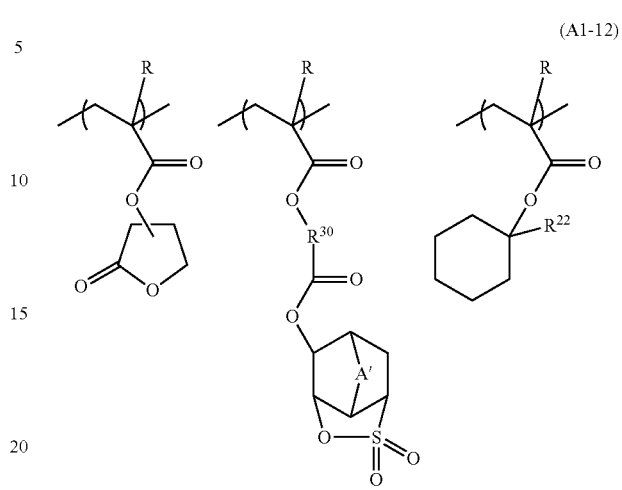

In the formula, R, $R^{30}$, A', $R^{21}$ and $R^{22}$ are each the same as defined above, and the plurality of R groups may be the same or different from each other.

[Chemical Formula 43]

(A1-13)

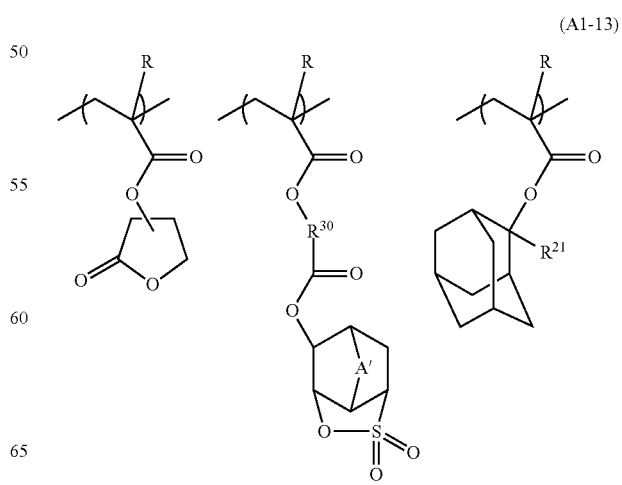

-continued

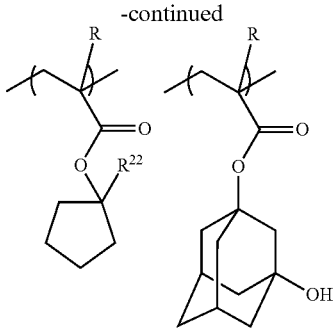

In the formula, R, $R^{30}$, A', $R^{21}$ and $R^{22}$ are each the same as defined above, and the plurality of R groups may be the same or different from each other.

[Chemical Formula 44]

(A1-14)

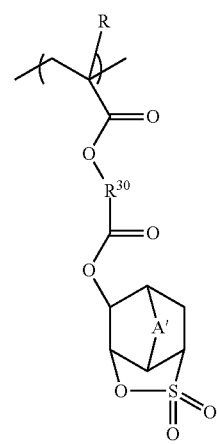

In the formula, R, $R^{30}$, A' and $R^{21}$ are each the same as defined above, and the plurality of R groups may be the same or different from each other.

[Chemical Formula 45]

(A1-15)

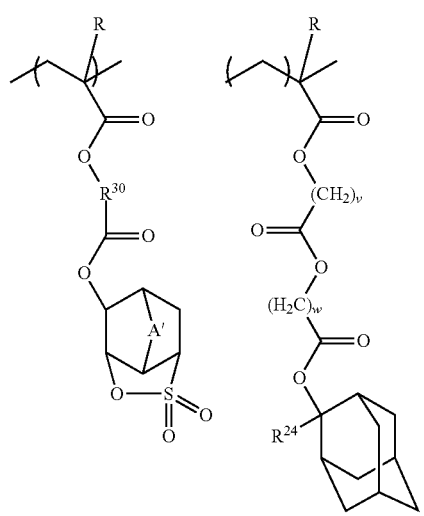

-continued

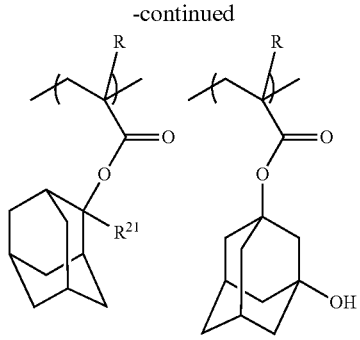

In the formula, R, $R^{30}$, A', $R^{24}$, v, w and $R^{21}$ are each the same as defined above, and the plurality of R groups may be the same or different from each other.

[Chemical Formula 46]

(A1-16)

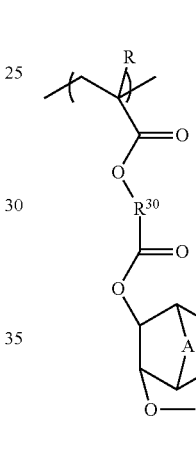

In the formula, R, $R^{30}$, A' and $R^{21}$ are each the same as defined above, and the plurality of R groups may be the same or different from each other.

[Chemical Formula 47]

(A1-17)

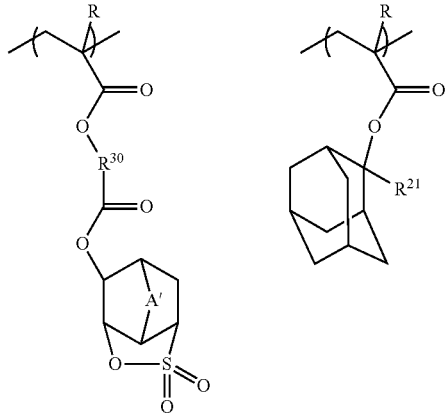

-continued

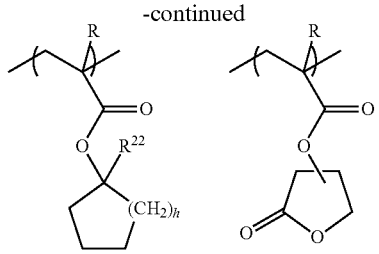

In the formula, R, $R^{30}$, A', $R^{21}$, $R^{22}$ and h are each the same as defined above, and the plurality of R groups may be the same or different from each other.

[Chemical Formula 48]

(A1-18)

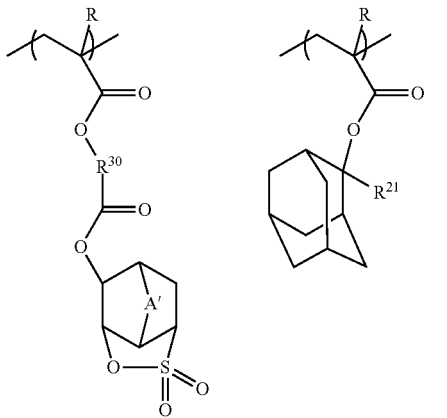

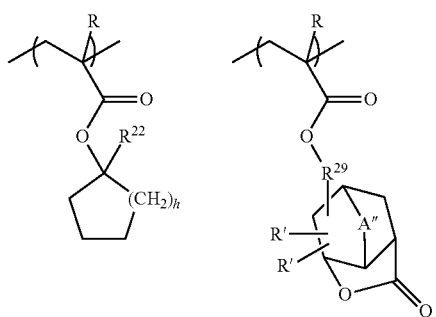

In the formula, R, $R^{30}$, A', $R^{21}$, $R^{22}$, h, $R^{29}$, A" and R' are each the same as defined above, and the plurality of R groups may be the same or different from each other.

The component (A1) can be obtained, for example, by a conventional radical polymerization or the like of the monomers corresponding with each of the structural units, using a radical polymerization initiator such as azobisisobutyronitrile (AIBN).

Furthermore, in the component (A1), by using a chain transfer agent such as HS—$CH_2$—$CH_2$—$CH_2$—$C(CF_3)_2$—OH, a —$C(CF_3)_2$—OH group can be introduced at the terminals of the component (A1). Such a copolymer having an introduced hydroxyalkyl group in which part of the hydrogen atoms of the alkyl group are substituted with fluorine atoms is effective in reducing developing defects and LER (line edge roughness: unevenness of the side walls of a line pattern).

The weight-average molecular weight (Mw) (the polystyrene equivalent value determined by gel permeation chromatography) of the component (A1) is not particularly limited, but is preferably within a range from 1,000 to 50,000, more preferably from 1,500 to 30,000, and most preferably from 2,500 to 20,000. When the weight-average molecular weight is not more than the upper limit of the aforementioned range, the resist composition exhibits satisfactory solubility in a resist solvent. On the other hand, when the weight-average molecular weight is at least as large as the lower limit of the above-mentioned range, dry etching resistance and the cross-sectional shape of the resist pattern are improved.

Further, the dispersity (Mw/Mn) of the component (A1) is preferably from 1.0 to 5.0, more preferably from 1.0 to 3.0, and most preferably from 1.0 to 2.5. Here, Mn is the number average molecular weight.

In the resist composition of the present invention, the component (A) may contain "a base component which exhibits changed solubility in an alkali developing solution under the action of acid" other than the component (A1).

There are no particular limitations on this base component other than the component (A1), and any of the multitude of conventional base components used within chemically amplified resist compositions (such as a novolak resin, a polyhydroxystyrene-based resin (PHS), or a low molecular weight component (component (A2))) can be appropriately selected for use.

Examples of the component (A2) include low molecular weight compounds that have a molecular weight of at least 500 and less than 4,000, contain a hydrophilic group, and also contain an acid-dissociable group described above in connection with the component (A1). Specific examples of the low molecular weight compound include compounds containing a plurality of phenol skeletons in which a portion of the hydrogen atoms within hydroxyl groups have been substituted with the aforementioned acid-dissociable groups.

In the resist composition of the present invention, as the component (A), one type of component may be used alone, or two or more types of compounds may be used in combination.

In the component (A), the amount of the component (A1), based on the total weight of the component (A), is preferably at least 25% by weight, more preferably 50% by weight or more, still more preferably 75% by weight or more, and may even be 100% by weight. When the amount of the component (A1) is at least 25% by weight, a resist pattern exhibiting high resolution and a high rectangularity can be more readily formed.

In the resist composition of the present invention, the amount of the component (A) can be adjusted appropriately depending on factors such as the thickness of the resist film that is to be formed.

<Component (B)>

In the resist composition of the present invention, the component (B) includes an acid generator (B1) containing a compound represented by general formula (b1-1) shown below (hereinafter this acid generator (B1) is referred to as "component (B1)").

[Chemical Formula 49]

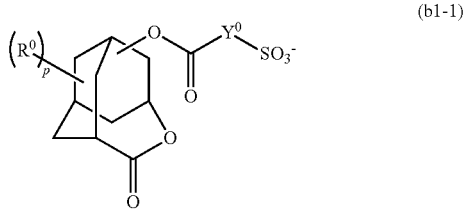

(b1-1)

In the formula, $Y^0$ represents an alkylene group of 1 to 4 carbon atoms which may have a substituent, $R^0$ represents an alkyl group, alkoxy group, halogen atom, halogenated alkyl group, hydroxy group or oxygen atom (=O), p represents 0 or 1, and $Z^+$ represents an organic cation.

Anion Moiety of Component (B1)

In formula (b1-1), $Y^0$ represents an alkylene group of 1 to 4 carbon atoms which may have a substituent.

The alkylene group for $Y^0$ is preferably a linear or branched alkylene group, and preferably the alkylene group preferably has 1 to 3 carbon atoms.

Examples of the alkylene group of 1 to 4 carbon atoms having a substituent include groups in which part or all of the hydrogen atoms with an aforementioned alkylene group for $Y^0$ have each been substituted with fluorine atom.

Specific examples of $Y^0$ include —$CF_2$—, —$CF_2CF_2$—, —$CF_2CF_2CF_2$—, —$CF(CF_3)CF_2$—, —$CF(CF_2CF_3)$—, —$C(CF_3)_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CF(CF_2CF_2CF_3)$—, —$C(CF_3)(CF_2CF_3)$—, —CHF—, —$CH_2CF_2$—, —$CH_2CH_2CF_2$—, —$CH_2CF_2CF_2$—, —$CH(CF_3)CH_2$—, —$CH(CF_2CF_3)$—, —$C(CH_3)(CF_3)$—, —$CH_2CH_2CH_2CF_2$—, —$CH_2CH_2CF_2CF_2$—, —$CH(CF_3)CH_2CH_2$—, —$CH_2CH(CF_3)CH_2$—, —$CH(CF_3)CH(CF_3)$—, —$C(CF_3)_2CH_2$—, —$CH_2$—, —$CH_2CH_2$—, —$CH_2CH_2CH_2$—, —$CH(CH_3)CH_2$—, —$CH(CH_2CH_3)$—, —$C(CH_3)_2$—, —$CH_2CH_2CH_2CH_2$—, —$CH(CH_3)CH_2CH_2$—, —$CH_2CH(CH_3)CH_2$—, —$CH(CH_3)CH(CH_3)$—, —$C(CH_3)_2CH_2$—, —$CH(CH_2CH_3)CH_2$—, —$CH(CH_2CH_2CH_3)$—, —$C(CH_3)(CH_2CH_3)$— and $CH(CH_3)$).

$Y^0$ is preferably a fluorinated alkylene group, and particularly preferably a fluorinated alkylene group in which the carbon atom bonded to the adjacent sulfur atom is fluorinated. In such a case, an acid having a strong acid strength is generated from the component (B1) upon exposure. As a result, the resolution and the shape of the resist pattern formed can be improved. Further, the lithographic properties are further improved.

Examples of such fluorinated alkylene groups include —$CF_2$—, —$CF_2CF_2$—, —$CF_2CF_2CF_2$—, —$CF(CF_3)CF_2$—, —$CF_2CF_2CF_2CF_2$—, —$CF(CF_3)CF_2CF_2$—, —$CF_2CF(CF_3)CF_2$—, —$CF(CF_3)CF(CF_3)$—, —$C(CF_3)_2CF_2$—, —$CF(CF_2CF_3)CF_2$—, —$CH_2CF_2$—, —$CH_2CH_2CF_2$—, —$CH_2CF_2CF_2$—, —$CH_2CH_2CH_2CF_2$—, —$CH_2CH_2CF_2CF_2$—, and —$CH_2CF_2CF_2CF_2$—.

Of these, —$CF_2$—, —$CF_2CF_2$—, —$CF_2CF_2CF_2$— or $CH_2CF_2CF_2$— is preferable, —$CF_2$—, —$CF_2CF_2$— or —$CF_2CF_2CF_2$— is more preferable, and —$CF_2$— is particularly desirable in terms of achieving the effects of the present invention.

The alkylene group or fluorinated alkylene group may have a substituent.

The expression that the alkylene group or fluorinated alkylene group "may have a substituent" means that part or all of the hydrogen atoms or fluorine atoms in the alkylene group or fluorinated alkylene group may each be substituted with an atom or group other than a hydrogen atom or fluorine atom.

Examples of substituents for the alkylene group or fluorinated alkylene group include an alkoxy group of 1 to 4 carbon atoms, and a hydroxyl group.

In formula (b1-1), $R^0$ represents an alkyl group, alkoxy group, halogen atom, halogenated alkyl group, hydroxy group or oxygen atom (=O)

The alkyl group for $R^0$ is preferably an alkyl group of 1 to 5 carbon atoms, and more preferably a methyl group, ethyl group, propyl group, n-butyl group or tert-butyl group.

The alkoxy group for $R^0$ is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom for $R^0$ include a fluorine atom, chlorine atom, bromine atom and iodine atom, and a fluorine atom is preferable.

Examples of the halogenated alkyl group for $R^0$ include groups in which part or all of the hydrogen atoms within an aforementioned alkyl group for $R^0$ have each been substituted with an aforementioned halogen atom.

In formula (b1-1), p represents 0 or 1, and is preferably 0.

Specific examples of the anion moiety of the component (B1) are shown below.

[Chemical Formula 50]

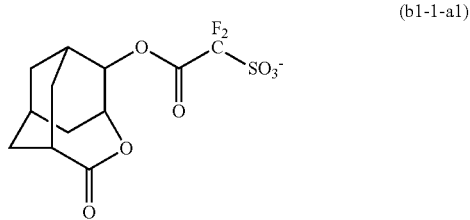

(b1-1-a1)

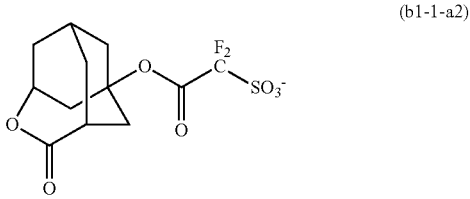

(b1-1-a2)

Cation Moiety of Component (B1)

In general formula (b1-1), there are no particular limitations on the organic cation for $Z^+$, and any of the cation moieties of conventional onium salt acid generators can be appropriately selected for use.

As the cation moiety, a sulfonium ion or an iodonium ion is preferable, and a sulfonium ion is particularly desirable.

Examples of preferred organic cations for $Z^+$ include organic cations represented by general formula (b1-c1) and general formula (b1-c2) shown below.

[Chemical Formula 51]

In the above formulas, each of $R^{1\prime\prime}$ to $R^{3\prime\prime}$, $R^{5\prime\prime}$ and $R^{6\prime\prime}$ independently represents an aryl group alkyl group or an alkenyl group which may have a substituent, provided that at least one of $R^{1\prime\prime}$ to $R^{3\prime\prime}$ represents an aryl group, and at least one of $R^{5\prime\prime}$ and $R^{6\prime\prime}$ represents an aryl group. Two of $R^{1\prime\prime}$ to $R^{3\prime\prime}$ in formula (b1-c1) may be mutually bonded to form a ring together with the sulfur atom in the formula.

In formula (b1-c1), each of $R^{1\prime\prime}$ to $R^{3\prime\prime}$ independently represents an aryl group, alkyl group or alkenyl group which may have a substituent. Two of $R^{1\prime\prime}$ to $R^{3\prime\prime}$ may be mutually bonded to form a ring together with the sulfur atom in the formula.

Further, among $R^{1\prime\prime}$ to $R^{3\prime\prime}$, at least one group represents an aryl group. Among $R^{1\prime\prime}$ to $R^{3\prime\prime}$, two or more groups are preferably aryl groups, and it is particularly desirable that all of $R^{1\prime\prime}$ to $R^{3\prime\prime}$ are aryl groups.

Examples of the aryl group for $R^{1\prime\prime}$ to $R^{3\prime\prime}$ include an unsubstituted aryl group of 6 to 20 carbon atoms, a substituted aryl group in which part or all of the hydrogen atoms of the aforementioned unsubstituted aryl group have each been substituted with an alkyl group, alkoxy group, alkoxyalkyloxy group, alkoxycarbonylalkyloxy group, halogen atom, hydroxy group, oxo group (=O), aryl group, —C(=O)—O—$R^{6\prime}$, —O—C(=O)—$R^{7\prime}$ or —O—$R^{8\prime}$.

Each of $R^{6\prime}$, $R^{7\prime}$ and $R^{8\prime}$ independently represents a linear or branched saturated hydrocarbon group of 1 to 25 atoms, a cyclic saturated hydrocarbon group of 3 to 20 carbon atoms, or a linear or branched aliphatic unsaturated hydrocarbon group of 2 to 5 carbon atoms.

The linear or branched saturated hydrocarbon group preferably has 1 to 25 carbon atoms, more preferably 1 to 15 carbon atoms, and still more preferably 4 to 10 carbon atoms.

Examples of the linear saturated hydrocarbon group include a methyl group, ethyl group, propyl group, butyl group, pentyl group, hexyl group, heptyl group, octyl group, nonyl group and decyl group.

Examples of the branched saturated hydrocarbon group, excluding tertiary alkyl groups, include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The linear or branched saturated hydrocarbon group may have a substituent. Examples of the substituent include an alkoxy group, halogen atom, halogenated alkyl group, hydroxyl group, oxygen atom (=O), cyano group and carboxyl group.

The alkoxy group as the substituent for the linear or branched saturated hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the linear or branched saturated hydrocarbon group include a fluorine atom, chlorine atom, bromine atom and iodine atom, and a fluorine atom is preferable.

Examples of the halogenated alkyl group as the substituent for the linear or branched saturated hydrocarbon group include groups in which part or all of the hydrogen atoms within an aforementioned alkyl group described as a substituent for the linear or branched saturated hydrocarbon group have each been substituted with an aforementioned halogen atom.

The cyclic saturated hydrocarbon group of 3 to 20 carbon atoms for $R^{6\prime}$, $R^{7\prime}$ and $R^{8\prime}$ may be either a polycyclic group or a monocyclic group, and examples thereof include groups in which one hydrogen atom has been removed from a monocycloalkane, and groups in which one hydrogen atom has been removed from a polycycloalkane (such as a bicycloalkane, a tricycloalkane or a tetracycloalkane). More specific examples include groups in which one hydrogen atom has been removed from a monocycloalkane such as cyclopentane, cyclohexane, cycloheptane or cyclooctane, and groups in which one or more hydrogen atoms have been removed from a polycycloalkane such as adamantane, norbornane, isobornane, tricyclodecane or tetracyclododecane.

The cyclic saturated hydrocarbon group may have a substituent. For example, part of the carbon atoms that constitute a ring within the cyclic alkyl group may be substituted with a hetero atom, or a hydrogen atom bonded to the ring within the cyclic alkyl group may be substituted with a substituent.

Examples of the former case include groups in which one or more hydrogen atoms have been removed from a heterocycloalkane in which part of the carbon atoms that constitute the ring(s) of an aforementioned monocycloalkane or a polycycloalkane have been substituted with a hetero atom such as an oxygen atom, sulfur atom or nitrogen atom. Further, the ring may contain an ester linkage (—C(=O)—O—). More specific examples include a lactone-containing monocyclic group, such as a group in which one hydrogen atom has been removed from γ-butyrolactone, and a lactone-containing polycyclic group, such as a group in which one hydrogen atom has been removed from a bicycloalkane, tricycloalkane or tetracycloalkane containing a lactone ring.

In the latter case, examples of the substituent include the same substituents as those described above for the linear or branched saturated hydrocarbon group.

Alternatively, $R^{6\prime}$, $R^{7\prime}$ and $R^{8\prime}$ may be a combination of a linear or branched alkyl group and a cyclic group.

Examples of the combination of a linear or branched alkyl group with a cyclic alkyl group include groups in which a cyclic alkyl group is bonded as a substituent to a linear or branched alkyl group, and groups in which a linear or branched alkyl group is bonded as a substituent to a cyclic alkyl group.

Examples of the linear aliphatic unsaturated hydrocarbon group for $R^{6\prime}$, $R^{7\prime}$ and $R^{8\prime}$ include a vinyl group, a propenyl group (an allyl group) and a butynyl group.

Examples of the branched aliphatic unsaturated hydrocarbon group for $R^{6\prime}$, $R^{7\prime}$ and $R^{8\prime}$ include a 1-methylpropenyl group and a 2-methylpropenyl group.

The aforementioned linear or branched aliphatic unsaturated hydrocarbon group may have a substituent. Examples of substituents include the same substituents as those described above for the linear or branched saturated hydrocarbon group.

Among the aforementioned examples, each of $R^{7'}$ and $R^{8'}$ is preferably a linear or branched saturated hydrocarbon group of 1 to 15 carbon atoms, or a cyclic saturated hydrocarbon group of 3 to 20 carbon atoms, as such groups yield superior lithography properties and resist pattern shape.

The unsubstituted aryl group for $R^{1'''}$ to $R^{3'''}$ is preferably an aryl group having 6 to 10 carbon atoms because such groups can be synthesized at a low cost. Specific examples include a phenyl group and a naphthyl group.

The alkyl group as the substituent for the substituted aryl group for $R^{1'''}$ to $R^{3'''}$ is preferably an alkyl group having 1 to 5 carbon atoms, and most preferably a methyl group, ethyl group, propyl group, n-butyl group, or tert-butyl group.

The alkoxy group as the substituent for the substituted aryl group is preferably an alkoxy group having 1 to 5 carbon atoms, and most preferably a methoxy group, ethoxy group, n-propoxy group, iso-propoxy group, n-butoxy group or tert-butoxy group.

The halogen atom as the substituent for the substituted aryl group is preferably a fluorine atom.

Examples of the aryl group as the substituent for the substituted aryl group include the same aryl groups as those described above for $R^{1'''}$ to $R^{3'''}$, and of these, aryl groups of 6 to 20 carbon atoms are preferred, aryl groups of 6 to 10 carbon atoms are more preferred, and a phenyl group or naphthyl group is particularly desirable.

Examples of the alkoxyalkyloxy group as the substituent for the substituted aryl group include groups represented by a general formula shown below.

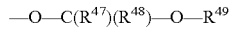

—O—C($R^{47}$)($R^{48}$)—O—$R^{49}$

In the formula, each of $R^{47}$ and $R^{48}$ independently represents a hydrogen atom or a linear or branched alkyl group, and $R^{49}$ represents an alkyl group.

The alkyl group for $R^{47}$ and $R^{48}$ preferably has 1 to 5 carbon atoms, and may be either linear or branched. As the alkyl group, an ethyl group or a methyl group is preferable, and a methyl group is most preferable.

It is preferable that at least one of $R^{47}$ and $R^{48}$ is a hydrogen atom. It is particularly desirable that at least one of $R^{47}$ and $R^{48}$ is a hydrogen atom, and the other is a hydrogen atom or a methyl group.

The alkyl group for $R^{49}$ preferably has 1 to 15 carbon atoms, and may be linear, branched or cyclic.

The linear or branched alkyl group for $R^{49}$ preferably has 1 to 5 carbon atoms, and specific examples include a methyl group, ethyl group, propyl group, n-butyl group and tert-butyl group.

The cyclic alkyl group for $R^{49}$ preferably has 4 to 15 carbon atoms, more preferably 4 to 12 carbon atoms, and most preferably 5 to 10 carbon atoms. Specific examples thereof include groups in which one or more hydrogen atoms have been removed from a monocycloalkane or a polycycloalkane such as a bicycloalkane, tricycloalkane or tetracycloalkane, which may or may not be substituted with an alkyl group of 1 to 5 carbon atoms, a fluorine atom or a fluorinated alkyl group of 1 to 5 carbon atoms. Examples of the monocycloalkane include cyclopentane and cyclohexane. Examples of polycycloalkanes include adamantane, norbornane, isobornane, tricyclodecane and tetracyclododecane. Among these, a group in which one or more hydrogen atoms have been removed from adamantane is preferable.

Examples of the alkoxycarbonylalkyloxy group as the substituent for the substituted aryl group include groups represented by a general formula shown below.

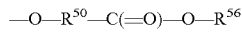

—O—$R^{50}$—C(=O)—O—$R^{56}$

In the formula, $R^{50}$ represents a linear or branched alkylene group, and $R^{56}$ represents a tertiary alkyl group.

The linear or branched alkylene group for $R^{50}$ preferably has 1 to 5 carbon atoms, and examples thereof include a methylene group, ethylene group, trimethylene group, tetramethylene group and 1,1-dimethylethylene group.

Examples of the tertiary alkyl group for $R^{56}$ include a 2-methyl-2-adamantyl group, 2-ethyl-2-adamantyl group, 1-methyl-1-cyclopentyl group, 1-ethyl-1-cyclopentyl group, 1-methyl-1-cyclohexyl group, 1-ethyl-1-cyclohexyl group, 1-(1-adamantyl)-1-methylethyl group, 1-(1-adamantyl)-1-methylpropyl group, 1-(1-adamantyl)-1-methylbutyl group, 1-(1-adamantyl)-1-methylpentyl group, 1-(1-cyclopentyl)-1-methylethyl group, 1-(1-cyclopentyl)-1-methylpropyl group, 1-(1-cyclopentyl)-1-methylbutyl group, 1-(1-cyclopentyl)-1-methylpentyl group, 1-(1-cyclohexyl)-1-methylethyl group, 1-(1-cyclohexyl)-1-methylpropyl group, 1-(1-cyclohexyl)-1-methylbutyl group, 1-(1-cyclohexyl)-1-methylpentyl group, tert-butyl group, tert-pentyl group and a tert-hexyl group.

Further, a group in which $R^{56}$ in the group represented by the aforementioned general formula: —O—$R^{59}$—C(=O)—O—$R^{56}$ has been substituted with $R^{56'}$ can also be mentioned. $R^{56'}$ represents a hydrogen atom, a fluorinated alkyl group or an aliphatic cyclic group which may contain a hetero atom.

Examples of the fluorinated alkyl group for $R^{56'}$ include groups in which part or all of the hydrogen atoms within an aforementioned alkyl group for $R^{49}$ have each been substituted with a fluorine atom.

Examples of the aliphatic cyclic group for $R^{56'}$ which may contain a hetero atom include an aliphatic cyclic group which does not contain a hetero atom, an aliphatic cyclic group containing a hetero atom in the ring structure, and an aliphatic cyclic group in which a hydrogen atom has been substituted with a hetero atom.

Examples of the aliphatic cyclic group for $R^{56'}$ which does not contain a hetero atom include groups in which one or more hydrogen atoms have been removed from a monocycloalkane or a polycycloalkane such as a bicycloalkane, tricycloalkane or a tetracycloalkane. Examples of the monocycloalkane include cyclopentane and cyclohexane. Examples of the polycycloalkane include adamantane, norbornane, isobornane, tricyclodecane and tetracyclododecane. Among these, a group in which one or more hydrogen atoms have been removed from adamantane is preferable.

Specific examples of the aliphatic cyclic group for $R^{56'}$ containing a hetero atom in the ring structure include groups represented by formulas (L1) to (L5) and (S1) to (S4) described later in this description.

Examples of the aliphatic cyclic group for $R^{56'}$ in which a hydrogen atom has been substituted with a hetero atom include an aliphatic cyclic group in which two hydrogen atoms within the aliphatic cyclic group have been substituted with an oxygen atom (=O).

The aryl group for each of $R^{1'''}$ to $R^{3'''}$ is preferably a phenyl group or a naphthyl group.

Examples of the alkyl group for $R^{1'''}$ to $R^{3'''}$ include linear, branched or cyclic alkyl groups of 1 to 10 carbon atoms. In terms of achieving excellent resolution, the alkyl group preferably has 1 to 5 carbon atoms. Specific examples include a methyl group, ethyl group, n-propyl group, iso-propyl group, n-butyl group, isobutyl group, n-pentyl group, cyclopentyl group, hexyl group, cyclohexyl group, nonyl group and decyl group. A methyl group is most preferable because it yields excellent resolution and enables synthesis to be conducted at a low cost.

The alkenyl group for $R^{1\prime\prime}$ to $R^{3\prime\prime}$ preferably has 2 to 10 carbon atoms, more preferably 2 to 5 carbon atoms, and still more preferably 2 to 4 carbon atoms. Specific examples thereof include a vinyl group, propenyl group (an allyl group), butynyl group, 1-methylpropenyl group and 2-methylpropenyl group.

When two of $R^{1\prime\prime}$ to $R^{3\prime\prime}$ are bonded to each other to form a ring together with the sulfur atom in the formula, the ring including the sulfur atom is preferably a 3- to 10-membered ring, and more preferably a 5- to 7-membered ring.

When two of $R^{1\prime\prime}$ to $R^{3\prime\prime}$ are bonded to each other to form a ring together with the sulfur atom in the formula, the remaining one of $R^{1\prime\prime}$ to $R^{3\prime\prime}$ is preferably an aryl group. Examples of this aryl group include the same groups as those described above for the aryl group for $R^{1\prime\prime}$ to $R^{3\prime\prime}$.

Specific examples of the organic cation represented by the above formula (b1-c1) include triphenylsulfonium, (3,5-dimethylphenyl)diphenylsulfonium, (4-(2-adamantoxymethyloxy)-3,5-dimethylphenyl)diphenylsulfonium, (4-(2-adamantoxymethyloxy)phenyl)diphenylsulfonium, (4-(tert-butoxycarbonylmethyloxy)phenyl)diphenylsulfonium, (4-(tert-butoxycarbonylmethyloxy)-3,5-dimethylphenyl)diphenylsulfonium, (4-(2-methyl-2-adamantyloxycarbonylmethyloxy)phenyl)diphenylsulfonium, (4-(2-methyl-2-adamantyloxycarbonylmethyloxy)-3,5-dimethylphenyl)diphenylsulfonium, tri(4-methylphenyl)sulfonium, dimethyl(4-hydroxynaphthyl)sulfonium, monophenyldimethylsulfonium, diphenylmonomethylsulfonium, (4-methylphenyl)diphenylsulfonium, (4-methoxyphenyl)diphenylsulfonium, tri(4-tert-butyl)phenylsulfonium, diphenyl(1-(4-methoxy)naphthyl)sulfonium, di(1-naphthyl)phenylsulfonium, 1-phenyltetrahydrothiophenium, 1-(4-methylphenyl)tetrahydrothiophenium, 1-(3,5-dimethyl-4-hydroxyphenyl)tetrahydrothiophenium, 1-(4-methoxynaphthalene-1-yl)tetrahydrothiophenium, 1-(4-ethoxynaphthalene-1-yl)tetrahydrothiophenium, 1-(4-n-butoxynaphthalene-1-yl)tetrahydrothiophenium, 1-phenyltetrahydrothiopyranium, 1-(4-hydroxyphenyl))tetrahydrothiopyranium, 1-(3,5-dimethyl-4-hydroxyphenyl)tetrahydrothiopyranium and 1-(4-methylphenyl)tetrahydrothiopyranium.

Furthermore, examples of preferred organic cations represented by the above formula (b1-c1) include the cations shown below.

[Chemical Formula 52)

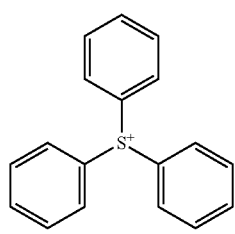

(b1-c1-1)

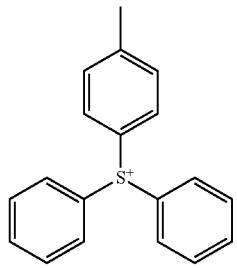

(b1-c1-2)

[Chemical Formula 53]

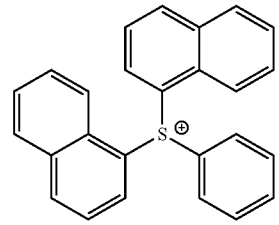

(b1-c1-3)

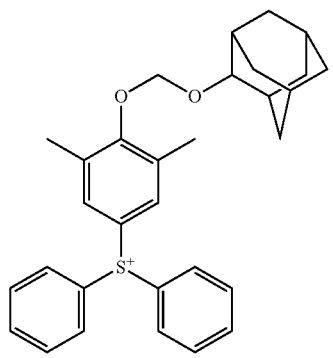

(b1-c1-4)

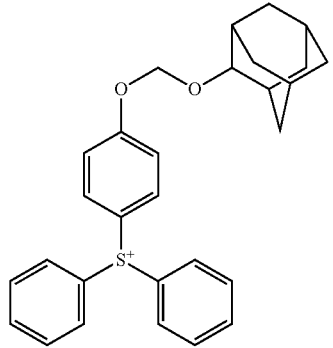

(b1-c1-5)

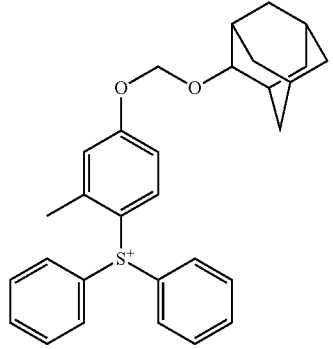

(b1-c1-6)

[Chemical Formula 54]
(b1-c1-7)
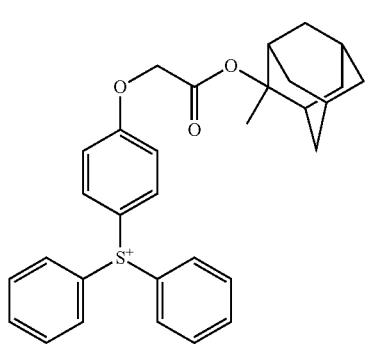
(b1-c1-8)
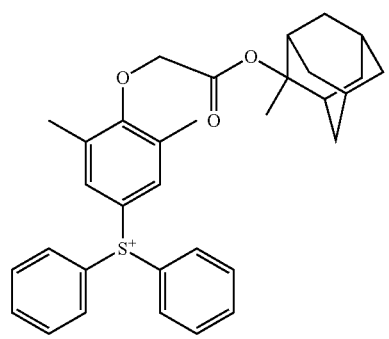
(b1-c1-9)
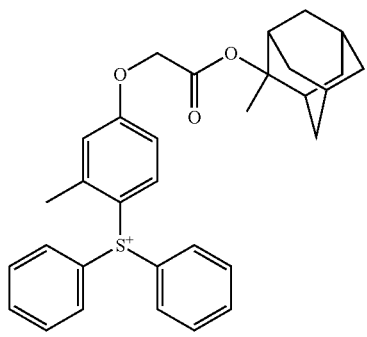
(b1-c1-10)
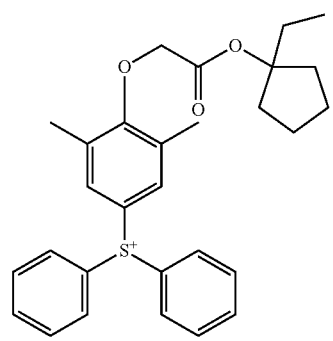
(b1-c1-11)
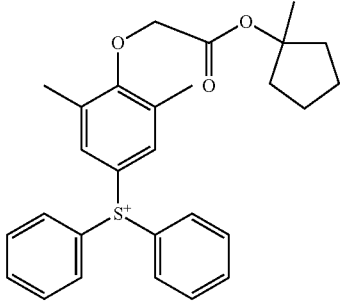
(b1-c1-12)
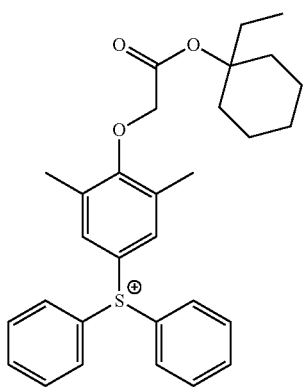
(b1-c1-13)
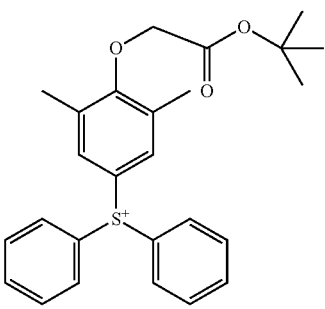
[Chemical Formula 55]
(b1-c1-14)
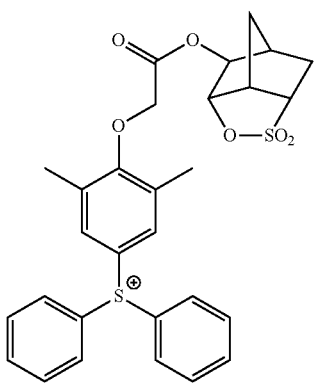

(b1-c1-15)
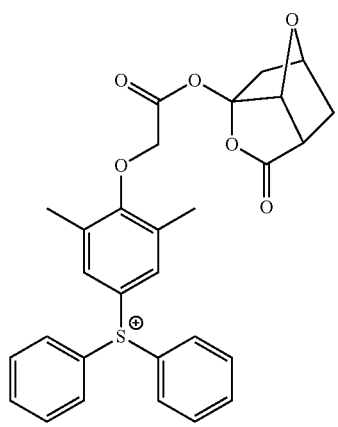
(b1-c1-16)
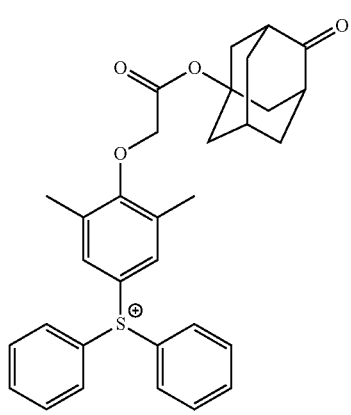
(b1-c1-17)
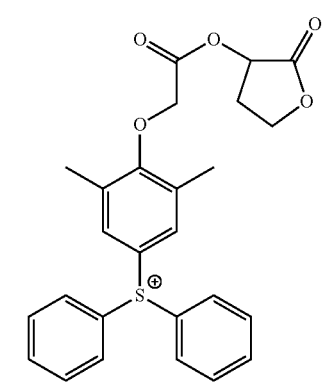
(b1-c1-18)
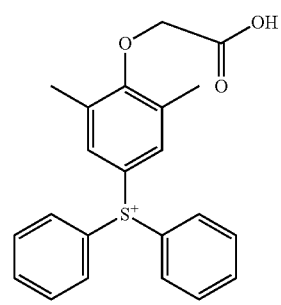
(b1-c1-19)
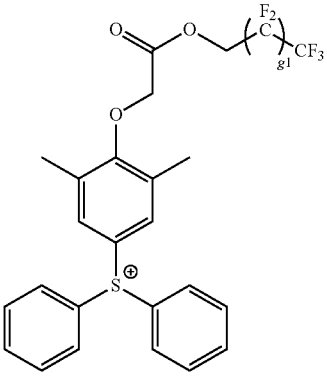
[Chemical Formula 56]
(b1-c1-20)
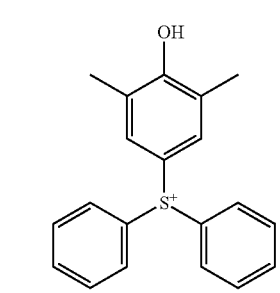
(b1-c1-21)
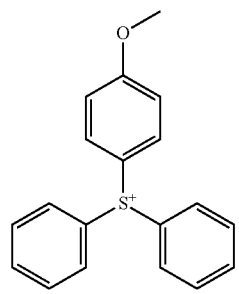
(b1-c1-22)
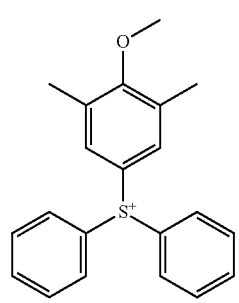

-continued

[Chemical Formula 57]

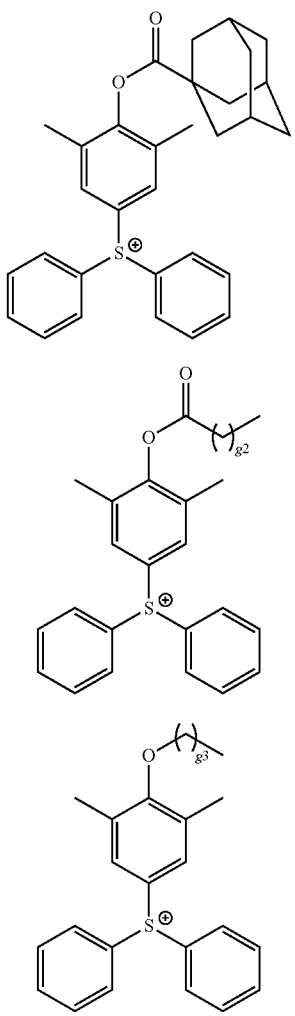

(b1-c1-23)

(b1-c1-24)

(b1-c1-25)

In the above formulas, g2 and g3 represent numbers of repeating units, wherein g2 is an integer of 0 to 20, and g3 is an integer of 0 to 20.

In formula (b1-c2), each of $R^{5'''}$ and $R^{6'''}$ independently represents an aryl group, alkyl group or alkenyl group which may have a substituent.

At least one of $R^{5'''}$ and $R^{6'''}$ represents an aryl group. It is preferable that both $R^{5'''}$ and $R^{6'''}$ represent aryl groups.

Examples of the aryl group for $R^{5'''}$ and $R^{6'''}$ include the same aryl groups as those described for $R^{1'''}$ to $R^{3'''}$.

Examples of the alkyl group for $R^{5'''}$ and $R^{6'''}$ include the same alkyl groups as those described for $R^{1'''}$ to $R^{3'''}$.

Examples of the alkenyl group for $R^{5'''}$ and $R^{6'''}$ include the same alkenyl groups as those described for $R^{1'''}$ to $R^{3'''}$.

It is particularly desirable that both of $R^{5'''}$ and $R^{6'''}$ represent phenyl groups.

Specific examples of the cation moiety represented by the above formula (b1-c2) include diphenyliodonium and bis(4-tert-butylphenyl)iodonium.

Furthermore, examples of other preferred monovalent organic cations for $Z^+$ include cations represented by general formula (I-1) or general formula (I-2) shown below.

[Chemical Formula 58]

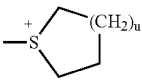

(I-1)

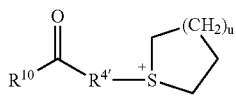

(I-2)

In formulas (I-1) and (I-2), each of $R^9$ and $R^{10}$ independently represents a phenyl group or naphthyl group which may have a substituent, an alkyl group of 1 to 5 carbon atoms, an alkoxy group of 1 to 5 carbon atoms or a hydroxyl group. Examples of the substituent are the same as the substituents described above in relation to the substituted aryl group for $R^{1'''}$ to $R^{3'''}$ (namely, an alkyl group, alkoxy group, alkoxyalkyloxy group, alkoxycarbonylalkyloxy group, halogen atom, hydroxyl group, oxo group (=O), aryl group, —C(=O)—O—$R^{6'}$, —O—C(=O)—$R^{7'}$, —O—$R^{8'}$, and groups in which $R^{56}$ in the aforementioned general formula —O—$R^{50}$—C(=O)—O—$R^{56}$ has been substituted with $R^{56'}$).

$R^{4'}$ represents an alkylene group of 1 to 5 carbon atoms.

u represents an integer of 1 to 3, and is most preferably 1 or 2.

Preferable examples of the organic cation represented by the above formulas (I-1) and (I-2) are shown below.

[Chemical Formula 59]

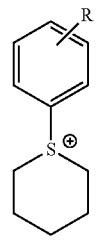

(I-1-1)

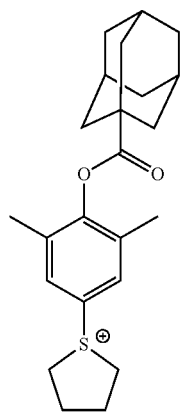

(II-1-2)

-continued

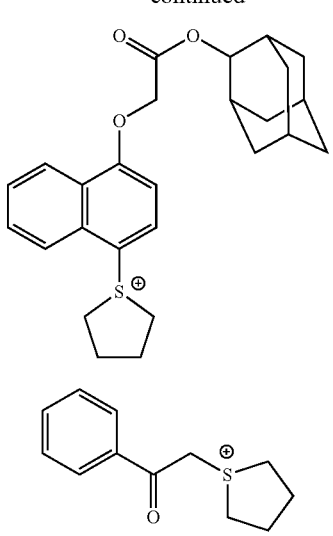

(I-1-3)

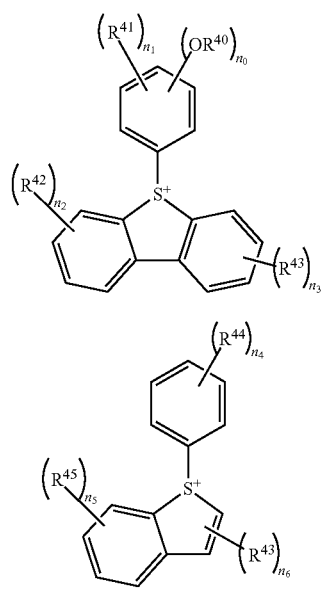

(I-2-1)

Furthermore, examples of other preferred organic cations for $Z^+$ include cations represented by general formula (I-5) or general formula (I-6) shown below.

[Chemical Formula 60]

(I-5)

(I-6)

In the formulas, $R^{40}$ represents a hydrogen atom or an alkyl group, $R^{41}$ represents an alkyl group, acetyl group, carboxyl group or hydroxyalkyl group, each of $R^{42}$ to $R^{46}$ independently represents an alkyl group, acetyl group, alkoxy group, carboxyl group or hydroxyalkyl group, each of $n_0$ to $n_5$ independently represents an integer of 0 to 3, provided that $n_0+n_1$ is not more than 5, and $n_6$ represents an integer of 0 to 2.

In general formula (I-5), the alkyl group for $R^{40}$ is preferably an alkyl group of 1 to 15 carbon atoms, more preferably an alkyl group of 1 to 10 carbon atoms, and still more preferably an alkyl group of 4 to 10 carbon atoms. Among these, a linear or branched alkyl group is preferable.

The alkyl group for $R^{41}$ to $R^{46}$ in general formula (I-5) or (I-6) is preferably an alkyl group of 1 to 5 carbon atoms, more preferably a linear or branched alkyl group, and most preferably a methyl group, ethyl group, propyl group, isopropyl group, n-butyl group or tert butyl group.

The alkoxy group is preferably an alkoxy group of 1 to 5 carbon atoms, more preferably a linear or branched alkoxy group, and most preferably a methoxy group or ethoxy group.

The hydroxyalkyl group is preferably an aforementioned alkyl group in which one or more hydrogen atoms have each been substituted with a hydroxyl group, and examples thereof include a hydroxymethyl group, hydroxyethyl group and hydroxypropyl group.

If there are two or more $OR^{40}$ groups, as indicated by a value of 2 or greater for $n_0$, then the two or more $OR^{40}$ groups may be the same or different from each other.

If there are two or more of an individual $R^{41}$ to $R^{46}$ group, as indicated by a value of 2 or greater for the corresponding $n_1$ to $n_6$, then the two or more of the individual $R^{41}$ to $R^{46}$ group may be the same or different from each other.

$n_0$ is preferably 0 or 1.

$n_1$ is preferably 0 to 2.

It is preferable that each of $n_2$ and $n_3$ independently represents 0 or 1, and more preferably 0.

$n_4$ is preferably 0 to 2, and more preferably 0 or 1.

$n_5$ is preferably 0 or 1, and more preferably 0.

$n_6$ is preferably 0 or 1.

Examples of preferred organic cations represented by the above formula (I-5) or (I-6) include the cations shown below.

[Chemical Formula 61]

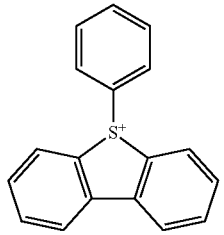

(I-5-1)

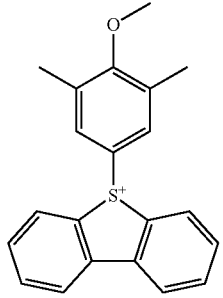

(I-5-2)

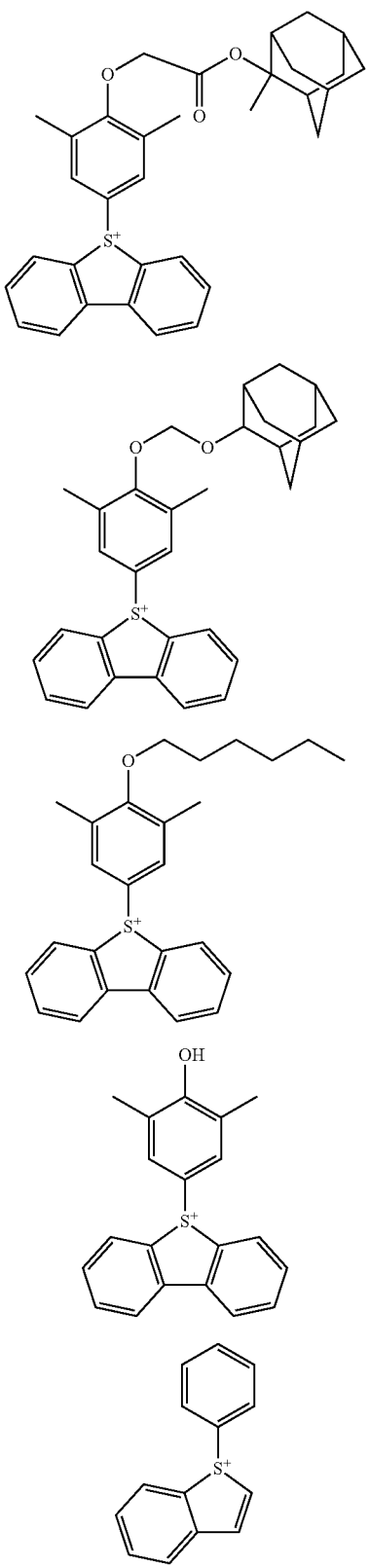

component (B1) is preferably a compound represented by general formula (b1-1-0) or (b1-1-1) shown below.

[Chemical Formula 62]

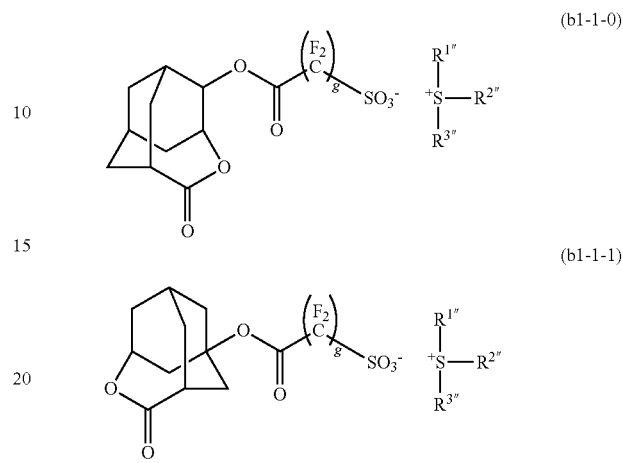

In the formulas, g represents an integer of 1 to 4, and $R^{1''}$ to $R^{3''}$ are the same as defined above.

As the component (B1), one type of compound may be used, or two or more types of compounds may be used in combination.

In the resist composition of the present invention, the amount of the component (B1), relative to 100 parts by weight of the component (A), is preferably within a range from 0.1 to 50 parts by weight, more preferably from 0.1 to 30 parts by weight, and most preferably from 1 to 25 parts by weight.

When the amount of the component (B1) is at least as large as the lower limit of the above range, various lithography properties of the resist composition are improved, such as the roughness, mask reproducibility and exposure latitude. Further, a resist pattern having an excellent shape with superior rectangularity can be reliably obtained. On the other hand, when the amount is not more than the upper limit of the above range, a uniform solution can be obtained and the storage stability improves.

In the component (B), the amount of the component (B1), based on the total weight of the component (B), is preferably at least 20% by weight, more preferably 40% by weight or more, and may even be 100% by weight. The amount of the component (B1) is most preferably 100% by weight. When the amount of the component (B1) is at least as large as the lower limit of the above range, various lithography properties of the resist composition are improved. Further, a resist pattern having an excellent shape can be obtained.

[Component (B2)]

In the resist composition of the present invention, if desired, the component (B) may further contain an acid generator other than the component (B1) (hereinafter referred to as "component (B2)").

There are no particular limitations on the component (B2) provided it is an acid generator that falls outside the definition for component (B1), and any of the multitude of known acid generators may be used, including onium salt acid generators such as iodonium salts and sulfonium salts, oxime sulfonate acid generators, diazomethane acid generators such as bisalkyl or bisaryl sulfonyl diazomethanes and Among the various possibilities described above, in terms of achieving superior lithography properties and resist pattern shape upon formation of a resist composition, the poly(bis-sulfonyl)diazomethanes, nitrobenzylsulfonate acid generators, iminosulfonate acid generators, and disulfone acid generators.

Preferred examples of the component (B2) include onium salt acid generators represented by general formula (b-1) or (b-2) shown below.

[Chemical Formula 63]

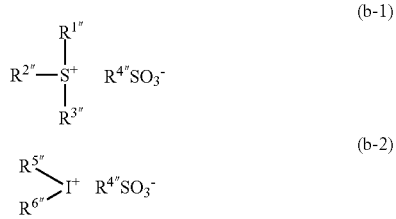

In formula (b-1), each of $R^{1\prime\prime}$ to $R^{3\prime\prime}$ independently represents an aryl group, alkyl group or alkenyl group which may have a substituent, provided that at least one of $R^{1\prime\prime}$ to $R^{3\prime\prime}$ represents an aryl group, and two of $R^{1\prime\prime}$ to $R^{3\prime\prime}$ may be bonded to each other to form a ring together with the sulfur atom in the formula. In formula (b-2), each of $R^{5\prime\prime}$ and $R^{6\prime\prime}$ independently represents an aryl group, alkyl group or alkenyl group which may have a substituent, provided that and at least one of $R^{5\prime\prime}$ and $R^{6\prime\prime}$ represents an aryl group. $R^{4\prime\prime}$ represents a halogenated alkyl group, an aryl group or an alkenyl group which may have a substituent.

In formula (b-1), $R^{1\prime\prime}$ to $R^{3\prime\prime}$ are the same as defined above for $R^{1\prime\prime}$ to $R^{3\prime\prime}$ in formula (b1-c1).

In formula (b-2), $R^{5\prime\prime}$ and $R^{6\prime\prime}$ are the same as defined above for $R^{5\prime\prime}$ and $R^{6\prime\prime}$ in formula (b1-c2).

In formulas (b-1) and (b-2), $R^{4\prime\prime}$ represents a halogenated alkyl group, an aryl group or an alkenyl group which may have a substituent.

Examples of the halogenated alkyl group for $R^{4\prime\prime}$ include groups in which part or all of the hydrogen atoms of a linear, branched or cyclic alkyl group have each been substituted with a halogen atom. Examples of the halogen atom include a fluorine atom, chlorine atom, bromine atom and iodine atom, and a fluorine atom is preferable.

When the alkyl group within the halogenated alkyl group is a linear or branched alkyl group, the alkyl group preferably has 1 to 10 carbon atoms, more preferably 1 to 8 carbon atoms, and most preferably 1 to 4 carbon atoms. On the other hand, when the alkyl group within the halogenated alkyl group is a cyclic alkyl group, the cyclic alkyl group preferably has 4 to 15 carbon atoms, more preferably 4 to 10 carbon atoms, and most preferably 6 to 10 carbon atoms.

In the halogenated alkyl group, the percentage of the number of halogen atoms relative to the total number of halogen atoms and hydrogen atoms (the halogenation ratio (%)) is preferably within a range from 10 to 100%, more preferably from 50 to 100%, and most preferably 100%. Higher halogenation ratios are preferable, as they result in increased acid strength.

The aryl group for $R^{4\prime\prime}$ is preferably an aryl group of 6 to 20 carbon atoms.

The alkenyl group for $R^{4\prime\prime}$ is preferably an alkenyl group of 2 to 10 carbon atoms.

With respect to $R^{4\prime\prime}$, the expression "may have a substituent" means that part or all of the hydrogen atoms within the aforementioned linear, branched or cyclic alkyl group, halogenated alkyl group, aryl group or alkenyl group may each be substituted with a substituent (an atom other than a hydrogen atom, or a group).

$R^{4\prime\prime}$ may have one substituent or two or more substituents.

Examples of the substituent include a halogen atom, a hetero atom, an alkyl group, and a group represented by the formula $X-Q^2-$ (wherein $Q^2$ represents a divalent linking group containing an oxygen atom, and X represents a hydrocarbon group of 3 to 30 carbon atoms which may have a substituent).

Examples of the halogen atom and alkyl group as substituents for $R^{4\prime\prime}$ include the same halogen atoms and alkyl groups as those described above with respect to the halogenated alkyl group for $R^{4\prime\prime}$.

Examples of the hetero atom include an oxygen atom, a nitrogen atom, and a sulfur atom.

In the group represented by formula $X-Q^2-$, $Q^2$ represents a divalent linking group containing an oxygen atom.

$Q^2$ may contain an atom other than an oxygen atom. Examples of atoms other than oxygen include a carbon atom, hydrogen atom, sulfur atom and nitrogen atom.

Examples of the divalent linking group containing an oxygen atom include non-hydrocarbon, oxygen atom-containing linking groups such as an oxygen atom (an ether linkage, —O—), an ester linkage (—C(=O)—O—), an amido linkage (—C(=O)—NH—), a carbonyl group (—C(=O)—) and a carbonate linkage (—O—C(=O)—O—), and combinations of these non-hydrocarbon, hetero atom-containing linking groups with an alkylene group.

Specific examples of the combinations of the non-hydrocarbon, hetero atom-containing linking groups with an alkylene group include —$R^{91}$—O—, —$R^{92}$—O—C(=O)—, —C(=O)—O—$R^{93}$—O—C(=O)— (in the formulas, each of $R^{91}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5 carbon atoms, and most preferably 1 to 3 carbon atoms.

Specific examples of the alkylene group include a methylene group [—CH$_2$—], alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—, an ethylene group [—CH$_2$CH$_2$—], alkylethylene groups such as —CH(CH$_3$)CH$_2$—, —CH(CH$_3$)CH(CH$_3$)—, —C(CH$_3$)$_2$CH$_2$— and —C(CH$_2$CH$_3$)CH$_2$—, a trimethylene group (n-propylene group) [—CH$_2$CH$_2$CH$_2$—], alkyltrimethylene groups such as —CH(CH$_3$)CH$_2$CH$_2$— and —CH$_2$CH(CH$_3$)CH$_2$—, a tetramethylene group [—CH$_2$CH$_2$CH$_2$CH$_2$—], alkyltetramethylene groups such as —CH(CH$_3$)CH$_2$CH$_2$CH$_2$— and —CH$_2$CH(CH$_3$)CH$_2$CH$_2$—, and a pentamethylene group [—CH$_2$CH$_2$CH$_2$CH$_2$CH$_2$—].

As the group $Q^2$, a divalent linking group containing an ester linkage or an ether linkage is preferable, and —$R^{91}$—O—, —$R^{92}$—O—C(=O)— or —C(=O)—O—$R^{93}$—O—C(=O)— is more preferable.

In the group represented by the formula $X-Q^2-$, the hydrocarbon group for X may be either an aromatic hydrocarbon group or an aliphatic hydrocarbon group.

The aromatic hydrocarbon group is a hydrocarbon group having an aromatic ring. The aromatic hydrocarbon group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of carbon atoms within a substituent(s) is not included in the number of carbon atoms of the aromatic hydrocarbon group.

Specific examples of aromatic hydrocarbon groups include an aryl group, which is an aromatic hydrocarbon ring having one hydrogen atom removed therefrom, such as a phenyl group, biphenylyl group, fluorenyl group, naphthyl group, anthryl group or phenanthryl group, and an alkylaryl group such as a benzyl group, phenethyl group, 1-naphthylmethyl group, 2-naphthylmethyl group, 1-naphthylethyl group or 2-naphthylethyl group. The alkyl chain within the arylalkyl group preferably has 1 to 4 carbon atoms, more preferably 1 or 2 carbon atoms, and most preferably 1 carbon atom.

The aromatic hydrocarbon group may have a substituent. For example, part of the carbon atoms that constitute the aromatic ring within the aromatic hydrocarbon group may be substituted with a hetero atom, or a hydrogen atom bonded to the aromatic ring within the aromatic hydrocarbon group may be substituted with a substituent.

Examples of the former case include heteroaryl groups in which part of the carbon atoms that constitute the ring within an aforementioned aryl group have been substituted with a hetero atom such as an oxygen atom, a sulfur atom or a nitrogen atom, and heteroarylalkyl groups in which part of the carbon atoms that constitute the aromatic hydrocarbon ring within an aforementioned arylalkyl group have been substituted with an aforementioned hetero atom.

In the latter case, examples of the substituent for the aromatic hydrocarbon group include an alkyl group, alkoxy group, halogen atom, halogenated alkyl group, hydroxyl group or oxygen atom (=O) or the like.

The alkyl group as the substituent for the aromatic hydrocarbon group is preferably an alkyl group of 1 to 5 carbon atoms, and a methyl group, ethyl group, propyl group, n-butyl group or tert-butyl group is particularly desirable.

The alkoxy group as the substituent for the aromatic hydrocarbon group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the halogen atom as the substituent for the aromatic hydrocarbon group include a fluorine atom, chlorine atom, bromine atom and iodine atom, and a fluorine atom is preferable.

Examples of the halogenated alkyl group as the substituent for the aromatic hydrocarbon group include groups in which part or all of the hydrogen atoms within an aforementioned alkyl group have each been substituted with an aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be linear, branched or cyclic.

In the aliphatic hydrocarbon group for X, part of the carbon atoms that constitute the aliphatic hydrocarbon group may be substituted with a substituent group containing a hetero atom, or part or all of the hydrogen atoms constituting the aliphatic hydrocarbon group may be substituted with a substituent group containing a hetero atom.

As the "hetero atom" within X, there is no particular limitation as long as it is an atom other than carbon and hydrogen. Examples of the hetero atom include a halogen atom, an oxygen atom, a sulfur atom and a nitrogen atom. Examples of the halogen atom include a fluorine atom, a chlorine atom, an iodine atom and a bromine atom.

The substituent group containing a hetero atom may consist solely of the hetero atom, or may be a group containing a group or atom other than a hetero atom.

Specific examples of the substituent group for substituting part of the carbon atoms include —O—, —C(=O)—O—, —C(=O)—, —O—C(=O)—O—, —C(=O)—NH—, —NH— (wherein the H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain any of these substituent groups in the ring structure.

Examples of the substituent group for substituting part or all of the hydrogen atoms include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, ethoxy group, n-propoxy group, iso-propoxy group, n-butoxy group or tert-butoxy group, and most preferably a methoxy group or an ethoxy group.

Examples of the aforementioned halogen atom include a fluorine atom, chlorine atom, bromine atom and iodine atom, and a fluorine atom is preferable.

Examples of the halogenated alkyl group include groups in which part or all of the hydrogen atoms within an alkyl group of 1 to 5 carbon atoms (such as a methyl group, ethyl group, propyl group, n-butyl group or tert-butyl group) have each been substituted with an aforementioned halogen atom.

As the aliphatic hydrocarbon group for X, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15 carbon atoms, and most preferably 1 to 10 carbon atoms. Specific examples include a methyl group, ethyl group, propyl group, butyl group, pentyl group, hexyl group, heptyl group, octyl group, nonyl group, decyl group, undecyl group, dodecyl group, tridecyl group, isotridecyl group, tetradecyl group, pentadecyl group, hexadecyl group, iso-hexadecyl group, heptadecyl group, octadecyl group, nonadecyl group, eicosyl group, heneicosyl group and docosyl group.

The branched saturated hydrocarbon group (alkyl group) preferably has 3 to 20 carbon atoms, more preferably 3 to 15 carbon atoms, and most preferably 3 to 10 carbon atoms. Specific examples include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

The unsaturated hydrocarbon group preferably has 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, propenyl group (an allyl group) and butynyl group. Examples of branched monovalent unsaturated hydrocarbon groups include a 1-methylpropenyl group and a 2-methylpropenyl group.

Among the above examples, a propenyl group is particularly desirable as the unsaturated hydrocarbon group.

The aliphatic cyclic group may be either a monocyclic group or a polycyclic group. The aliphatic cyclic group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

Examples of the aliphatic cyclic group include groups in which one or more hydrogen atoms have been removed from a monocycloalkane or a polycycloalkane such as a bicycloalkane, tricycloalkane or tetracycloalkane. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure, the aliphatic cyclic group is preferably a polycyclic group, more preferably a group in which one or more hydrogen atoms have been removed from a polycycloalkane, and still more preferably a group in which one or more hydrogen atoms have been removed from adamantane.

When the aliphatic cyclic group contains a hetero atom-containing substituent group in the ring structure, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L5) and (S1) to (S4) shown below.

[Chemical Formula 64]

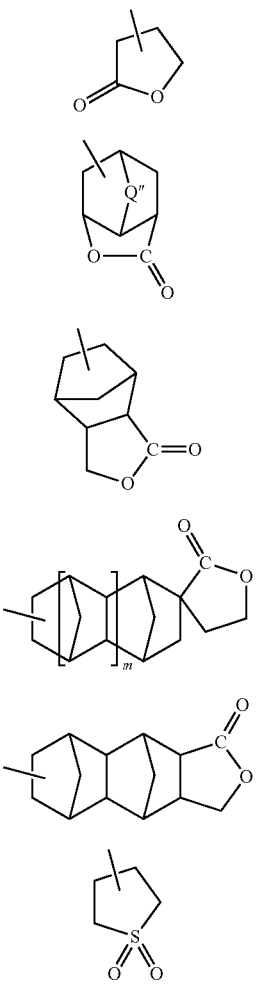

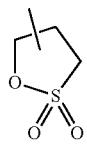

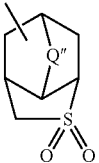

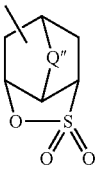

In the above formulas, Q" represents an alkylene group of 1 to 5 carbon atoms, —O—, —S—, —O—$R^{94}$— or —S—$R^{95}$— (wherein each of $R^{94}$ and $R^{95}$ independently represents an alkylene group of 1 to 5 carbon atoms), and m represents 0 or 1.

Examples of the alkylene groups for Q", $R^{94}$ and $R^{95}$ include the same alkylene groups as those described above for $R^{91}$ to $R^{93}$.

In these aliphatic cyclic groups, part of the hydrogen atoms bonded to the carbon atoms that constitute the ring structure may each be substituted with a substituent. Examples of this substituent include an alkyl group, alkoxy group, halogen atom, halogenated alkyl group, hydroxyl group and oxygen atom (=O).

As the alkyl group, an alkyl group of 1 to 5 carbon atoms is preferable, and a methyl group, ethyl group, propyl group, n-butyl group or tert-butyl group is particularly desirable.

Examples of the halogen atom include a fluorine atom, chlorine atom, bromine atom and iodine atom, and a fluorine atom is preferable.

Among the examples described above, X is preferably a cyclic group which may have a substituent. The cyclic group may be either an aromatic hydrocarbon group which may have a substituent, or an aliphatic cyclic group which may have a substituent, and an aliphatic cyclic group which may have a substituent is preferable.

As the aromatic hydrocarbon group, a naphthyl group which may have a substituent, or a phenyl group which may have a substituent is preferable.

As the aliphatic cyclic group which may have a substituent, an aliphatic polycyclic group which may have a substituent is preferable. As the polycyclic aliphatic polycyclic group, an aforementioned group in which one or more hydrogen atoms have been removed from a polycycloalkane, and groups represented by the aforementioned formulas (L2) to (L5), (S3) and (S4) are preferable.

Further, in the present invention, X is preferably a group containing a polar region, as such groups yield improved lithography properties and a superior resist pattern shape.

Specific examples of groups containing a polar region include groups in which a portion of the carbon atoms that constitute an aforementioned aliphatic hydrocarbon group for X are substituted with a substituent group containing a hetero atom such as —O—, —C(=O)—O—, —C(=O)—, —O—C(=O)—O—, —C(=O)—NH—, —NH— (wherein H may be substituted with a substituent such as an alkyl group or an acyl group), —S—, —S(=O)$_2$— or —S(=O)$_2$—O—.

In the present invention, R$^{4''}$ preferably has X-Q$^2$- as a substituent. In this case, R$^{4''}$ is preferably a group represented by formula X-Q$^2$-Y$^3$— [wherein Q$^2$ and X are the same as defined above, and Y$^3$ represents an alkylene group of 1 to 4 carbon atoms which may have a substituent, or a fluorinated alkylene group of 1 to 4 carbon atoms which may have a substituent].

In the group represented by the formula X-Q$^2$-Y$^3$—, examples of the alkylene group represented by Y$^3$ include the same alkylene group as those described above for Q$^2$ in which the number of carbon atoms is from 1 to 4.

Examples of the fluorinated alkylene group for Y$^3$ include groups in which part or all of the hydrogen atoms of an aforementioned alkylene group have been substituted with fluorine atoms.

Specific examples of Y$^3$ include —CF$_2$—, —CF$_2$CF$_2$—, —CF$_2$CF$_2$CF$_2$—, —CF(CF$_3$)CF$_2$—, —CF(CF$_2$CF$_3$)—, —C(CF$_3$)$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CF(CF$_2$CF$_2$CF$_3$)—, —C(CF$_3$)(CF$_2$CF$_3$)—, —CHF—, —CH$_2$CF$_2$—, —CH$_2$CH$_2$CF$_2$—, —CH$_2$CF$_2$CF$_2$—, —CH(CF$_3$)CH$_2$—, —CH(CF$_2$CF$_3$)—, —C(CH$_3$)(CF$_3$)—, —CH$_2$CH$_2$CH$_2$CF$_2$—, —CH$_2$CH$_2$CF$_2$CF$_2$—, —CH(CF$_3$)CH$_2$CH$_2$—, —CH$_2$CH(CF$_3$)CH$_2$—, —CH(CF$_3$)CH(CF$_3$)—, —C(CF$_3$)$_2$CH$_2$—, —CH$_2$—, —CH$_2$CH$_2$—, —CH$_2$CH$_2$CH$_2$—, —CH(CH$_3$)CH$_2$—, —CH(CH$_2$CH$_3$)—, —C(CH$_3$)$_2$—, —CH$_2$CH$_2$CH$_2$CH$_2$—, —CH(CH$_3$)CH$_2$CH$_2$—, —CH$_2$CH(CH$_3$)CH$_2$—, —CH(CH$_3$)CH(CH$_3$)—, —C(CH$_3$)$_2$CH$_2$—, —CH(CH$_2$CH$_3$)CH$_2$—, —CH(CH$_2$CH$_2$CH$_3$)—, and —C(CH$_3$)(CH$_2$CH$_3$)—.

Y$^3$ is preferably a fluorinated alkylene group, and particularly preferably a fluorinated alkylene group in which the carbon atom bonded to the adjacent sulfur atom is fluorinated. Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—; —CH$_2$CF$_2$—, —CH$_2$CH$_2$CF$_2$—, —CH$_2$CF$_2$CF$_2$—, —CH$_2$CH$_2$CH$_2$CF$_2$—, —CH$_2$CH$_2$CF$_2$CF$_2$—, and —CH$_2$CF$_2$CF$_2$CF$_2$—.

Of these, —CF$_2$—, —CF$_2$CF$_2$—, —CF$_2$CF$_2$CF$_2$— or CH$_2$CF$_2$CF$_2$— is preferable, —CF$_2$—, —CF$_2$CF$_2$— or —CF$_2$CF$_2$CF$_2$— is more preferable, and —CF$_2$— is particularly desirable.

The alkylene group or fluorinated alkylene group may have a substituent. The expression that the alkylene group or fluorinated alkylene group "may have a substituent" means that part or all of the hydrogen atoms or fluorine atoms in the alkylene group or fluorinated alkylene group may be substituted, either with atoms other than hydrogen atoms and fluorine atoms, or with groups.

Examples of substituents with which the alkylene group or fluorinated alkylene group may be substituted include an alkyl group of 1 to 4 carbon atoms, an alkoxy group of 1 to 4 carbon atoms, and a hydroxyl group.

Specific examples of onium salt acid generators represented by formula (b-1) or (b-2) include diphenyliodonium trifluoromethanesulfonate or nonafluorobutanesulfonate, bis (4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl) sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, tri(4-tert-butyl)phenylsulfonium trifluoromethanesulfonate, heptafluoropropanesulfonate or nonafluorobutanesulfonate, diphenyl(1-(4-methoxy)naphthyl)sulfonium trifluoromethanesulfonate, heptafluoropropanesulfonate or nonafluorobutanesulfonate, di(1-naphthyl) phenylsulfonium trifluoromethanesulfonate, heptafluoropropanesulfonate or nonafluorobutanesulfonate, 1-phenyltetrahydrothiophenium trifluoromethanesulfonate, heptafluoropropanesulfonate or nonafluorobutanesulfonate, 1-(4-methylphenyl)tetrahydrothiophenium trifluoromethanesulfonate, heptafluoropropanesulfonate or nonafluorobutanesulfonate, 1-(3,5-dimethyl-4-hydroxyphenyl)tetrahydrothiophenium trifluoromethanesulfonate, heptafluoropropanesulfonate or nonafluorobutanesulfonate, 1-(4-methoxynaphthalene-1-yl)tetrahydrothiophenium trifluoromethanesulfonate, heptafluoropropanesulfonate or nonafluorobutanesulfonate, 1-(4-ethoxynaphthalene-1-yl) tetrahydrothiophenium trifluoromethanesulfonate, heptafluoropropanesulfonate or nonafluorobutanesulfonate, 1-(4-n-butoxynaphthalene-1-yl)tetrahydrothiophenium trifluoromethanesulfonate, heptafluoropropanesulfonate or nonafluorobutanesulfonate, 1-phenyltetrahydrothiopyranium trifluoromethanesulfonate, heptafluoropropanesulfonate or nonafluorobutanesulfonate, 1-(4-hydroxyphenyl) tetrahydrothiopyranium trifluoromethanesulfonate, heptafluoropropanesulfonate or nonafluorobutanesulfonate, 1-(3,5-dimethyl-4-hydroxyphenyl)tetrahydrothiopyranium trifluoromethanesulfonate, heptafluoropropanesulfonate or nonafluorobutanesulfonate, and 1-(4-methylphenyl)tetrahydrothiopyranium trifluoromethanesulfonate, heptafluoropropanesulfonate or nonafluorobutanesulfonate.

By using any of these onium salt acid generators in combination with the component (B1), in the formation of a resist pattern, the critical resolution, sensitivity, exposure latitude (EL margin), mask error factor (MEF), line width roughness (LWR), line edge roughness (LER), circularity, critical dimension uniformity (CDU) or pattern shape can be further improved.

Further, as the component (B2), examples of particularly preferred acid generators among those represented by the aforementioned general formula (b-1) or (b-2), include onium salt acid generator having an anion moiety represented by any one of formulas (b1) to (b8) shown below.

By using such an onium salt acid generator in combination with the component (B1), in the formation of a resist pattern, critical resolution, sensitivity, EL margin, MEF, LWR, LER, circularity, CDU or pattern shape can be particularly improved.

[Chemical Formula 65]

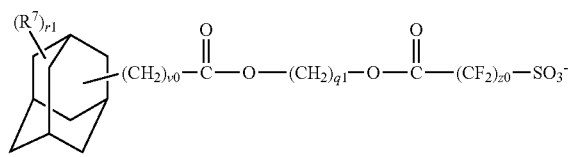
(b1)

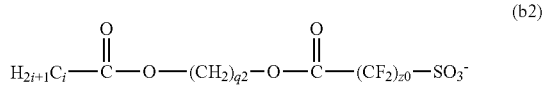
(b2)

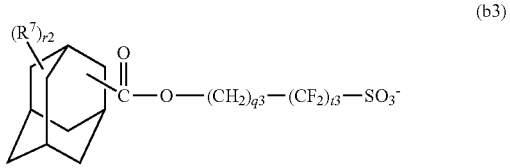
(b3)

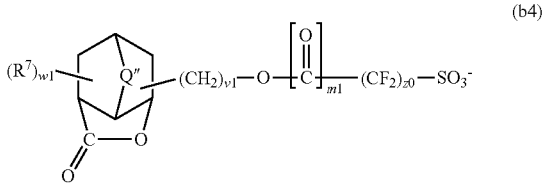
(b4)

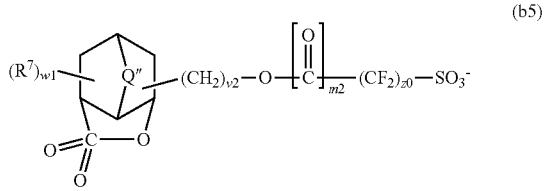
(b5)

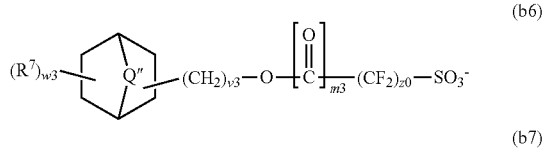
(b6)

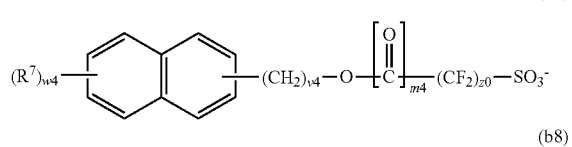
(b7)

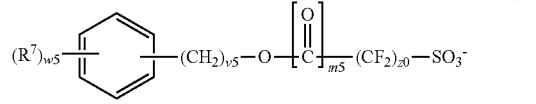
(b8)

In the formulas, z0 represents an integer of 1 to 3, each of q1 and q2 independently represents an integer of 1 to 5, q3 represents an integer of 1 to 12, t3 represents an integer of 1 to 3, each of r1 and r2 independently represents an integer of 0 to 3, i represents an integer of 1 to 20, $R^7$ represents a substituent, each of m1 to m5 independently represents 0 or 1, each of v0 to v5 independently represents an integer of 0 to 3, each of w1 to w5 independently represents an integer of 0 to 3, and Q″ is the same as defined above.

Examples of the substituent for $R^7$ include the same groups as those which the aforementioned aliphatic hydrocarbon group or aromatic hydrocarbon group for X may have as a substituent.

If there are two or more $R^7$ groups, as indicated by the values r1, r2 and w1 to w5, then the plurality of $R^7$ groups within the compound may be the same or different from each other.

Further, onium salt acid generators in which the anion moiety in the above general formula (b-1) or (b-2) has been replaced with an anion moiety represented by general formula (b-3) or (b-4) shown below can also be used favorably as the component (B2). By using such an onium salt acid generator in combination with the component (B1), in the formation of a resist pattern, critical resolution, sensitivity, EL margin, MEF, LWR, LER, circularity, CDU or pattern shape can be further improved.

[Chemical Formula 66]

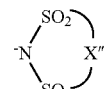
(b-3)

(b-4)

In the formulas, X″ represents an alkylene group of 2 to 6 carbon atoms in which at least one hydrogen atom has been substituted with a fluorine atom, and each of Y″ and Z″ independently represents an alkyl group of 1 to 10 carbon atoms in which at least one hydrogen atom has been substituted with a fluorine atom.

X″ represents a linear or branched alkylene group in which at least one hydrogen atom has been substituted with a fluorine atom, wherein the alkylene group preferably contains 2 to 6 carbon atoms, more preferably 3 to 5 carbon atoms, and most preferably 3 carbon atoms.

Each of Y″ and Z″ independently represents a linear or branched alkyl group in which at least one hydrogen atom has been substituted with a fluorine atom, wherein the alkyl group preferably contains 1 to 10 carbon atoms, more preferably 1 to 7 carbon atoms, and most preferably 1 to 3 carbon atoms.

The smaller the number of carbon atoms in the alkylene group for X″ or the alkyl group for Y″ and Z″ within the above numerical ranges for the number of carbon atoms, the more the solubility in a resist solvent is improved, and therefore a smaller number of carbon atoms is preferred.

Further, in the alkylene group for X″ or the alkyl group for Y″ and Z″, it is preferable that the number of hydrogen atoms substituted with fluorine atoms is as large as possible, because the acid strength increases and the transparency to high energy radiation of 200 nm or less or an electron beam is improved.

The fluorination ratio of the alkylene group or alkyl group is preferably within a range from 70 to 100%, and more preferably from 90 to 100%. A perfluoroalkylene or perfluoroalkyl group in which all the hydrogen atoms are substituted with fluorine atoms is the most desirable.

In the present description, an oxime sulfonate acid generator refers to a compound having at least one group represented by general formula (B-1) shown below, and has a feature of generating acid by irradiation. Such oxime sulfonate acid generators can also be used favorably as the component (B2). By using such an oxime sulfonate acid generator in combination with the component (B1), in the formation of a resist pattern, critical resolution, sensitivity, EL margin, MEF, LWR, LER, circularity, CDU or pattern shape can be further improved.

[Chemical Formula 67]

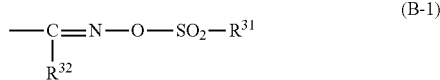

(B-1)

In formula (B-1), each of $R^{31}$ and $R^{32}$ independently represents an organic group.

The organic group for $R^{31}$ and $R^{32}$ refers to a group containing a carbon atom, and may include atoms other than carbon atoms (such as a hydrogen atom, oxygen atom, nitrogen atom, sulfur atom or halogen atom (such as a fluorine atom or chlorine atom) or the like).

As the organic group for $R^{31}$, a linear, branched, or cyclic alkyl group or aryl group is preferable. The alkyl group or aryl group may have a substituent. There are no particular limitations on the substituent, and examples thereof include a fluorine atom and a linear, branched or cyclic alkyl group of 1 to 6 carbon atoms. The expression that the alkyl group or aryl group "may have a substituent" means that part or all of the hydrogen atoms of the alkyl group or aryl group may each be substituted with a substituent.

The alkyl group preferably contains 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter sometimes referred to as a "halogenated alkyl group") is particularly desirable. The "partially halogenated alkyl group" refers to an alkyl group in which part of the hydrogen atoms are substituted with halogen atoms, and the "completely halogenated alkyl group" refers to an alkyl group in which all of the hydrogen atoms are substituted with halogen atoms. Examples of the halogen atoms include fluorine atoms, chlorine atoms, bromine atoms and iodine atoms, and fluorine atoms are particularly desirable. In other words, the halogenated alkyl group is preferably a fluorinated alkyl group.

The aryl group preferably contains 4 to 20 carbon atoms, more preferably 4 to 10 carbon atoms, and most preferably 6 to 10 carbon atoms. As the aryl group, a partially or completely halogenated aryl group is particularly desirable. The "partially halogenated aryl group" refers to an aryl group in which part of the hydrogen atoms are substituted with halogen atoms, and the "completely halogenated aryl group" refers to an aryl group in which all of the hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched or cyclic alkyl group, an aryl group, or a cyano group is preferable. Examples of the alkyl group and the aryl group for $R^{32}$ include the same alkyl groups and aryl groups as those described above for $R^{31}$.

As $R^{32}$, a cyano group, an alkyl group of 1 to 8 carbon atoms having no substituent, or a fluorinated alkyl group of 1 to 8 carbon atoms is particularly desirable.

Preferred examples of the oxime sulfonate acid generator include compounds represented by general formula (B-2) or (B-3) shown below.

[Chemical Formula 68]

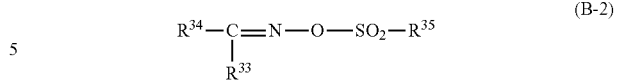

(B-2)

In formula (B-2), $R^{33}$ represents a cyano group, an alkyl group having no substituent or a halogenated alkyl group, $R^{34}$ represents an aryl group, and $R^{35}$ represents an alkyl group having no substituent or a halogenated alkyl group.

[Chemical Formula 69]

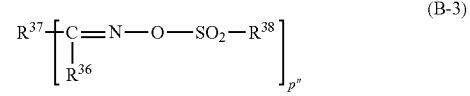

(B-3)

In formula (B-3), $R^{36}$ represents a cyano group, an alkyl group having no substituent or a halogenated alkyl group, $R^{37}$ represents a divalent or trivalent aromatic hydrocarbon group, $R^{38}$ represents an alkyl group having no substituent or a halogenated alkyl group, and p" represents 2 or 3.

In general formula (B-2), the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ preferably has 50% or more of the hydrogen atoms thereof fluorinated, more preferably 70% or more fluorinated, and most preferably 90% or more fluorinated.

Examples of the aryl group for $R^{34}$ include groups in which one hydrogen atom has been removed from an aromatic hydrocarbon ring, such as a phenyl group, biphenylyl group, fluorenyl group, naphthyl group, anthryl group or phenanthryl group, and heteroaryl groups in which part of the carbon atoms that constitute the ring(s) of these groups are substituted with hetero atoms such as an oxygen atom, a sulfur atom or a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group or halogenated alkyl group as the substituent preferably contains 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably contains 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ preferably has 50% or more of the hydrogen atoms fluorinated, more preferably 70% or more fluorinated, and still more preferably 90% or more fluorinated. A completely fluorinated alkyl group in which 100% of the hydrogen atoms have been substituted with fluorine atoms is particularly desirable.

In general formula (B-3), examples of the alkyl group having no substituent and the halogenated alkyl group for $R^{36}$ include the same groups as those described above for the alkyl group having no substituent and the halogenated alkyl group for $R^{33}$.

Examples of the divalent or trivalent aromatic hydrocarbon group for $R^{37}$ include groups in which an additional one or two hydrogen atoms have been removed from the aryl group for $R^{34}$.

Examples of the alkyl group having no substituent or the halogenated alkyl group for $R^{38}$ include the same groups as those described above for the alkyl group having no substituent or the halogenated alkyl group for $R^{35}$.

p" is preferably 2.

Specific examples of oxime sulfonate acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate acid generators disclosed in Japanese Unexamined Patent Application, First Publication No. Hei 9-208554 (Chemical Formulas 18 and 19 shown in paragraphs [0012] to [0014]) and oxime sulfonate acid generators disclosed in WO 2004/074242A2 (Examples 1 to 40 described on pages 65 to 85) may also be used favorably.

Furthermore, the following compounds may also be used as preferred examples.

[Chemical Formula 70]

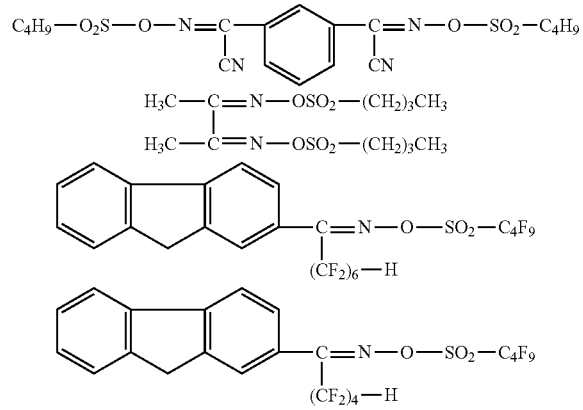

Of the aforementioned diazomethane acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane acid generators disclosed in Japanese Unexamined Patent Application, First Publication No. Hei-11-035551, Japanese Unexamined Patent Application, First Publication No. Hei-11-035552 and Japanese Unexamined Patent Application, First Publication No. Hei-11-035573 may also be used favorably.

Furthermore, examples of poly(bis-sulfonyl)diazomethanes include those disclosed in Japanese Unexamined Patent Application, First Publication No. Hei-11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane.

As the component (B2), one type of acid generator described above may be used alone, or two or more types of acid generators may be used in combination.

In the resist composition of the present invention, the total amount of the component (B), relative to 100 parts by weight of the component (A), is preferably within a range from 0.5 to 50 parts by weight, and more preferably from 1 to 40 parts by weight. When the amount of the component (B) is within the above-mentioned range, formation of a resist pattern can be performed satisfactorily. Further, a uniform solution can be obtained and the storage stability tends to improve.

<Component (D)>

[Component (D1)]

In order to further improve the resist pattern shape and the post-exposure stability of the latent image formed by the pattern-wise exposure of the resist layer, the resist composition of the present invention also includes a nitrogen-containing organic compound (D) (hereinafter referred to as "component (D)"). This component (D) includes a compound (D1) represented by general formula (d1) shown below.

[Chemical Formula 71]

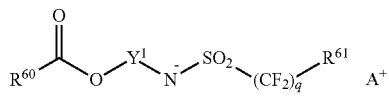

(d1)

In the formula, $R^{60}$ represents a linear, branched or cyclic aliphatic hydrocarbon group which may have a substituent, $Y^1$ represents a divalent linear, branched or cyclic aliphatic hydrocarbon group, $R^{61}$ represents a hydrogen atom, fluorine atom, alkyl group or fluorinated alkyl group, q represents an integer of 1 to 10, and $A^+$ represents an organic cation.

In formula (d1), $R^{60}$ represents a linear, branched or cyclic aliphatic hydrocarbon group which may have a substituent.

Examples of the linear or branched aliphatic hydrocarbon group for $R^{60}$ include a linear or branched saturated hydrocarbon group, or a linear or branched unsaturated hydrocarbon group.

The linear saturated hydrocarbon group (alkyl group) preferably has 1 to 30 carbon atoms, more preferably 3 to 15 carbon atoms, and most preferably 3 to 10 carbon atoms. Specific examples include a methyl group, ethyl group, propyl group, butyl group, pentyl group, hexyl group, heptyl group, octyl group, nonyl group, decanyl group, undecyl group, dodecyl group, tridecyl group, isotridecyl group, tetradecyl group, pentadecyl group, hexadecyl group, isohexadecyl group, heptadecyl group, octadecyl group, nonadecyl group, eicosyl group, heneicosyl group and docosyl group.

The branched saturated hydrocarbon group (alkyl group) preferably has 3 to 30 carbon atoms, more preferably 3 to 15 carbon atoms, and most preferably 3 to 10 carbon atoms. Specific examples include a 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group and 4-methylpentyl group.

Examples of the linear unsaturated hydrocarbon group include a vinyl group, propenyl group (allyl group) and butynyl group.

Examples of the branched unsaturated hydrocarbon group include a 1-methylpropenyl group and 2-methylpropenyl group.

As the unsaturated hydrocarbon group, a group represented by $CH_2=CR^{60'}-$ is particularly desirable.

In the group represented by $CH_2=CR^{60'}-$, $R^{60'}$ is preferably a hydrogen atom, an alkyl group of 1 to 5 carbon atoms or a halogenated alkyl group of 1 to 5 carbon atoms.

The alkyl group of 1 to 5 carbon atoms for $R^{60'}$ is preferably a linear or branched alkyl group of 1 to 5 carbon atoms, and specific examples include a methyl group, ethyl group, propyl group, isopropyl group, n-butyl group, isobutyl group, tert-butyl group, pentyl group, isopentyl group and neopentyl group.

The halogenated alkyl group of 1 to 5 carbon atoms for $R^{60'}$ is a group in which part or all of the hydrogen atoms within an aforementioned alkyl group of 1 to 5 carbon atoms have each been substituted with a halogen atom. Examples of the halogen atom include a fluorine atom, chlorine atom, bromine atom and iodine atom, and a fluorine atom is particularly desirable.

$R^{60'}$ is preferably a hydrogen atom, an alkyl group of 1 to 5 carbon atoms or a fluorinated alkyl group of 1 to 5 carbon atoms, and from the viewpoint of industrial availability, is most preferably a hydrogen atom or a methyl group.

In formula (d1), the cyclic aliphatic hydrocarbon group for $R^{60}$ may be either a monocyclic group or a polycyclic group. The cyclic aliphatic hydrocarbon group preferably contains 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

The cyclic aliphatic hydrocarbon group (alicyclic group) for $R^{60}$ may or may not have a substituent. Examples of the substituent include alkyl groups of 1 to 5 carbon atoms, alkoxy groups of 1 to 5 carbon atoms, a fluorine atom, fluorinated alkyl groups of 1 to 5 carbon atoms, and an oxygen atom (=O).

The basic ring structure of the alicyclic group excluding substituents is not limited to structures constituted of only carbon and hydrogen (not limited to hydrocarbon groups), but is preferably a hydrocarbon group. Further, the "hydrocarbon group" may be saturated or unsaturated, but in most cases, is preferably saturated.

Examples of alicyclic groups of 5 or more carbon atoms include groups in which one or more hydrogen atoms have been removed from a monocycloalkane or a polycycloalkane such as a bicycloalkane, tricycloalkane or tetracycloalkane. More specific examples include groups in which one or more hydrogen atoms have been removed from a monocycloalkane such as cyclopentane, cyclohexane, cycloheptane or cyclooctane, and groups in which one or more hydrogen atoms have been removed from a polycycloalkane such as adamantane, norbornane, isobornane, tricyclodecane or tetracyclododecane.

Among the aforementioned groups, in the present invention, $R^{60}$ is preferably a group in which one or more hydrogen atoms have been removed from a polycycloalkane, and is more preferably a group in which one or more hydrogen atoms have been removed from adamantane.

In formula (d1), $Y^1$ represents a divalent linear, branched or cyclic aliphatic hydrocarbon group, and preferred examples include an alkylene group and a divalent aliphatic cyclic group.

The alkylene group for $Y^1$ preferably contains 1 to 10 carbon atoms, more preferably 1 to 6 carbon atoms, still more preferably 1 to 4 carbon atoms, and most preferably 2 or 3 carbon atoms.

In the divalent aliphatic cyclic group for $Y^1$, the "aliphatic cyclic group" may or may not have a substituent. Examples of the substituent include alkyl groups of 1 to 5 carbon atoms, alkoxy groups of 1 to 5 carbon atoms, a fluorine atom, fluorinated alkyl groups of 1 to 5 carbon atoms, and an oxygen atom (=O).

The basic ring structure of the "aliphatic cyclic group" excluding substituents is not limited to structures constituted of only carbon and hydrogen (not limited to hydrocarbon groups), but is preferably a hydrocarbon group.

Further, the "hydrocarbon group" may be saturated or unsaturated, but in most cases, is preferably saturated. The "aliphatic cyclic group" may be either a monocyclic group or a polycyclic group, but is preferably a polycyclic group.

Examples of the aliphatic cyclic group include groups in which two or more hydrogen atoms have been removed from a monocycloalkane or a polycycloalkane such as a bicycloalkane, tricycloalkane or tetracycloalkane, which may or may not substituted with a substituent.

More specific examples include groups in which two or more hydrogen atoms have been removed from a monocycloalkane such as cyclopentane or cyclohexane, and groups in which two or more hydrogen atoms have been removed from a polycycloalkane such as adamantane, norbornane, isobornane, tricyclodecane or tetracyclododecane.

In the above formula (d1), $R^{61}$ represents a hydrogen atom, fluorine atom, alkyl group or fluorinated alkyl group. $R^{61}$ is preferably a fluorine atom or a fluorinated alkyl group, as such compounds exhibit enhanced strength (acidity) (albeit weak) of the acid generated from the compound (D1) upon exposure, and a more favorable balance between the ease of salt exchange with the acid generated from the component (B) upon exposure, and the ease of retention of the counter cation of the component (D1) prior to exposure.

The alkyl group for $R^{61}$ preferably contains 1 to 10 carbon atoms, more preferably 1 to 8 carbon atoms, and most preferably 1 to 4 carbon atoms.

Examples of the fluorinated alkyl group for $R^{61}$ include groups in which part or all of the hydrogen atoms within an aforementioned alkyl group for $R^{61}$ have each been substituted with a fluorine atom.

The fluorination ratio within the fluorinated alkyl group (the percentage (%) of the number of fluorine atoms relative to the total number of fluorine atoms and hydrogen atoms) is preferably within a range from 50 to 100%, and more preferably from 80 to 100%, and still more preferably from 85 to 100%.

The alkyl group or fluorinated alkyl group for $R^{61}$ may have a substituent. Examples of the substituent include an alkoxy group, halogen atom, halogenated alkyl group, hydroxyl group, and an oxygen atom (=O).

The alkoxy group for the substituent is preferably an alkoxy group of 1 to 5 carbon atoms, more preferably a methoxy group, ethoxy group, n-propoxy group, isopropoxy group, n-butoxy group or tert-butoxy group, and still more preferably a methoxy group or ethoxy group.

Examples of the halogen atom for the substituent include a chlorine atom, bromine atom and iodine atom.

Examples of the halogenated alkyl group for the substituent include groups in which part or all of the hydrogen atoms of an alkyl group of 1 to 5 carbon atoms have each been substituted with an aforementioned halogen atom (such as a chlorine atom, bromine atom or iodine atom).

In formula (d1), q represents an integer of 1 to 10. Of the various possibilities, q is preferably an integer of 1 to 4, and more preferably 1 or 2.

When q represents an integer of 1 to 4, the structure $R^{61}$—$(CF_2)_q$—$SO_2$— exhibits comparatively favorable degradability when compared with, for example, a perfluoroalkyl chain of 6 to 10 carbon atoms which exhibits only sparing degradability, and also offers improved handling properties when considering bioaccumulation properties. Further, the compound can also be distributed uniformly within the resist film with comparative ease, and is therefore particularly desirable.

In formula (d1), $A^+$ represents an organic cation.

There are no particular limitations on the organic cation for $A^+$, and any of the known cation moieties of conventional onium salt acid generators or the like can be used as appropriate.

Specifically, the organic cations represented by the above formulas (b1-c1), (b1-c2), (I-1), (I-2), (I-5) and (I-6) can be used favorably. Examples of particularly preferable organic cations include those represented by the above formulas (b1-c1-1), (b1-c1-23), (b1-c1-24), (I-1-2) and (I-6-1).

Compounds represented by general formulas (d1-1) and (d1-2) shown below are particularly desirable as the component (D1) as they yield superior resist pattern shape when the compound is used in a resist composition.

[Chemical Formula 72]

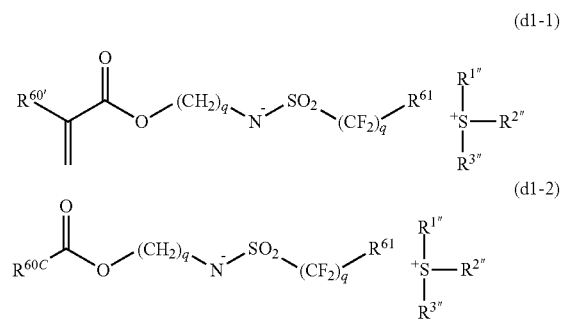

In the formulas, $R^{1''}$ to $R^{3''}$, $R^{61}$ and q are each the same as defined above, $R^{60C}$ represents a cyclic aliphatic hydrocarbon group, q represents an integer of 1 to 10, and $R^{60'}$ represents a hydrogen atom or a methyl group.

In the above formulas, examples of the cyclic aliphatic hydrocarbon group for $R^{60C}$ include the same cyclic aliphatic hydrocarbon groups as those described above for $R^{60}$, and q is preferably an integer of 1 to 6, more preferably an integer of 1 to 4, and still more preferably an integer of 1 to 3.

As the component (D1), a single type of compound may be used alone, or two or more types may be used in combination.

The amount of the component (D1) within the resist composition of the present invention, relative to 100 parts by weight of the component (A1), is preferably within a range from 0.5 to 10 parts by weight, more preferably from 1.0 to 8.5 parts by weight, and still more preferably from 2.0 to 7 parts by weight.

When the amount of the component (D1) is at least as large as the lower limit of the above range, the lithography properties such as the pattern shape can be further improved for the resist composition. When the amount of the component (D1) is not more than the upper limit of the above range, the sensitivity can be maintained at a favorable level, and the throughput is also excellent.

[Component (D2)]

The resist composition of the present invention may further include another nitrogen-containing organic compound (D2) (hereinafter referred to as "component (D2)") as an optional component.

There are no particular limitations on the component (D2) provided it functions as an acid diffusion control agent, namely, a quencher which traps the acid generated from the component (B) upon exposure. A multitude of these components (D2) have already been proposed, and any of these known compounds may be used. Among these, an aliphatic amine, and particularly a secondary aliphatic amine or tertiary aliphatic amine, or an aromatic amine is preferable.

An "aliphatic amine" is an amine having one or more aliphatic groups, and each of the aliphatic groups preferably contains 1 to 12 carbon atoms.

Examples of these aliphatic amines include amines in which at least one hydrogen atom of ammonia ($NH_3$) has been substituted with an alkyl group or hydroxyalkyl group of not more than 12 carbon atoms (namely, alkylamines or alkyl alcohol amines), and cyclic amines.

Specific examples of the alkylamines and alkyl alcohol amines include monoalkylamines such as n-hexylamine, n-heptylamine, n-octylamine, n-nonylamine and n-decylamine, dialkylamines such as diethylamine, di-n-propylamine, di-n-heptylamine, di-n-octylamine and dicyclohexylamine, trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decylamine and tri-n-dodecylamine, and alkyl alcohol amines such as diethanolamine, triethanolamine, diisopropanolamine, triisopropanolamine, di-n-octanolamine and tri-n-octanolamine. Among these, trialkylamines of 5 to 10 carbon atoms are preferred, and tri-n-pentylamine or tri-n-octylamine is particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine and 1,4-diazabicyclo[2.2.2]octane.

Other aliphatic amines besides those described above may also be used. Examples of these other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, and tris[2-{2-(2-hydroxyethoxy)ethoxy}ethyl]amine.

Further, examples of the aromatic amine include aniline-based compounds such as aniline, N,N-n-butylaniline, 2,6-diisopropylaniline, N-isopropylaniline, 3-isopropoxyaniline and N-ethylaniline, as well as pyridine, 4-dimethylaminopyridine, pyrrole, indole, pyrazole, imidazole and derivatives thereof, diphenylamine, triphenylamine and tribenzylamine.

As the component (D2), a single type of compound may be used alone, or two or more types may be used in combination.

The component (D2) is typically used in an amount within a range from 0.01 to 5.0 parts by weight, relative to 100 parts by weight of the component (A). When the amount of the component (D2) is within the above range, the shape of the resist pattern and the post-exposure stability of the latent image formed by the pattern-wise exposure of the resist layer are improved.

<Optional Components>
[Component (E)]

In the resist composition of the present invention, for the purposes of preventing any deterioration in sensitivity, and improving the resist pattern shape and the post-exposure stability of the latent image formed by the pattern-wise exposure of the resist layer, at least one compound (E) (hereinafter referred to as "component (E)") selected from the group consisting of organic carboxylic acids, and phosphorus oxo acids and derivatives thereof may be added as an optional component.

Examples of the organic carboxylic acids include acetic acid, malonic acid, citric acid, malic acid, succinic acid, benzoic acid and salicylic acid.

Examples of the phosphorus oxo acids and derivatives thereof include phosphoric acid, phosphonic acid and phosphinic acid. Among these, phosphonic acid is particularly desirable.

Examples of the phosphorus oxo acid derivatives include esters in which a hydrogen atom within an aforementioned oxo acid is substituted with a hydrocarbon group. Examples of the hydrocarbon group include alkyl groups of 1 to 5 carbon atoms and aryl groups of 6 to 15 carbon atoms.

Examples of phosphoric acid derivatives include phosphate esters such as di-n-butyl phosphate and diphenyl phosphate.

Examples of phosphonic acid derivatives include phosphonate esters such as dimethyl phosphonate, di-n-butyl phosphonate, phenylphosphonic acid, diphenyl phosphonate and dibenzyl phosphonate.

Examples of phosphinic acid derivatives include phosphinate esters and phenylphosphinic acid.

As the component (E), one type of compound may be used alone, or two or more types may be used in combination.

The component (E) is preferably an organic carboxylic acid, and salicylic acid is particularly desirable.

The component (E) is typically used in an amount within a range from 0.01 to 5.0 parts by weight relative to 100 parts by weight of the component (A).

[Component (F)]

The resist composition of the present invention may further include a fluorine-containing compound component (F) (hereinafter referred to as "component (F)") as an optional component. In the present invention, the component (F) contains a fluorine-containing polymeric compound (F1) (hereinafter referred to as "component (F1)") having a structural unit (f1) containing a base-dissociable group. Examples of the component (F1) include compounds disclosed in U.S. Patent Application No. 2009/0197204.

In the present invention, the component (F1) is preferably a polymeric compound (fluorine-containing polymeric compound (F1-1)) having the types of structural units shown below.

[Chemical Formula 73]

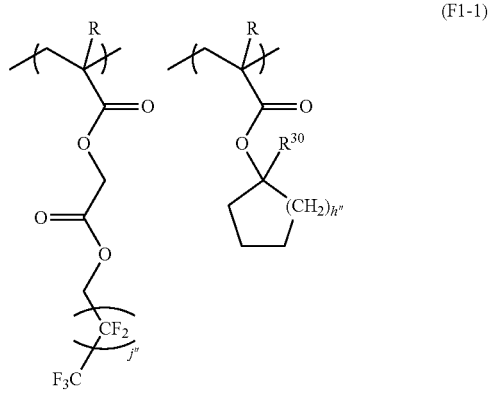

(F1-1)

In formula (F1-1), R represents a hydrogen atom, an alkyl group of 1 to 5 carbon atoms or a halogenated alkyl group of 1 to 5 carbon atoms, wherein the plurality of R groups may be the same or different from each other, j" represents an integer of 0 to 3, $R^{30}$ represents an alkyl group of 1 to 5 carbon atoms, and h" represents an integer of 1 to 6 carbon atoms.

In formula (F1-1), R is the same as defined above for R in the structural unit (a1).

j" is preferably an integer of 0 to 2, more preferably 0 or 1, and most preferably 0.

$R^{30}$ is the same as the lower alkyl group defined for R, and is preferably a methyl group or ethyl group, and most preferably an ethyl group.

h" is preferably 3 or 4, and most preferably 4.

Although there are no particular limitations on the weight-average molecular weight (Mw) (the polystyrene-equivalent value determined by gel permeation chromatography) of the component (F1), the weight-average molecular weight is preferably within a range from 2,000 to 100,000, more preferably from 3,000 to 100,000, still more preferably from 4,000 to 50,000, and most preferably from 5,000 to 50,000. When the weight-average molecular weight is not more than the upper limit of the above range, the component exhibits satisfactory solubility in the resist solvent when used within a resist. On the other hand, when the weight average molecular weight is at least as large as the lower limit of the above range, the dry etching resistance and resist pattern cross-sectional shape are improved.

Further, the dispersity (Mw/Mn) is preferably within a range from 1.0 to 5.0, more preferably from 1.0 to 3.0, and most preferably from 1.2 to 2.8.

As the component (F1), one type of compound may be used alone, or two or more types may be used in combination.

The amount of the component (F1) within the resist composition, relative to 100 parts by weight of the component (A), is preferably within a range from 0.1 to 50 parts by weight, more preferably from 0.1 to 40 parts by weight, still more preferably from 0.3 to 30 parts by weight, and most preferably from 0.5 to 15 parts by weight. When the amount of the component (F1) is at least as large as the lower limit of the above range, the hydrophobicity of a resist film formed using the resist composition improves, yielding a level of hydrophobicity that is ideal even for liquid immersion lithography. On the other hand, when the amount of the component (F1) is not more than the upper limit of the above range, the lithography properties improve.

The component (F1) can also be used favorably as an additive for a resist composition for use with liquid immersion lithography.

If desired, other miscible additives can also be added to the resist composition of the present invention. Examples of such miscible additives include additive resins for improving the performance of the resist film, surfactants for improving the applicability, dissolution inhibitors, plasticizers, stabilizers, colorants, halation prevention agents, and dyes.

[Component (S)]

The resist composition of the present invention can be produced by dissolving the components for the resist composition in an organic solvent (hereinafter referred to as "component (S)").

The component (S) may be any organic solvent which can dissolve the respective components to give a uniform solution, and one or more types of organic solvent may be selected appropriately from those solvents which have been conventionally known as solvents for chemically amplified resists.

Examples of the component (S) include lactones such as γ-butyrolactone; ketones such as acetone, methyl ethyl ketone, cyclohexanone, methyl-n-pentyl ketone, methyl isopentyl ketone, and 2-heptanone; polyhydric alcohols such as ethylene glycol, diethylene glycol, propylene glycol and dipropylene glycol; polyhydric alcohol derivatives, including compounds having an ester bond such as ethylene glycol monoacetate, diethylene glycol monoacetate, propylene glycol monoacetate and dipropylene glycol monoacetate, and compounds having an ether bond such as a monoalkyl ether (such as a monomethyl ether, monoethyl ether, monopropyl ether or monobutyl ether) or a monophenyl ether of any of the above polyhydric alcohols or compounds having an ester bond [among these derivatives, propylene glycol monomethyl ether acetate (PGMEA) and propylene glycol monomethyl ether (PGME) are preferred]; cyclic ethers such as dioxane; esters such as methyl lactate, ethyl lactate (EL), methyl acetate, ethyl acetate, butyl acetate, methyl pyruvate, ethyl pyruvate, methyl methoxypropionate and ethyl ethoxypropionate; and aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene.

As the component (S), one type of organic solvent may be used alone, or two or more types may be used as a mixed solvent.

Among these, cyclohexanone (CH), γ-butyrolactone, propylene glycol monomethyl ether acetate (PGMEA), propylene glycol monomethyl ether (PGME) and ethyl lactate (EL) are preferable, and γ-butyrolactone, PGMEA and PGME are particularly desirable.

Further, among the mixed solvents, a mixed solvent obtained by mixing PGMEA with a polar solvent is preferable. The mixing ratio (weight ratio) of this mixed solvent can be determined appropriately with due consideration of the compatibility of the PGMEA with the polar solvent, but is preferably within a range from 1:9 to 9:1, and more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME ratio is preferably from 1:9 to 9:1, more preferably from 2:8 to 8:2, and still more preferably from 3:7 to 7:3. When cyclohexanone (CH) is mixed as the polar solvent, the PGMEA:CH ratio is preferably from 1:9 to 9:1, and more preferably from 2:8 to 9:1.

Further, as the component (S), a mixed solvent of at least one of PGMEA and EL with γ-butyrolactone is also preferable. The mixing ratio (former:latter) of such a mixed solvent is preferably from 70:30 to 95:5.

The amount used of the component (S) is not particularly limited, and may be adjusted appropriately to a concentration which enables application of a coating solution onto a substrate in accordance with the thickness of the coating film. In general, the organic solvent is used in an amount that yields a solid fraction concentration for the resist composition that is within a range from 0.5 to 20% by weight, and preferably from 1 to 15% by weight.

Dissolution of the components that constitute the resist composition in the component (S) can be conducted by simply mixing and stirring each of the above components together using conventional methods. If necessary, the composition may also be mixed and dispersed using a dispersion device such as a dissolver, a homogenizer or a triple roll mill. Furthermore, following mixing, the composition may also be filtered using a mesh or membrane filter or the like.

The resist composition of the present invention is able to further improve the resist pattern shape, and can form a resist pattern that also has an excellent mask error factor (MEF). Although the reasons that these effects are obtained are not entirely clear, they are thought to include the following. Namely, the resist composition of the present invention includes a combination of the acid generator (B1) containing a compound represented by general formula (b1-1) with the component (D1) represented by general formula (d1). The component (B1) has an adamantanelactone group in the anion moiety, and a —O—C(=O)—Y⁰—SO₃⁻ moiety is bonded to the adamantanelactone group. As a result of having the adamantanelactone group in the anion moiety, the component (B1) has a bulky skeleton and a polar unit. Accordingly, it is thought that the interaction between the component (B1) and the base component (A) is enhanced, resulting in a shorter diffusion of the generated acid than compared with the case of an acid generator having the type of anion moiety described above for the component (B2). It is thought that as the diffusion is shortened, the combination with the component (D1), which loses its quenching function in the exposed portions, is able to inhibit the efficiency of the deprotection reaction caused by the acid generated from the acid generator, meaning the composition is less affected by changes in the exposure dose, thereby reducing any adverse effects on the MEF properties. As the target dimensions are reduced in size, the effects caused by differences in the diffusion length are magnified, meaning the degree of improvement in the MEF also increases.

It is thought that as a result of the above effects, the resist composition of the present invention markedly suppresses the diffusion of acid generated within the exposed portions into the unexposed portions, and enhances the interaction between the acid generator component and the base component, and therefore the resist pattern shape can be further improved, and a resist pattern with a superior mask error factor (MEF) can be formed.

<<Method of Forming Resist Pattern>>

The method of forming a resist pattern according to the second aspect of the present invention is described below.

The method of forming a resist pattern according to the present invention includes: forming a resist film on a substrate using the resist composition of the first aspect of the present invention described above, conducting exposure of the resist film, and developing the resist film to form a resist pattern.

The method of forming a resist pattern according to the present invention can be performed, for example, as follows.

Firstly, the resist composition is applied onto a substrate using a spinner or the like, and a bake (post applied bake (PAB)) treatment is conducted under temperature conditions of 80 to 150° C. for a period of 40 to 120 seconds, and preferably 60 to 90 seconds, to form a resist film.

Subsequently, the resist film is selectively exposed, either by exposure through a mask having a predetermined pattern formed therein (namely, a mask pattern) using an exposure apparatus such as an ArF exposure apparatus, an electron beam lithography apparatus or an EUV exposure apparatus, or by patterning via direct irradiation with an electron beam without using a mask pattern, and another bake (post exposure bake (PEB)) treatment is then conducted under temperature conditions of 80 to 150° C. for 40 to 120 seconds, and preferably 60 to 90 seconds.

The resist film is then subjected to a developing treatment.

The developing treatment is performed using an alkali developing solution in the case of an alkali developing process, or using a developing solution containing an organic solvent (an organic developing solution) in the case of a solvent developing process.

A rinse treatment is preferably performed following the developing treatment. In the case of an alkali developing process, the rinse treatment is preferably performed using pure water, whereas in the case of a solvent developing process, the rinse treatment is preferably performed using a rinse liquid containing an organic solvent.

In the case of a solvent developing process, residual developing solution or rinse liquid adhered to the pattern following the developing treatment or rinse treatment may be removed using a supercritical fluid.

Drying is performed following the developing treatment or rinse treatment. Further, in some cases, a bake treatment (post bake) may be performed following the developing treatment. In this manner, a resist pattern can be obtained.

There are no particular limitations on the substrate, and a conventionally known substrate may be used. For example, substrates for electronic components, and such substrates having wiring patterns formed thereon can be used. Specific examples of the material of the substrate include metals such as silicon wafer, copper, chromium, iron and aluminum, as well as glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) or an organic film such as the lower organic film in a multilayer resist method can be used.

Here, a "multilayer resist method" is a method in which at least one layer of an organic film (a lower-layer organic film) and at least one layer of a resist film (an upper-layer resist film) are provided on a substrate, and a resist pattern formed within the upper-layer resist film is used as a mask to conduct patterning of the lower-layer organic film. This method is capable of forming a pattern with a high aspect ratio. In other words, in the multilayer resist method, a desired thickness can be ensured by the lower-layer organic film, and as a result, the thickness of the resist film can be reduced, and an extremely fine pattern with a high aspect ratio can be formed.

The multilayer resist method can be broadly classified into a method in which a double-layer structure consisting of an upper-layer resist film and a lower-layer organic film is formed (a double-layer resist method), and a method in which a multilayer structure having at least three layers consisting of an upper-layer resist film, a lower-layer organic film and at least one intermediate layer (a thin metal film or the like) provided between the upper-layer resist film and the lower-layer organic film is formed (a three-layer resist method).

There are no particular limitations on the wavelength used for exposure, and the exposure can be conducted using radiation such as an ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is particularly effective for use with a KrF excimer laser, ArF excimer laser, EB or EUV.

The method of exposing the resist film may employ either a general exposure method (dry exposure) conducted in air or an inert gas such as nitrogen, or an immersion exposure method (a liquid immersion lithography method).

Liquid immersion lithography is a method in which the region between the resist film and the lens at the lowermost portion of the exposure apparatus is pre-filled with a solvent (an immersion medium) that has a larger refractive index than the refractive index of air, and the exposure (immersion exposure) is conducted in this state.

The immersion medium preferably exhibits a refractive index larger than the refractive index of air but smaller than the refractive index of the resist film that is to be exposed. The refractive index of the immersion medium is not particularly limited as long at it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point that is preferably within a range from 70 to 180° C., and more preferably from 80 to 160° C. A fluorine-based inert liquid having a boiling point within the above-mentioned range is advantageous in that the removal of the immersion medium after the exposure can be conducted by a simple method.

As the fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point: 102° C.), and one example of a suitable perfluoroalkylamine compound is perfluorotributylamine (boiling point: 174° C.).

As the immersion medium, water is preferable in terms of cost, safety, environmental issues and versatility.

Examples of the alkali developing solution used in an alkali developing process include 0.1 to 10% by weight aqueous solutions of tetramethylammonium hydroxide (TMAH).

The organic solvent within the organic developing solution that is used in the solvent developing process may be selected appropriately from among any of the conventional solvents capable of dissolving the component (A) (the component (A) prior to exposure). Specific examples of organic solvents that may be used include polar solvents such as ketone-based solvents, ester-based solvents, alcohol-based solvents, amide-based solvents and ether-based solvents, and hydrocarbon solvents.

Conventional additives may be added to the organic developing solution as required. Examples of these additives include surfactants. There are no particular limitations on the surfactants, and ionic and nonionic fluorine-based surfactants and/or silicon-based surfactants may be used.

In those cases where a surfactant is added, the amount of the surfactant is typically within a range from 0.001 to 5% by weight, more preferably from 0.005 to 2% by weight, and still more preferably from 0.01 to 0.5% by weight, relative to the total weight of the organic developing solution.

The developing treatment can be performed using a conventional developing method. Examples of developing methods that may be used include methods in which the substrate is dipped in the developing solution for a predetermined period of time (dipping methods), methods in which the developing solution is placed and held on the surface of the substrate by surface tension for a predetermined period of time (puddle methods), methods in which the developing solution is sprayed onto the substrate surface (spray methods), and methods in which the substrate is spun at a constant rate, and a developing solution discharge nozzle is then scanned across the substrate at a constant rate while the developing solution is discharged from the nozzle (dynamic dispensing methods).

Examples of the organic solvent contained within the rinse liquid used for the rinse treatment performed following a solvent developing process include those organic solvents among the solvents described above for the organic solvent of the organic developing solution which exhibit poor dissolution of the resist pattern. Examples of typical solvents that may be used include one or more solvents selected from among hydrocarbon solvents, ketone-based solvents, ester-based solvents, alcohol-based solvents, amide-based solvents and ether-based solvents. Among these, at least one solvent selected from among hydrocarbon solvents, ketone-based solvents, ester-based solvents, alcohol-based solvents and amide-based solvents is preferred, at least one solvent selected from among alcohol-based solvents and ester-based solvents is more preferred, and an alcohol-based solvent is particularly desirable.

The rinse treatment (washing treatment) using a rinse liquid may be performed using a conventional rinse method. Examples of methods that may be used include methods in which the rinse liquid is discharged continuously onto the substrate while the substrate is spun at a constant rate (spin coating methods), methods in which the substrate is dipped in the rinse liquid for a predetermined period of time (dipping methods) and methods in which the rinse liquid is sprayed onto the substrate surface (spray methods).

EXAMPLES

Specifics of the present invention are presented below based on a series of examples, although the present invention is in no way limited by these examples.

<Preparation of Positive-Type Resist Compositions>

The components shown in Table 1 were mixed together and dissolved to prepare a series of positive-type resist compositions.

TABLE 1

|  | (A) | (B) | (D) | (F) | (S) |
|---|---|---|---|---|---|
| Example 1 | (A)-1 [100] | (B)-1 [12.36] | (D)-1 [3.0] | (F)-1 [3.0] | (S)-1 [2700] |
| Comparative Example 1 | (A)-1 [100] | (B)-2 [12.48] | (D)-1 [3.0] | (F)-1 [3.0] | (S)-1 [2700] |
| Comparative Example 2 | (A)-1 [100] | (B)-3 [11.96] | (D)-1 [3.0] | (F)-1 [3.0] | (S)-1 [2700] |
| Comparative Example 3 | (A)-1 [100] | (B)-4 [11.75] | (D)-1 [3.0] | (F)-1 [3.0] | (S)-1 [2700] |
| Comparative Example 4 | (A)-1 [100] | (B)-1 [12.36] | (D')-2 [2.83] | (F)-1 [3.0] | (S)-1 [2700] |
| Comparative Example 5 | (A)-1 [100] | (B)-1 [12.36] | (D)-3 [1.3] | (F)-1 [3.0] | (S)-1 [2700] |
| Example 2 | (A)-1 [100] | (B)-1 [12.36] | (D)-4 [1.0] | (F)-1 [3.0] | (S)-1 [2700] |
| Comparative Example 6 | (A)-1 [100] | (B)-2 [12.48] | (D)-4 [1.0] | (F)-1 [3.0] | (S)-1 [2700] |

In Table 1, the reference symbols refer to the following components, whereas the numerical values in brackets [ ] indicate the amount (in parts by weight) of the component added.

(A)-1: a copolymer represented by chemical formula (A1-11-1) shown below.

[Chemical Formula 74]
(A1-11-1)
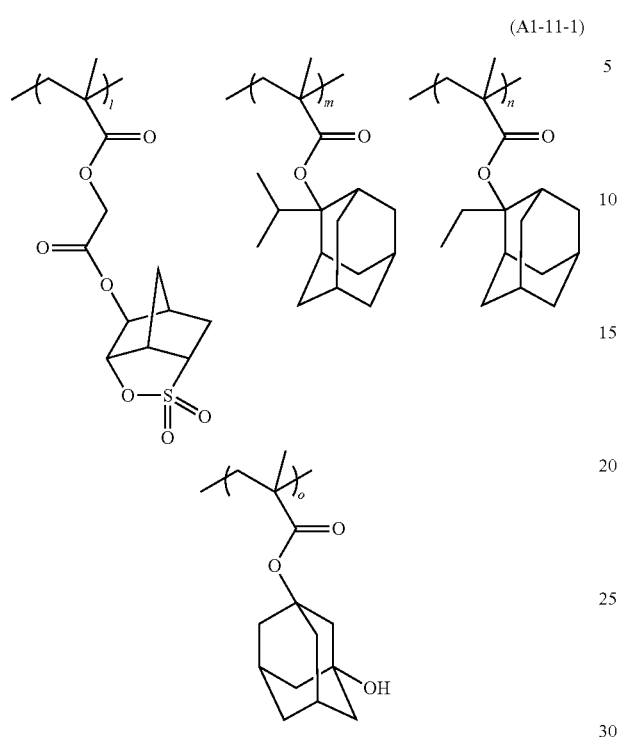
[Mw: 7,000, Mw/Mn: 1.5, molar ratio: l/m/n/o=35/40/15/10]
(B)-1: a compound represented by formula (B)-1 shown below.
(B)-2: a compound represented by formula (B)-2 shown below.
(B)-3: a compound represented by formula (B)-3 shown below.
(B)-4: a compound represented by formula (B)-4 shown below.
[Chemical Formula 75]
(B)-1
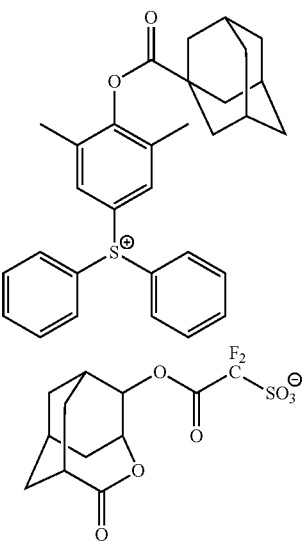
[Chemical Formula 76]
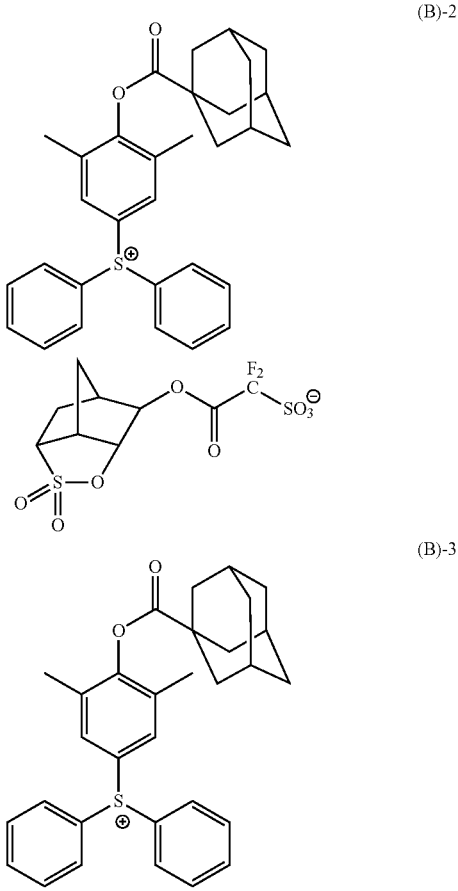
(D)-1: a compound represented by formula (D)-1 shown below.

[Chemical Formula 77]

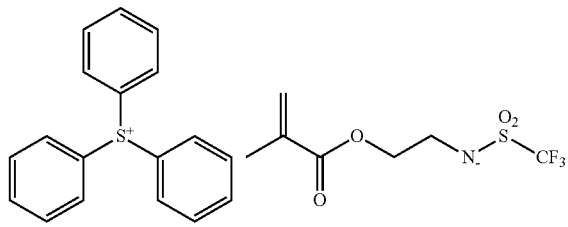

(D)-1

(D')-2: triphenylsulfonium d-camphor-10-sulfonate
(D)-3: tri-n-pentylamine
(D)-4: a compound represented by formula (D)-4 shown below.

[Chemical Formula 78]

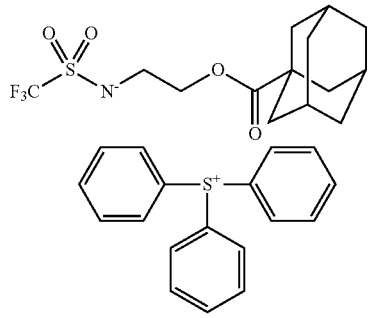

(D)-4

A synthesis example for the compound represented by formula (D)-4 shown above is described below. In the NMR analyses, tetramethylsilane (TMS) was used as the chemical shift reference for $^1$H-NMR measurements, and trichlorofluoromethane was used as the chemical shift reference for $^{19}$F-NMR measurements (with the hexafluorobenzene peak designated as −162.2 ppm).

Synthesis Example 1

Synthesis of N-[2-(adamantan-1-ylcarbonyloxy)ethyl]trifluoromethanesulfonamide

A glass flask fitted with a thermometer and a condenser was charged with 100 g (0.52 mol) of trifluoromethanesulfonic acid amide ethanol, 108.6 g (0.54 mol) of 1-adamantanecarboxylic acid, para-toluenesulfonic acid (0.1 mol) and 500 g of toluene, and a Dean-Stark dehydration apparatus was used to perform dehydration under reflux conditions. Refluxing for 9 hours enabled removal of approximately 9 ml of water. The resulting reaction mixture was dissolved in 500 g of ethyl acetate, and the thus obtained solution was washed twice with a saturated solution of sodium bicarbonate, once with 1N—HCl and once with a saturated solution of sodium chloride. The organic phase was dried over sodium sulfate, the solvent was removed by distillation under reduced pressure, and the product was recrystallized from hexane, yielding 140 g of N-[2-(adamantan-1-ylcarbonyloxy)ethyl]trifluoromethanesulfonamide (yield: 75%, purity: 99%).

Analysis of physical properties of N-[2-(adamantan-1-ylcarbonyloxy)ethyl]trifluoromethanesulfonamide The N-[2-(adamantan-1-ylcarbonyloxy)ethyl]trifluoromethanesulfonamide was analyzed by NMR.

$^1$H NMR (measurement solvent: deuterated chloroform, reference: tetramethylsilane); δ=5.43 to 5.35 (brs, 1H), 4.20 (t, 2H, J=5.2 Hz), 3.53 (td, 2H, J=5.2 Hz), 2.08 to 1.98 (brs, 3H), 1.91 to 1.87 (brs, 6H), 1.75 to 1.67 (brs, 6H).

$^{19}$F NMR (measurement solvent: deuterated chloroform, reference: trichlorofluoromethane); δ=−77.8 (s, 3F).

Based on the above results, it was confirmed that the obtained compound was N-[2-(adamantan-1-ylcarbonyloxy)ethyl]trifluoromethanesulfonamide, as shown below in formula (i).

[Chemical Formula 79]

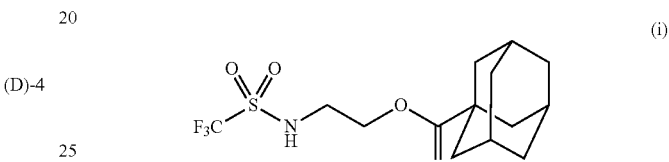

(i)

Synthesis Example 2

Synthesis of triphenylsulfonium N-[2-(adamantan-1-ylcarbonyloxy)ethyl]trifluoromethanesulfonamide A 3 L reactor was charged with 240 g (0.63 mol) of the N-[2-(adamantan-1-ylcarbonyloxy)ethyl]trifluoromethanesulfonamide obtained in the above synthesis example 1, 800 mL of water and 800 mL of chloroform, and with the temperature inside the flask maintained at 0° C., 240 g (0.68 mol) of an 11% NaOH solution was gradually added dropwise to the flask, and the resulting mixture was then stirred for 30 minutes. 244 g (0.71 mol) of triphenylsulfonium bromide was then added to the flask, and the reaction mixture was stirred at room temperature for 15 hours. Subsequently, a phase separation was performed, and the obtained organic layer was washed 4 times with 800 mL portions of water and then concentrated under reduced pressure. The resulting yellow oily product was dissolved in acetonitrile and recrystallized in IPE, yielding 360 g of triphenylsulfonium N-[2-(adamantan-1-ylcarbonyloxy)ethyl]trifluoromethanesulfonamide. The purity of the product was 99% and the yield was 87%.

Analysis of physical properties of triphenylsulfonium N-[2-(adamantan-1-ylcarbonyloxy)ethyl]trifluoromethanesulfonamide The triphenylsulfonium N-[2-(adamantan-1-ylcarbonyloxy)ethyl]trifluoromethanesulfonamide was analyzed by NMR.

$^1$H NMR (measurement solvent: deuterated DMSO, reference: tetramethylsilane); δ=7.88 to 7.76 (m, 15H, Ph$_3$S$^+$), 3.85 (t, 2H), 3.02 (t, 2H), 2.08 to 1.98 (brs, 3H), 1.91 to 1.87 (brs, 6H), 1.75 to 1.67 (brs, 6H).

$^{19}$F NMR (measurement solvent: deuterated DMSO, reference: trichlorofluoromethane); δ=−75.5 (s, 3F).

Based on the above results, it was confirmed that the obtained compound was triphenylsulfonium N-[2-(adamantan-1-ylcarbonyloxy)ethyl]trifluoromethanesulfonamide, as shown above in formula (D)-4.

(F)-1: a fluorine-containing polymeric compound (F1-1-1) shown below, synthesized in the same manner as Example 32 disclosed in U.S. Patent Application No. 2009/0197204. Mw: 18,000, molecular weight dispersity: 1.5, f1/f2=78/22 (molar ratio).

[Chemical Formula 80]

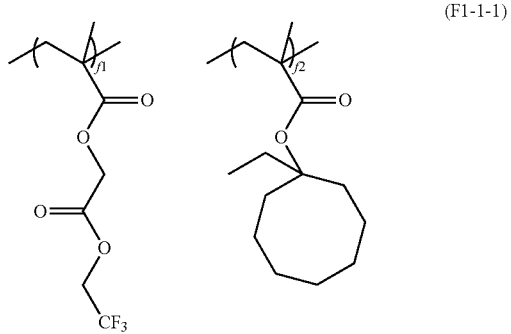

(F1-1-1)

(S)-1: a mixed solvent of PGMEA/PGME/cyclohexanone=30/45/25 (weight ratio)
<Evaluation of Lithography Properties>

Using the resist compositions obtained in examples 1 and 2, and comparative examples 1 to 6, resist patterns were formed and the lithography properties were evaluated using the procedures described below.

[Resolution—Sensitivity]

An organic antireflection film composition ARC29A (a product name, manufactured by Brewer Science Ltd.) was applied onto a 12-inch silicon wafer using a spinner, and the composition was then baked and dried on a hotplate at 205° C. for 60 seconds, thereby forming an organic antireflection film having a film thickness of 89 nm. Each of the positive-type resist compositions prepared above was applied onto a thus formed antireflection film using a spinner, and was then subjected to a prebake (PAB) treatment and dried on a hotplate at 80° C. for 60 seconds, thereby forming a resist film having a film thickness of 100 nm.

Next, using an ArF exposure apparatus for immersion lithography (product name: NSR-S609B, manufactured by Nikon Corporation, NA (numerical aperture)=1.07, 2/3 annular illumination, reduction ratio: 1/4, immersion medium: water), the resist film was selectively irradiated with an ArF excimer laser (193 nm) through a mask having a hole pattern formed therein.

Subsequently, a PEB treatment was conducted at 85° C. for 60 seconds, and the resist film was then developed for 30 seconds at 23° C. in a 2.38% by weight aqueous solution of TMAH, subsequently rinsed for 30 seconds with pure water, and then dried by shaking.

As a result, in each of the examples, a hole pattern resist pattern was formed in the resist film in which holes having a hole diameter (CD) of 65 nm were arranged with uniform spacing therebetween (pitch: 114 nm).

The optimum exposure dose Eop (mJ/cm$^2$) for forming this hole pattern of CD 65 nm and pitch 114 nm was determined. The results are shown in Table 2.

[Evaluation of Mask Error Factor (MEF)]

Using the above Eop value, CH patterns were formed while the target size for the hole diameter was varied and set to 11 different values within a range from 65 nm±5 nm (at intervals of 1 nm) while the pitch was maintained at 114 nm. The value of the MEF was calculated as the gradient of the line obtained by plotting the target size (nm) along the horizontal axis, and the actual hole diameter (nm) of the hole pattern formed in the resist film using each of the mask patterns on the vertical axis. An MEF (line gradient) value closer to 1 indicates superior mask reproducibility. The results obtained are shown in Table 2.

[Evaluation of CD Uniformity (CDU)]

For hole patterns formed at the above Eop value, the CD values of 100 holes were measured within each hole pattern, and the value of 3 times the standard deviation (σ) calculated from the measurement results (namely, 3σ) was determined. The results are shown in Table 2.

The smaller the value of 3σ determined in this manner, the higher the degree of CD uniformity (CDU) for each hole formed in the resist film.

[Alteration of Amount of Added Component (D)]

The amount of the component (D) was doubled in the compositions of the above example 1 and comparative examples 1 to 5, and tripled in the compositions of example 2 and comparative example 6, and the same evaluations as those described above were performed. The results are shown in Table 2 (in the columns marked with *).

TABLE 2

| | Eop (mJ/cm$^2$) | MEF | CDU | MEF * after altering amount of component (D) | CDU * after altering amount of component (D) |
|---|---|---|---|---|---|
| Example 1 | 17.1 | 4.5 | 3.9 | 5.4 | 3.7 |
| Comparative Example 1 | 16.7 | 4.5 | 4.1 | 5.5 | 4.44 |
| Comparative Example 2 | 17.4 | 4.6 | 4.1 | 5.9 | 4.51 |
| Comparative Example 3 | 18.8 | 4.8 | 4.4 | 6.4 | 5.29 |
| Comparative Example 4 | 19.8 | 4.8 | 4.6 | 5.8 | 4.48 |
| Comparative Example 5 | 45.0 | 7.3 | 6.7 | not resolved | not resolved |
| Example 2 | 12.0 | 4.3 | 4.1 | 4.0 | 3.3 |
| Comparative Example 6 | 11.0 | 4.3 | 4.3 | 4.1 | 3.7 |

As is evident from Table 2, the resist compositions of the present invention improved the shape of the resist pattern, and also exhibited favorable values for the mask error factor (MEF) and sensitivity. Further, the compositions of the examples showed the largest degree of improvement in the CDU when the amount of the component (D) was altered, and the MEF values were also confirmed as being superior to those of the comparative examples (or in those cases where the MEF value deteriorated, the degree of deterioration was minimal).

What is claimed is:

1. A resist composition comprising:
a base component (A), which exhibits changed solubility in a developing solution under action of acid, comprising a resin component (A1) having a structural unit (a2$^S$) containing a —SO$_2$-containing cyclic group and a structural unit selected from the group consisting of formulae (a1-1-1), (a1-1-2), (a1-1-3), (a1-1-26) and (a1-1-34) shown below:

(a1-1-1)
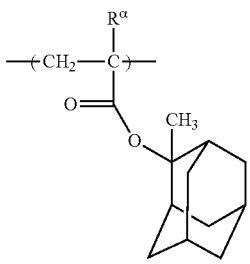

(a1-1-2)
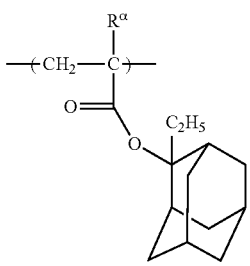

(a1-1-3)
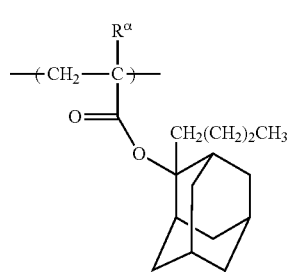

(a1-1-26)
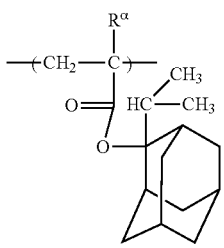

(a1-1-34)
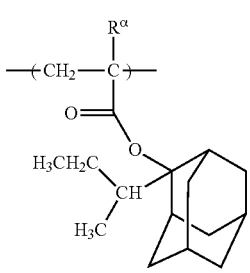

wherein $R^\alpha$ represents a hydrogen atom, a methyl group or a trifluoromethyl group, wherein the structural unit (a2$^S$) containing a —SO$_2$- containing cyclic group comprises a structural unit represented by general formula (a2-0-1) shown below:

(a2-0-1)
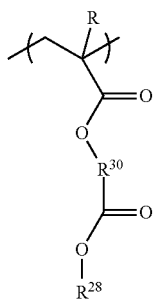

wherein R represents a hydrogen atom, an alkyl group of 1 to 5 carbon atoms or a halogenated alkyl group of 1 to 5 carbon atoms, $R^{28}$ represents an —SO$_2$-containing cyclic group, and $R^{30}$ is a divalent linking group;

an acid generator component (B), which generates acid upon exposure, comprising an acid generator (B1) containing a compound represented by general formula (b1-1-0) shown below (b1-1-0)
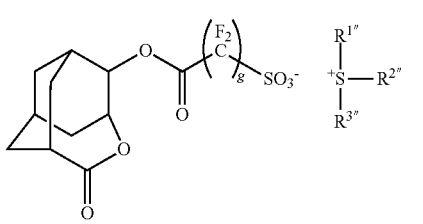

wherein g represents an integer of 1 to 4; and each of $R^{1\prime\prime}$ to $R^{3\prime\prime}$ independently represents an aryl group, provided that at least one of $R^{1\prime\prime}$ to $R^{3\prime\prime}$ has —O—C(=O)—$R^{7\prime}$ as a substituent, wherein $R^{7\prime}$ represents a linear or branched saturated hydrocarbon group of 1 to 25 atoms, a cyclic saturated hydrocarbon group of 3 to 20 carbon atoms, or a linear or branched aliphatic unsaturated hydrocarbon group of 2 to 5 carbon atoms; and a nitrogen-containing organic compound component (D), the nitrogen-containing organic compound component (D) comprising a compound (D1) represented by general formula (d1) shown below:

(d1)
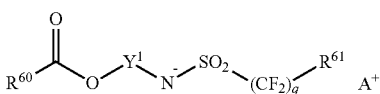

wherein $R^{60}$ a group in which one or more hydrogen atoms have been removed from a polycycloalkane, $Y^1$ represents a divalent linear, branched or cyclic aliphatic hydrocarbon group, $R^{61}$ represents a hydrogen atom, fluorine atom, alkyl group or fluorinated alkyl group, q represents an integer of 1 to 10, and A$^+$ represents an organic cation.

2. The resist composition according to claim 1, wherein the resin component (A1) further comprises a structural unit (a2$^L$) which is derived from an acrylate ester containing a lactone-containing cyclic group, wherein the structural unit (a2$^L$) may have the hydrogen atom bonded to the carbon atom on the α-position substituted with a substituent.

3. The resist composition according to claim 1, wherein the resin component (A1) further comprises a structural unit (a3), which is derived from an acrylate ester in which a hydrogen atom bonded to a carbon atom on an α-position may be substituted with a substituent, and contains a polar group-containing aliphatic hydrocarbon group.

4. The resist composition according to claim 1, wherein, in the general formula (d1), $R^{60}$ represents a group in which one or more hydrogen atoms have been removed from adamantane.

5. A method of forming a resist pattern, the method comprising: forming a resist film on a substrate using a resist composition according to claim 1, conducting exposure of the resist film, and developing the resist film to form a resist pattern.

* * * * *

UNITED STATES PATENT AND TRADEMARK OFFICE
CERTIFICATE OF CORRECTION

PATENT NO. : 9,494,860 B2
APPLICATION NO. : 13/329001
DATED : November 15, 2016
INVENTOR(S) : Tsuyoshi Kurosawa et al.

It is certified that error appears in the above-identified patent and that said Letters Patent is hereby corrected as shown below:

In the Specification

Column 10, Line 20, after "saturated" insert --.--.

Column 12, Line 39, "(a1'-1) to (a1-6)" should be --(a1''-1) to (a1''-6)--.

Column 56, Line 45, "Formula 26]" should be --Formula 27]--.

Column 77, Line 38, "(a-4-1)" should be --(a4-1)--.

Column 77, Line 39, "(a-4-5)" should be --(a4-5)--.

Column 79, Line 65, "The" should be --the--.

Signed and Sealed this
Eleventh Day of April, 2017

Michelle K. Lee
*Director of the United States Patent and Trademark Office*

CERTIFICATE OF CORRECTION (continued)
U.S. Pat. No. 9,494,860 B2

Column 81, Lines 47-65, " 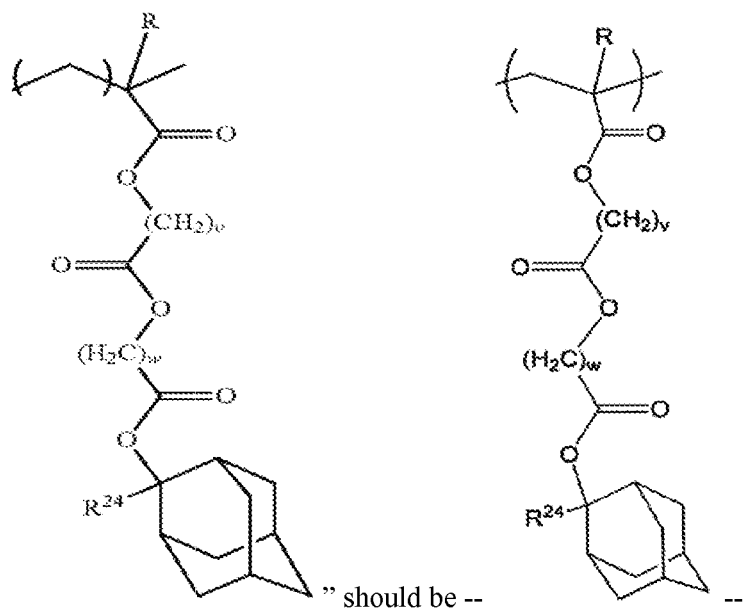 " should be -- --.

Column 85, Lines 2-12, " 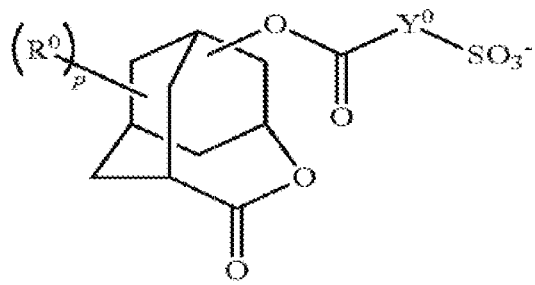 " should be -- 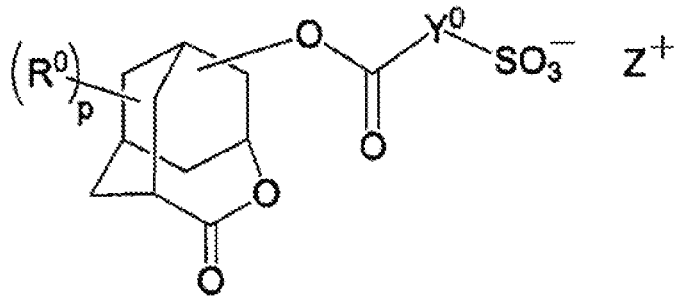 --.

Column 86, Line 13, after "(=O)" insert --.--.

Column 90, Line 22, "$R^{59}$" should be --$R^{50}$--.

Column 91, Lines 42-43, "))tetrahydrothiopyranium," should be --)tetrahydrothiopyranium,--.

Column 98, Line 50, "(I1-1-2)" should be --(I-1-2)--.

CERTIFICATE OF CORRECTION (continued)
U.S. Pat. No. 9,494,860 B2

Column 111, Lines 28-35, " 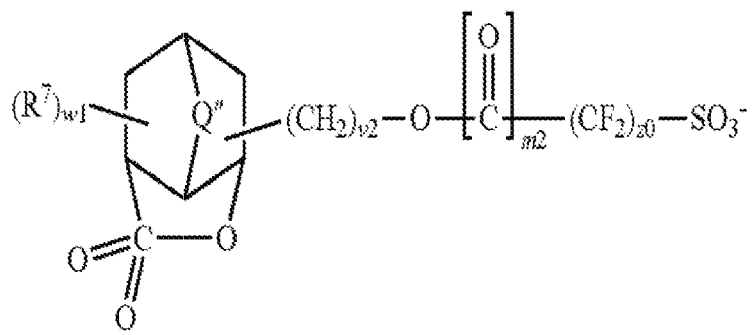 " should be -- 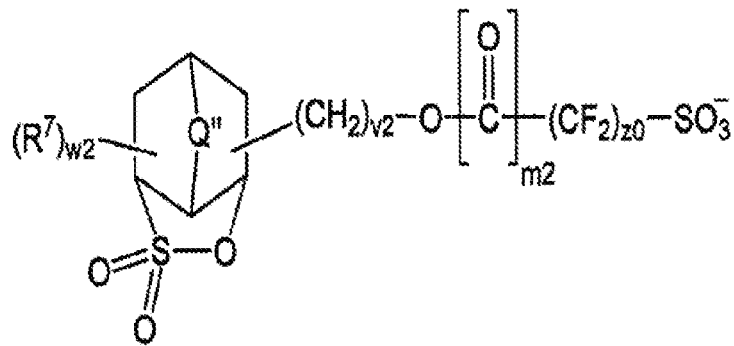 --.

Column 127, Line 5, "at" should be --as--.

In the Claims

Column 136, Line 55 (Claim 1), after "$R^{60}$" insert --represents--.